(12) United States Patent
Yamazaki et al.

(10) Patent No.: US 9,324,747 B2
(45) Date of Patent: Apr. 26, 2016

(54) IMAGING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masayuki Sakakura, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/641,625

(22) Filed: Mar. 9, 2015

(65) Prior Publication Data

US 2015/0263052 A1     Sep. 17, 2015

(30) Foreign Application Priority Data

Mar. 13, 2014   (JP) .................................. 2014-050384

(51) Int. Cl.
*H01L 29/10*   (2006.01)
*H01L 27/146*  (2006.01)

(52) U.S. Cl.
CPC .... *H01L 27/14616* (2013.01); *H01L 27/14607* (2013.01); *H01L 27/14609* (2013.01); *H01L 27/14612* (2013.01); *H01L 27/14641* (2013.01); *H01L 27/14643* (2013.01); *H01L 27/14689* (2013.01)

(58) Field of Classification Search
CPC .................. H01L 27/14616; H01L 27/14607; H01L 27/4616; H01L 27/14643; H01L 27/14609
USPC ................................ 257/43, 59, 72, 232, 440
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Brook Kebede
(74) *Attorney, Agent, or Firm* — Fish & Richardson P.C.

(57) ABSTRACT

An imaging device is provided at a lower manufacturing cost. In a light-receiving portion of an imaging device which includes the light-receiving portion, a first transistor connected to the light-receiving portion, and a peripheral circuit, a comb-like n-type semiconductor and a comb-like p-type semiconductor are arranged so as to engage with each other in a plan view. Further, the light-receiving portion and the first transistor overlap with each other. The peripheral circuit includes a second transistor and a third transistor. Further, the second transistor and the third transistor include semiconductor layers having different bandgaps. Further, one of the semiconductor layers of the second transistor and the third transistor has the same bandgap as a semiconductor layer of the first transistor.

18 Claims, 45 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0222204 A1 | 12/2003 | Gidon et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0140293 A1 | 6/2005 | Kitahara et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0151807 A1 | 7/2006 | Pardo et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0049004 A1 | 2/2008 | Kunimori et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258742 A1 | 10/2008 | Dimitrakopoulos et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140368 A1* | 6/2009 | Miura .................. H01L 31/105 257/463 |
| 2009/0152506 A1 | 6/2009 | Umeda et al. |
| 2009/0152541 A1 | 6/2009 | Maekawa et al. |
| 2009/0243019 A1* | 10/2009 | Kawai ............... H01L 27/14609 257/440 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0038209 A1 | 2/2013 | Akasaka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", Am-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crydtalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(Zno)m (m= 7, 8, 9, and 16) in the In2O3—ZnGa2O4—ZnO System", Journal of Soild State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLEd Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 27A1
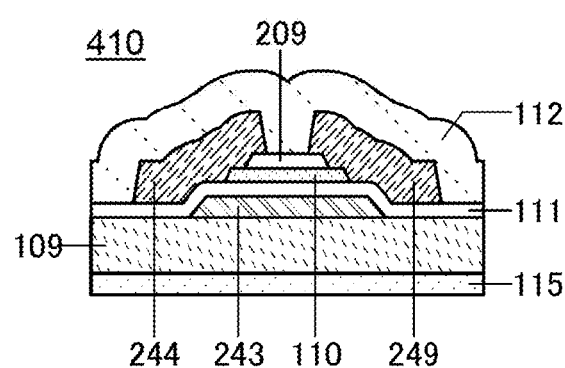
FIG. 27A2
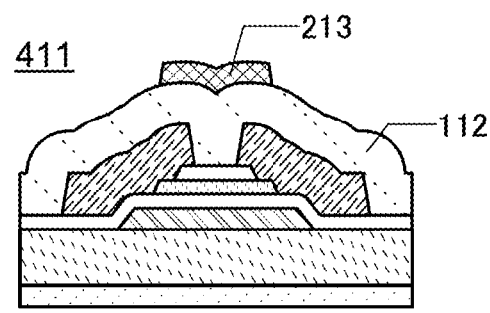
FIG. 27B1
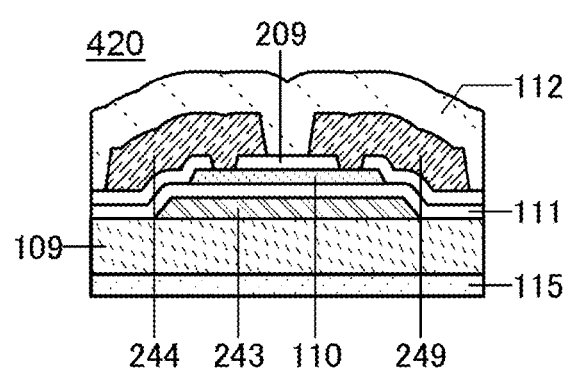
FIG. 27B2
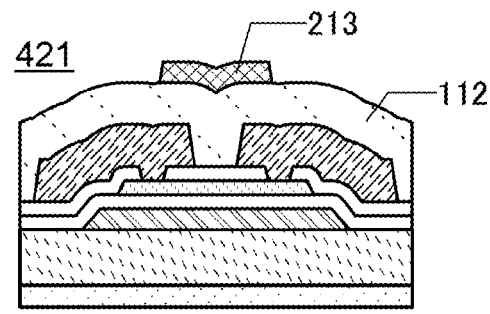

FIG. 28A1
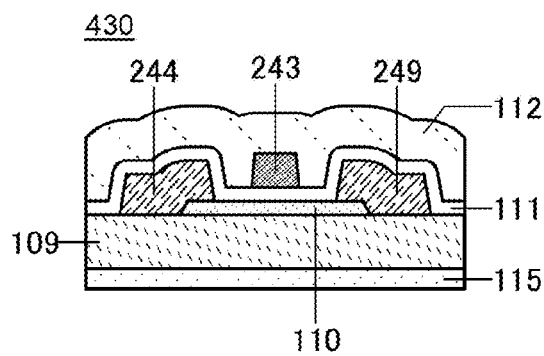
FIG. 28A2
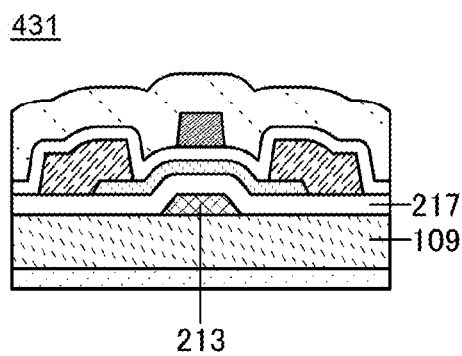
FIG. 28A3
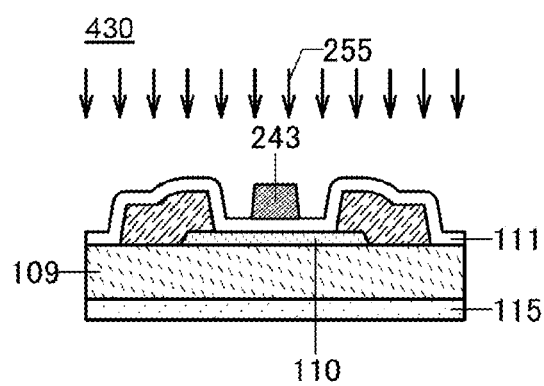
FIG. 28B1
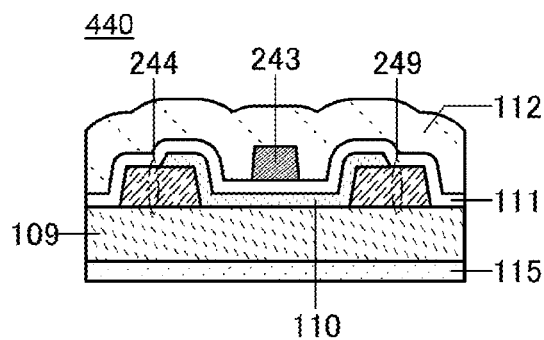
FIG. 28B2
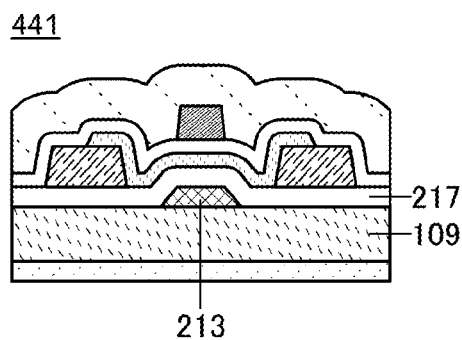

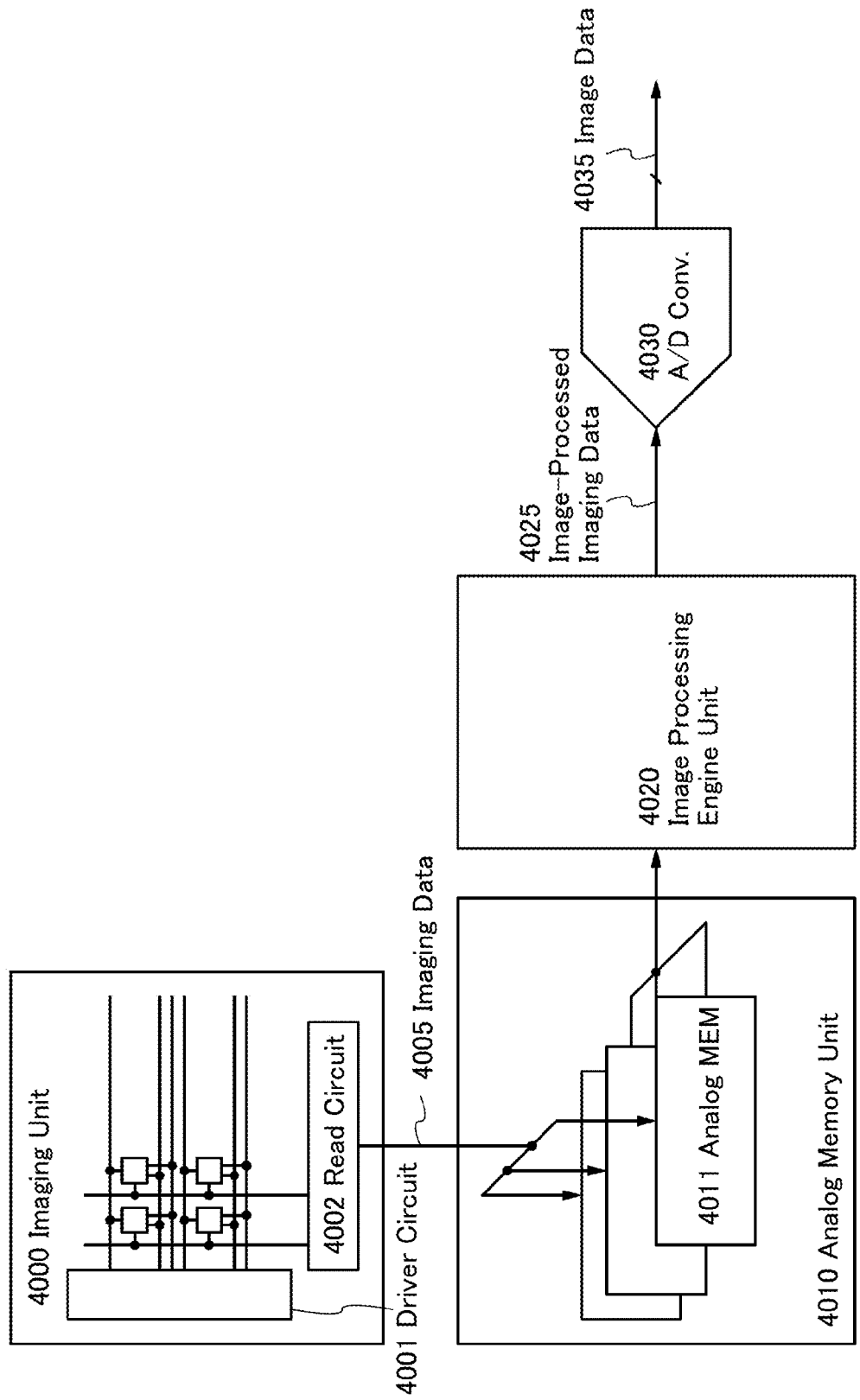

FIG. 31A
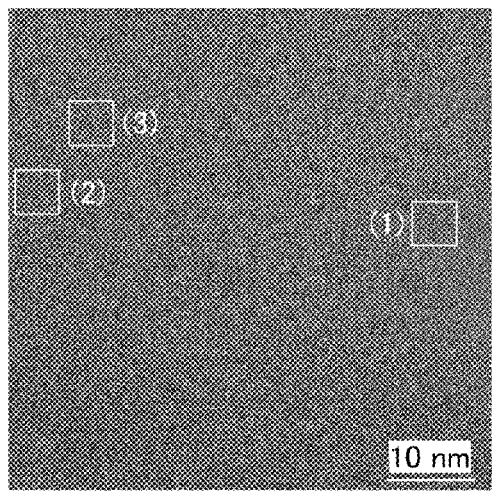
FIG. 31B  FIG. 31C  FIG. 31D
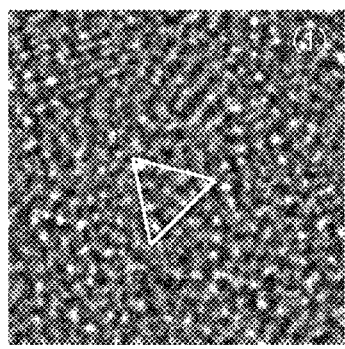 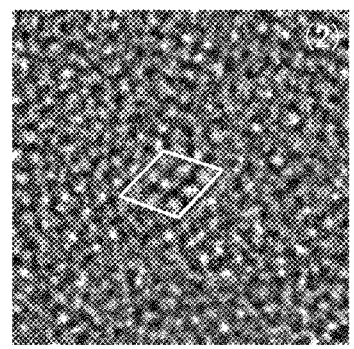 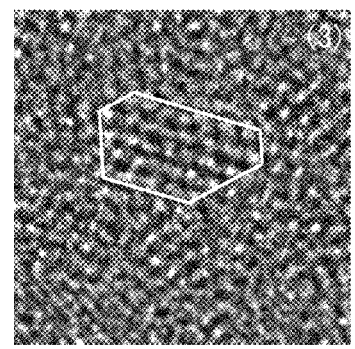

FIG. 33A
FIG. 33B
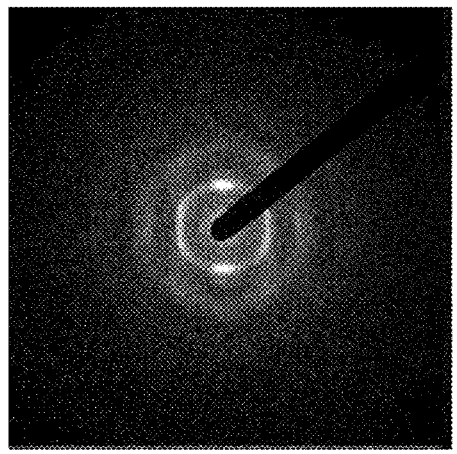
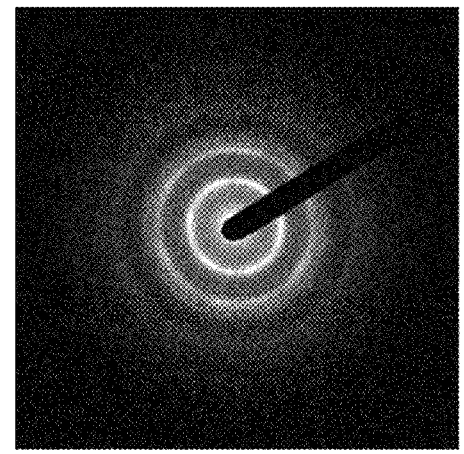

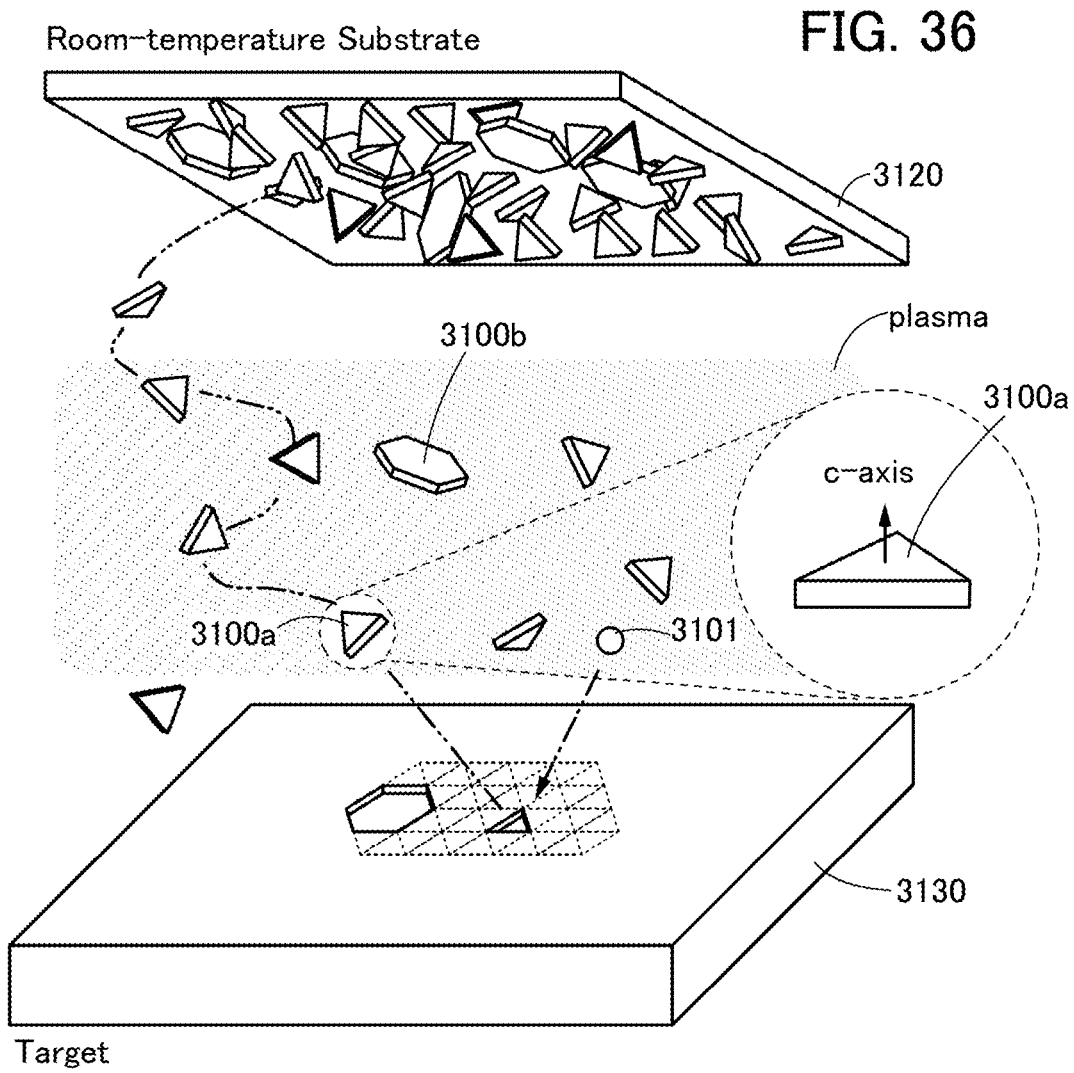

InGaZnO$_4$

100psec After Ar-Collision

100psec After O-Collision

In : ○  Ga : ○  Zn : ●  O : ●

Trajectories of Atoms
0 to 0.3psec after Ar-Collision

Zn at the third layer (Ga-Zn-O) reaches the vicinity of the sixth layer (Ga-Zn-O).

Trajectories of Atoms
0 to 0.3psec After O-Collision

Zn at the third layer (Ga-Zn-O) does NOT reach the fifth layer (In-O).

CAAC-OS film

Target

IMAGING DEVICE

BACKGROUND OF THE INVENTION

1. Field of the Invention

One embodiment of the present invention relates to a semiconductor device. In particular, one embodiment of the present invention relates to a semiconductor device including an oxide semiconductor.

Note that one embodiment of the present invention is not limited to the above technical field. For example, one embodiment of the present invention relates to an object, a method, or a manufacturing method. Further, one embodiment of the present invention relates to a process, a machine, manufacture, or a composition of matter. Further, one embodiment of the present invention relates to a memory device, a processor, a driving method thereof, or a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an imaging device, an electronic device, and the like may include a semiconductor element or a semiconductor circuit. Therefore, a display device, a light-emitting device, a lighting device, an electro-optical device, an imaging device, an electronic device, and the like include a semiconductor device in some cases.

2. Description of the Related Art

A technique for forming a thin film transistor with the use of a semiconductor thin film formed over a substrate having an insulating surface has been attracting attention. A thin film transistor is used for a display device typified by a liquid crystal television. A silicon-based semiconductor material is known as a material for a semiconductor thin film applicable to a thin film transistor. As another material, an oxide semiconductor has been attracting attention.

As a material for the oxide semiconductor, zinc oxide or a substance containing zinc oxide is known. Thin film transistors each of which is formed using an amorphous oxide (an oxide semiconductor) having an electron carrier concentration of lower than $10^{18}/cm^3$ are disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

SUMMARY OF THE INVENTION

In a solid-state image sensor or the like, which has a structure similar to that of a display device but needs high electrical characteristics, a bulk field-effect transistor formed using SOI or bulk single crystal silicon is generally used.

However, a field-effect transistor formed using single crystal silicon is not necessarily perfect. For example, its off-state current (also referred to as leakage current or the like) is not low enough to be regarded as substantially zero. Further, the temperature characteristics of silicon are very changeable, and particularly the off-state current changes easily. Therefore, in the case where a charge retention semiconductor device such as a solid-state image sensor is formed, it is hoped that a device capable of holding a potential for a sufficiently long time regardless of the surroundings and having a lower off-state current will be developed.

In view of these problems, an object of one embodiment of the disclosed invention is to provide an image sensor including a transistor with stable electrical characteristics (e.g., extremely low off-state current).

A CMOS (complementary metal oxide semiconductor) image sensor, which is a solid-state image sensor, holds a potential in a signal charge storage portion and outputs it to a wiring through an amplifier transistor. In this case, leakage current in a reset transistor and/or a transfer transistor causes charge or discharge, so that the potential of the signal charge storage portion is changed. When the potential of the signal charge storage portion is changed, the potential of the amplifier transistor is also changed; thus, the levels of the potentials are deviated from those of the original potentials and a taken image deteriorates, which is problematic.

A light-receiving element and a pixel circuit for driving the light-receiving element are provided in one pixel with the use of different parts of the same semiconductor layer. Therefore, it has been difficult to increase the size of the light-receiving element for improvement in light sensitivity. Moreover, when the area per pixel is reduced to increase the resolution, the area occupied by the light-receiving element is decreased and the light sensitivity is lowered. Therefore, high-resolution imaging device has been difficult to manufacture.

An object of one embodiment of the present invention is to provide a high-resolution imaging device. Another object is to provide an imaging device with high detection sensitivity. Another object is to provide an imaging device with low power consumption. Another object is to provide an imaging device which can operate in a wide temperature range. Another object is to provide an imaging device which is less likely to be affected by noise. Another object is to provide an imaging device with high linearity. Another object is to provide an imaging device with high reliability. Another object is to provide an imaging device at a lower manufacturing cost. Another object is to provide a novel imaging device or the like.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is an imaging device including a light-receiving portion, a first transistor, and a first circuit. The light-receiving portion is electrically connected to the first transistor. The first transistor is electrically connected to the first circuit. The light-receiving portion includes a first region and a second region. The first region and the second region each have a comb-like shape in a plan view. The first region and the second region are arranged so as to engage with each other.

Further, the light-receiving portion and the first transistor overlap with each other. The first circuit includes a second transistor and a third transistor, and a channel formation region of the second transistor and a channel formation region of the third transistor have different bandgaps. One of the channel formation regions of the second transistor and the third transistor has the same bandgap as a channel formation region of the first transistor.

According to one embodiment of the present invention, a solid-state image sensor including a transistor with stable electrical characteristics (e.g., extremely low off-state current) can be provided. An imaging device with high detection sensitivity can be provided. An imaging device with low power consumption can be provided. An imaging device which can operate in a wide temperature range can be provided. An imaging device which is less likely to be affected by noise can be provided. An imaging device with high linearity can be provided. An imaging device with high reliability can be provided. An imaging device can be provided at a lower manufacturing cost. A novel imaging device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 27A1, 27A2, 27B1, and 27B2 are each a cross-sectional view illustrating one embodiment of a transistor;

FIGS. 28A1 to 28A3, 28B1, and 28B2 are each a cross-sectional view illustrating one embodiment of a transistor;

FIG. 29 is a block diagram illustrating a configuration example of an image processing engine of an imaging device;

FIGS. 31A to 31D are Cs-corrected high-resolution TEM images of a plane of a CAAC-OS;

FIGS. 33A and 33B each show an electron diffraction pattern of a CAAC-OS;

FIG. 36 schematically illustrates a deposition model of an nc-OS and a pellet;

DETAILED DESCRIPTION OF THE INVENTION

Figure 1A:
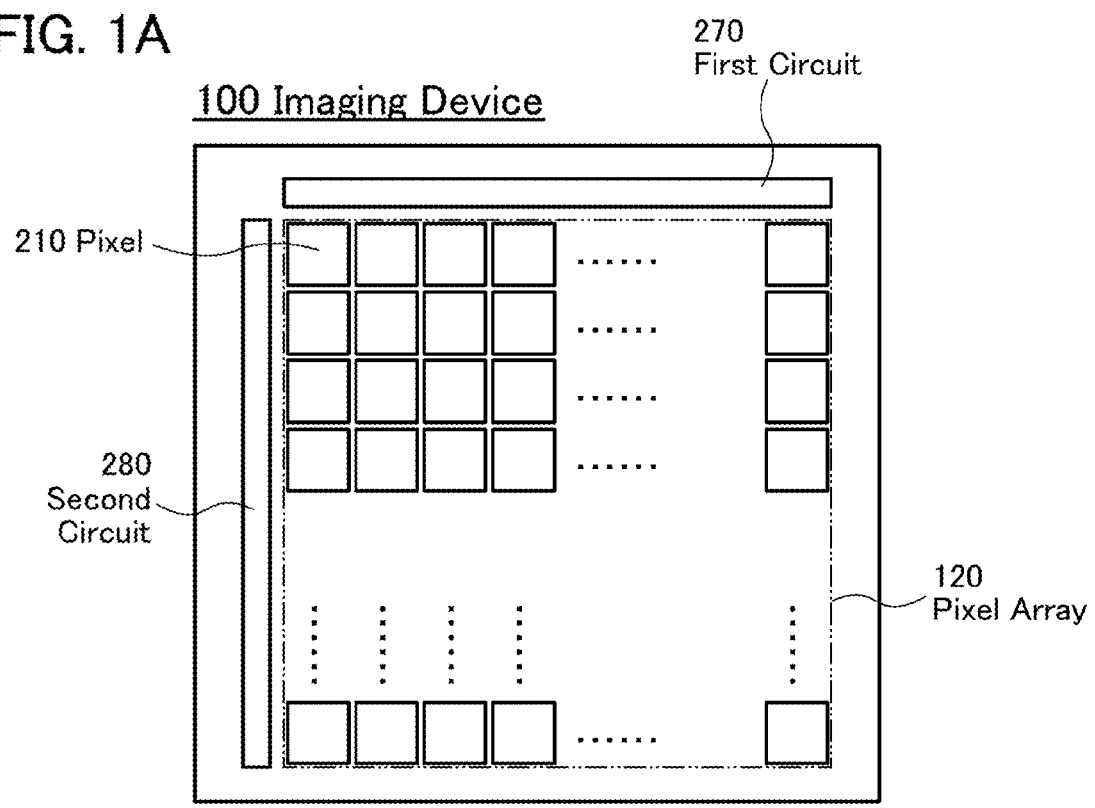
FIGS. 1A and 1B each illustrate a configuration example of an imaging device of one embodiment of the present invention.

Embodiments of the present invention will be described below in detail with reference to the drawings. Note that the present invention is not limited to the following description, and it is easily understood by those skilled in the art that modes and details disclosed herein can be modified in various ways. Further, the present invention is not construed as being limited to description of the embodiments below. Note that in all drawings used to illustrate the embodiments, portions that are identical or portions having similar functions are denoted by the same reference numerals, and their repetitive description may be omitted.

In addition, in this specification and the like, the term such as "electrode" or "wiring" does not limit a function of a component. For example, an "electrode" is used as part of a "wiring" in some cases, and vice versa. Further, the term "electrode" or "wiring" can also mean a combination of a plurality of "electrodes" or "wirings" formed in an integrated manner.

For example, in this specification and the like, an explicit expression "X and Y are connected" means that X and Y are electrically connected, X and Y are functionally connected, and X and Y are directly connected. Accordingly, without being limited to a predetermined connection relation, for example, a connection relation shown in drawings or texts, another connection relation is disclosed in the drawings or the texts.

Here, X and Y each denote an object (e.g., a device, an element, a circuit, a wiring, an electrode, a terminal, a conductive film, a layer, or the like).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) provided between X and Y.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether a current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. When a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit expression "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit expression "X and Y are electrically connected" is the same as the explicit and simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) and a drain (or a second terminal or the like) of a transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that one embodiment of the present invention is not limited by these expressions which are just examples. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As examples of a glass substrate, a barium borosilicate glass substrate, an aluminoborosilicate glass substrate, a soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polyvinyl chloride, or the like can be used, for example. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with a small variation in characteristics, size, shape, or the like and with high current supply capability and a small size. By forming a circuit with the use of such a transistor, the power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent characteristics or a transistor with low power consumption can be formed, a device with high durability can be formed, heat resistance can be provided, or reduction in weight or thickness can be achieved.

The position, the size, the range, or the like of each component illustrated in the drawings and the like is not accurately represented in some cases for easy understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding. In addition, some hidden lines and the like might not be shown.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having opposite polarity is employed or the direction of current flow is changed in circuit operation. Thus, it is difficult to define which is a source or a drain. Therefore, the terms "source" and "drain" can be switched in this specification.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "perpendicular" indicates that the angle formed between two straight lines is greater than or equal to $80°$ and less than or equal to $100°$, and accordingly also includes the case where the angle is greater than or equal to $85°$ and less than or equal to $95°$.

A voltage usually refers to a potential difference between a given potential and a reference potential (e.g., a ground potential or a source potential). Accordingly, a voltage can be referred to as a potential.

Note that an impurity in a semiconductor refers to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased.

In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen. In the case of an oxide semiconductor, an oxygen vacancy may be formed by entry of an impurity such as hydrogen.

Further, in the case where the semiconductor is a silicon film, examples of an impurity which changes the characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim.

Moreover, a term with an ordinal number in this specification and the like might not be provided with any ordinal number in a claim and the like.

In this specification and the like, a high power supply potential VDD (hereinafter also simply referred to as VDD) is a power supply potential higher than a low power supply potential VSS. The low power supply potential VSS (hereinafter also simply referred to as VSS) is a power supply potential lower than the high power supply potential VDD. In addition, a ground potential can be used as VDD or VSS. For example, in the case where a ground potential is used as VDD, VSS is lower than the ground potential, and in the case where a ground potential is used as VSS, VDD is higher than the ground potential.

Note that in this specification, the term "channel length" refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, not all regions necessarily have the same channel length. In other words, the channel length of one transistor is not limited to one value in some cases. Therefore, in this specification, the channel length is any one of values, the maximum value, the minimum value, or the average value in a region where a channel is formed.

The term "channel width" refers to, for example, the length of a portion where a source and a drain face each other in a region where a semiconductor (or a portion where a current flows in a semiconductor when a transistor is on) and a gate electrode overlap with each other or a region where a channel is formed. In one transistor, not all regions necessarily have the same channel width. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width, which is the length of a portion where a source and a drain face each other in a region where a semiconductor and a gate electrode overlap with each other, is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

(Embodiment 1)

In this embodiment, an imaging device of one embodiment of the present invention is described with reference to drawings.

[Imaging Device 100]

FIG. 1A is a plan view illustrating a configuration example of an imaging device 100 of one embodiment of the present invention. The imaging device 100 includes a pixel array 120 and a first and a second circuit 270 and 280 for driving the pixel array 120. The pixel array 120 includes a plurality of pixels 210 arranged in a matrix. The first circuit 270 and the second circuit 280 are connected to the plurality of pixels 210 and have a function of supplying signals for driving the pixels 210. Note that in this specification and the like, the first circuit 270, the second circuit 280, and the like are referred to as a peripheral circuit or a driver circuit in some cases. For example, the first circuit 270 is part of a peripheral circuit. The second circuit 280 is also part of a peripheral circuit.

Figure 1B:
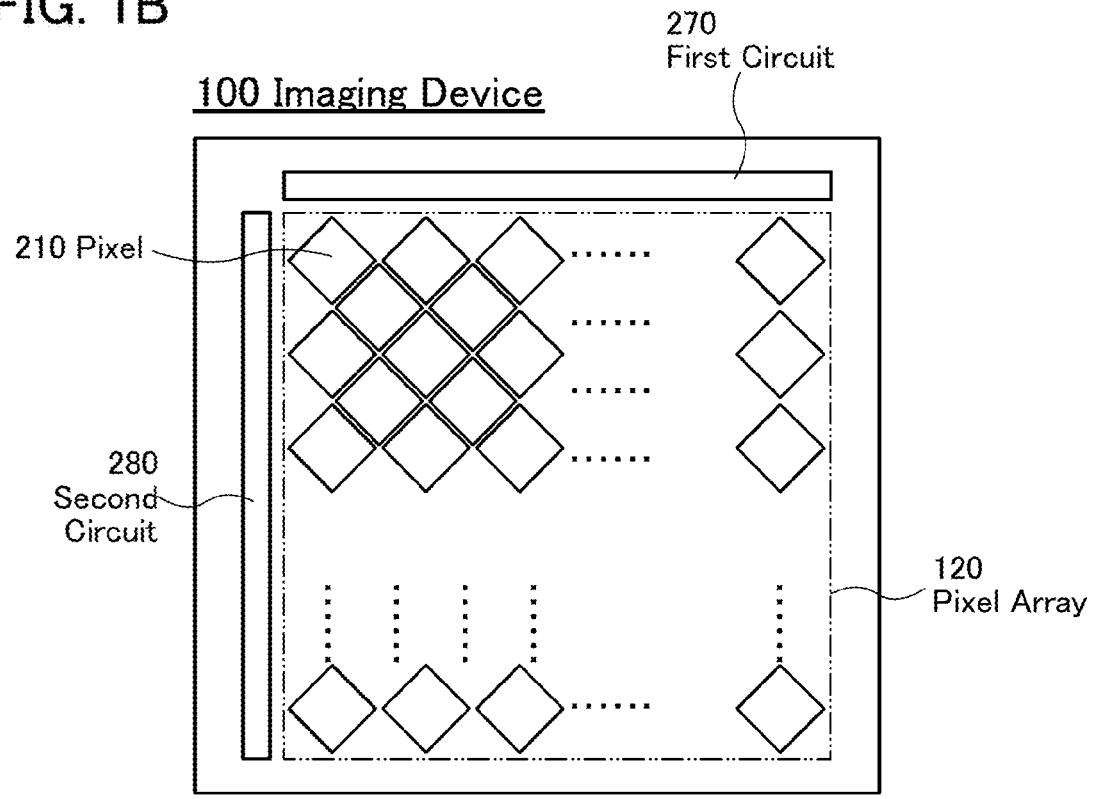

As illustrated in FIG. 1B, the pixels 210 may be obliquely arranged in the pixel array 120 of the imaging device 100. When the pixels 210 are obliquely arranged, the distance between pixels (pitch) can be shortened in the row direction and the column direction. Accordingly, the quality of an image taken with the imaging device 100 can be improved.

Figure 2:
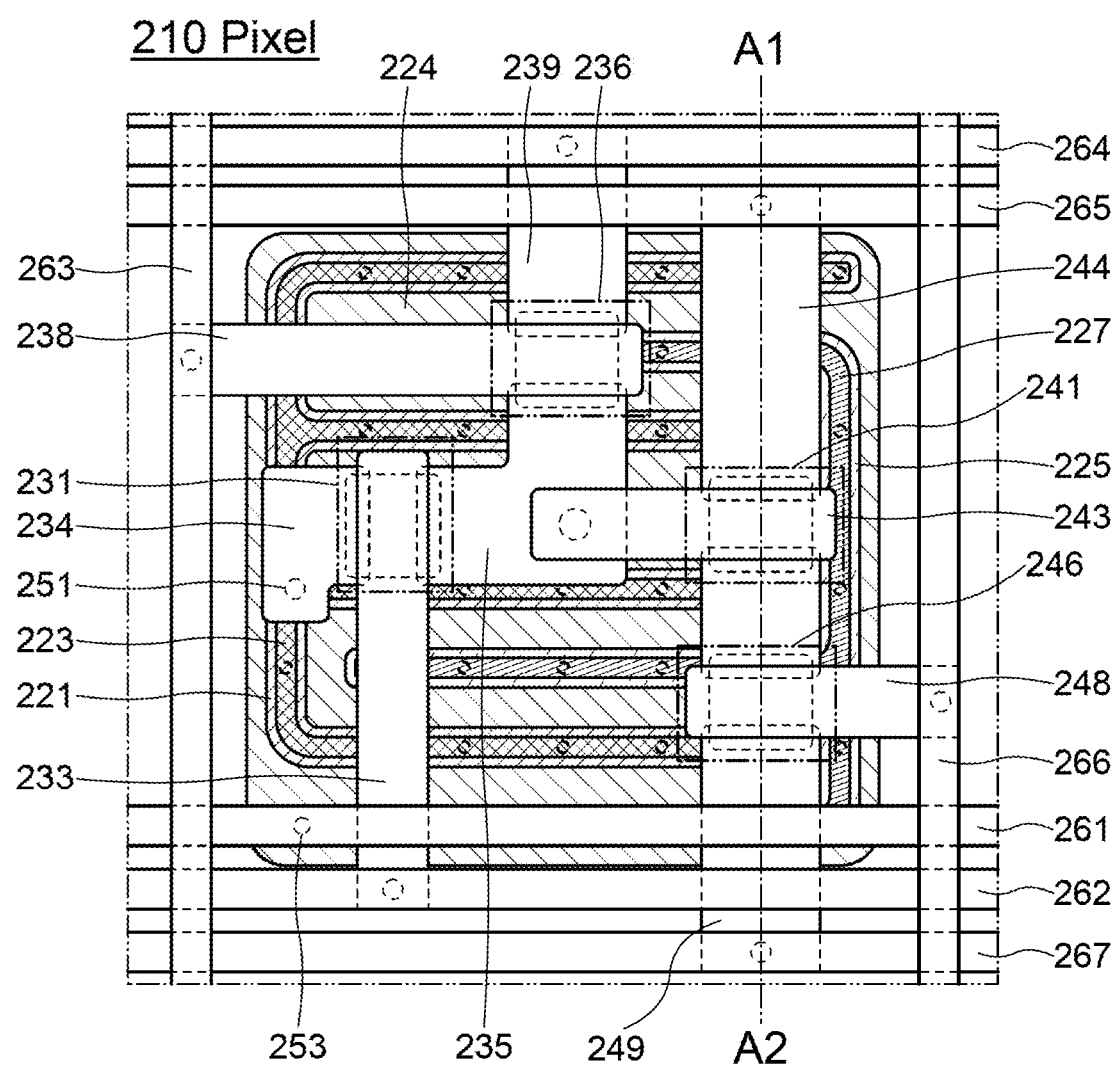
FIG. 2 illustrates an example of a pixel.
Figure 3:
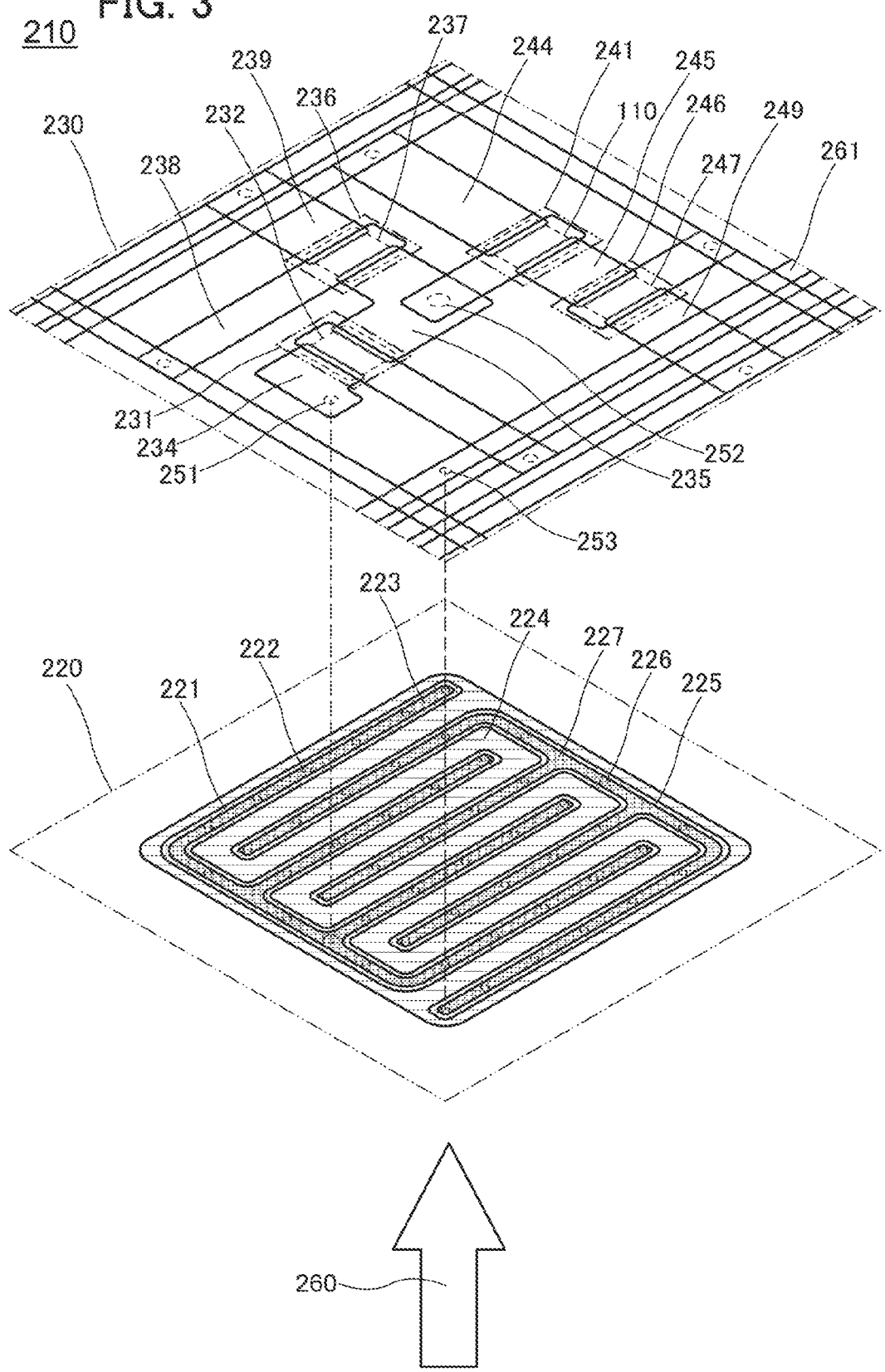
FIG. 3 is a perspective view illustrating an example of a pixel.
Figure 4:
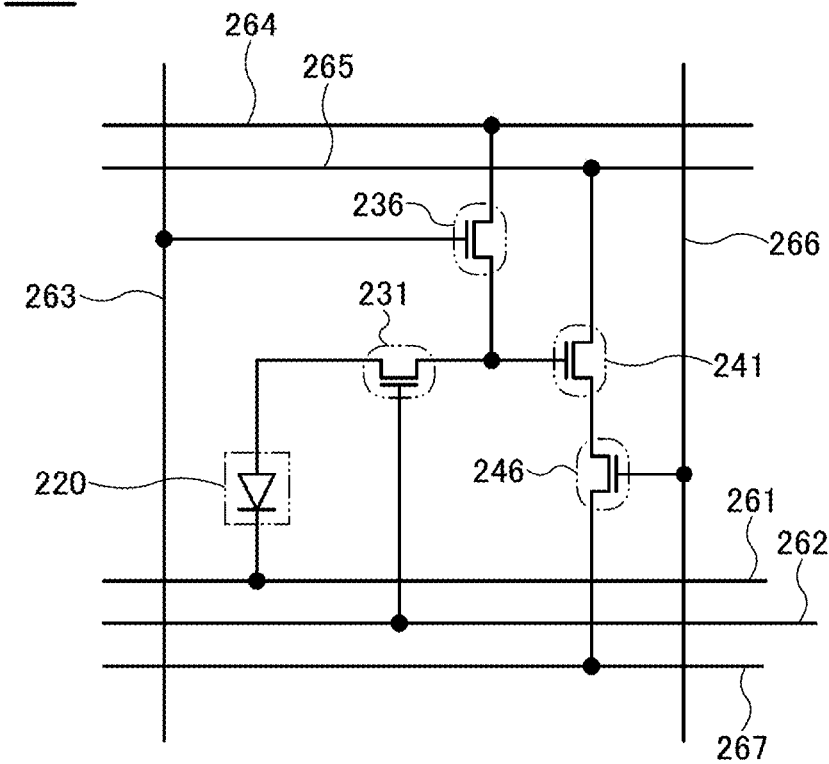
FIG. 4 is an equivalent circuit diagram of a pixel.

FIG. 2 is a plan view illustrating an example of the pixel 210. FIG. 3 is a perspective view illustrating an example of the pixel 210. FIG. 4 is an example of an equivalent circuit diagram of a circuit that can be used for the pixel 210, and circuits described later or other circuits can also be used. The pixel 210 includes a pixel circuit 230 and a light-receiving element 220 which functions as a photoelectric conversion element (photodiode). For easy understanding of the arrangement of the pixel circuit 230 and the light-receiving element 220, the perspective view in FIG. 3 illustrates the pixel circuit 230 and the light-receiving element 220 separately.

The imaging device 100 of one embodiment of the present invention is a CMOS image sensor, which is a kind of solid-state image sensor.

Figure 5:
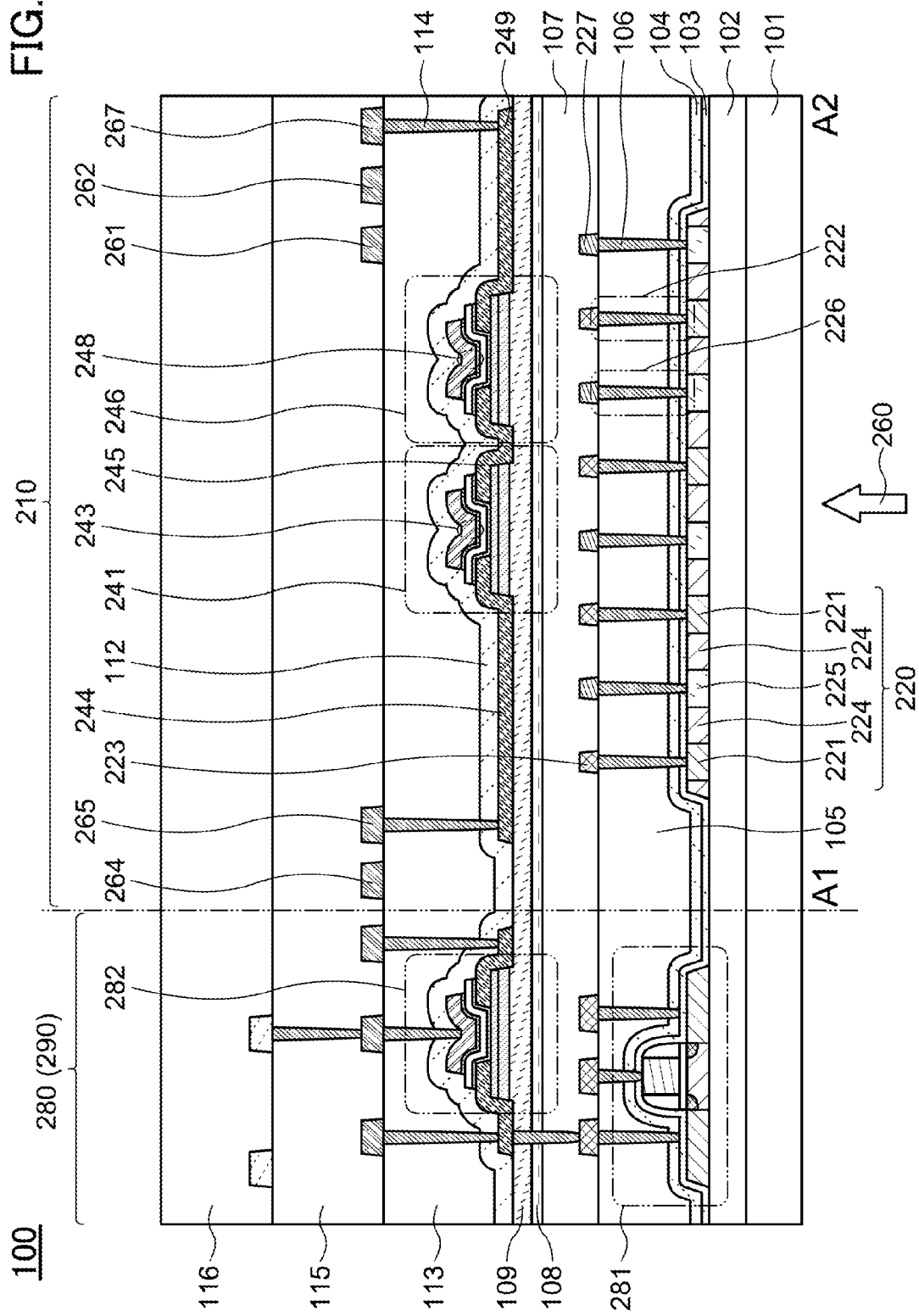
FIG. 5 is a cross-sectional view illustrating an example of an imaging device.
Figure 6A:
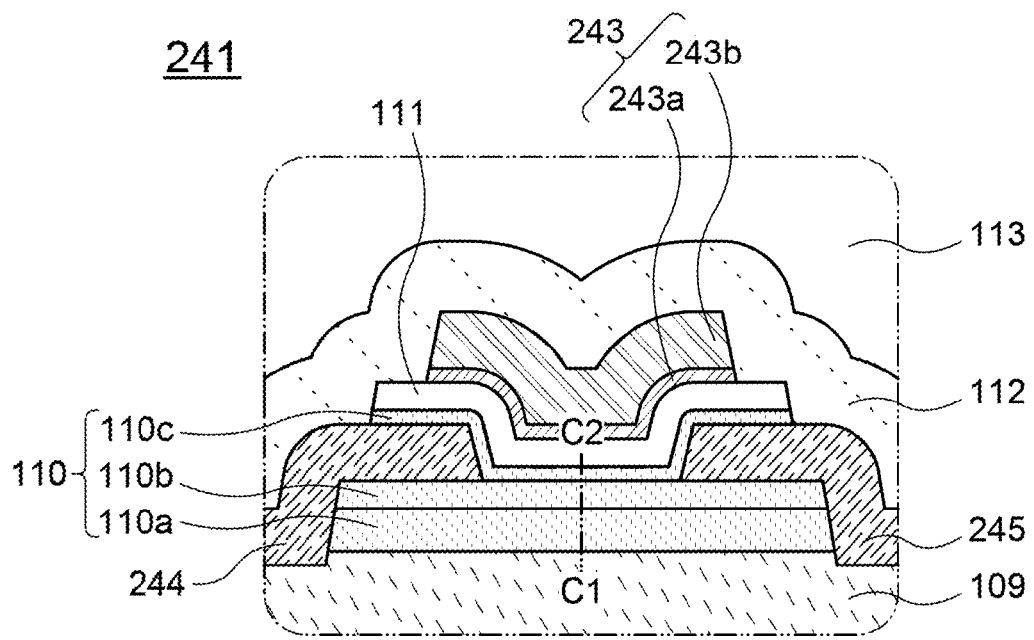
FIGS. 6A and 6B are each a cross-sectional view illustrating an example of a transistor.
Figure 6B:
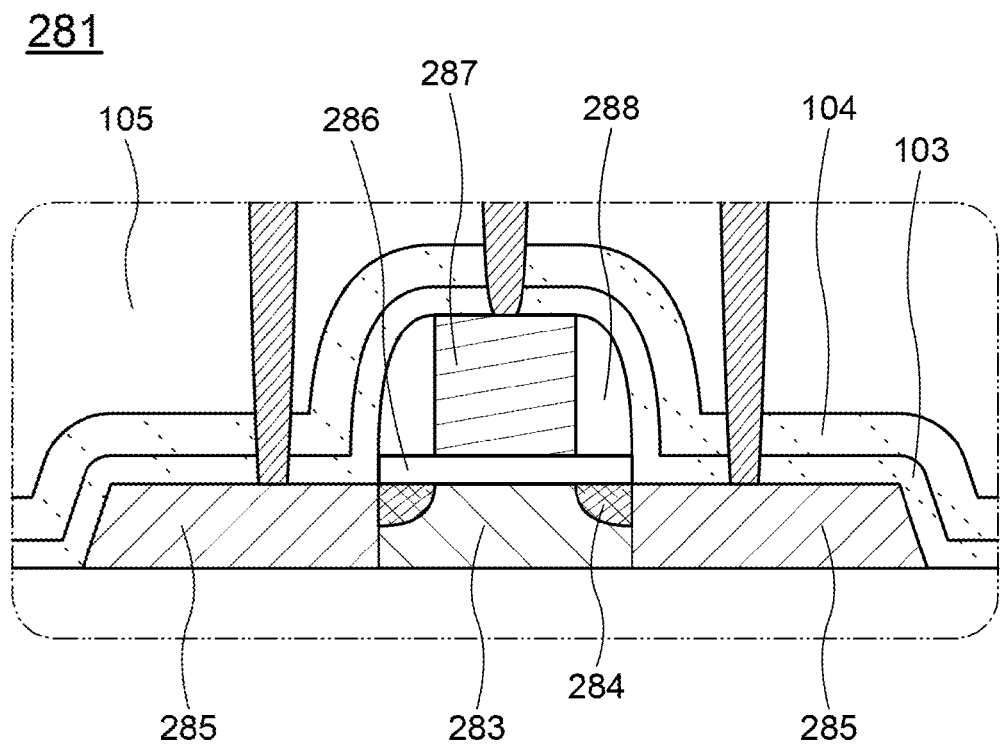

FIG. 5 is a cross-sectional view of a portion indicated by the dashed-dotted line A1-A2 in FIG. 2. Note that FIG. 5 also illustrates a cross-sectional view of part of the first circuit 270 (or the second circuit 280). That is, FIG. 5 is a cross-sectional view of part of the imaging device 100. Further, FIG. 6A is an enlarged view of a transistor 241 in FIG. 5, and FIG. 6B is an enlarged view of a transistor 281 in FIG. 5.

[Light-Receiving Element 220]

The light-receiving element 220 of one embodiment of the present invention has a pin junction. Specifically, an insulating layer 102 is formed over a substrate 101, and a p-type semiconductor layer 221, an i-type semiconductor layer 224, and an n-type semiconductor layer 225 are formed over the insulating layer 102.

As the substrate 101, a glass substrate, a quartz substrate, a sapphire substrate, a ceramic substrate, a metal substrate, a semiconductor substrate, or the like can be used. Alternatively, a plastic substrate having heat resistance to the processing temperature of this embodiment may be used. Examples of the substrate include a semiconductor substrate (e.g., a single crystal substrate or a silicon substrate), a silicon on insulator (SOI) substrate, a glass substrate, a quartz substrate, a plastic substrate, a metal substrate, a stainless steel substrate, a substrate including stainless steel foil, a tungsten substrate, and a substrate including tungsten foil. As examples of a glass substrate, a barium borosilicate glass substrate, an aluminoborosilicate glass substrate, and a soda lime glass substrate can be given.

After the light-receiving element 220 and the pixel circuit 230 are formed, the substrate 101 may be removed by a mechanical polishing method or an etching method. In the case where the substrate 101 is not removed, a material that can transmit light detected by the light-receiving element 220 may be used for the substrate 101.

As the insulating layer 102, a single layer or a multilayer can be formed using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide, a nitride material such as silicon nitride, silicon nitride oxide, aluminum nitride, or aluminum nitride oxide, or the like. The insulating layer 102 can be formed by a sputtering method, a chemical vapor deposition (CVD) method, a thermal oxidation method, a coating method, a printing method, or the like.

The p-type semiconductor layer 221, the i-type semiconductor layer 224, and the n-type semiconductor layer 225 may be formed, for example, in such a manner that the i-type semiconductor layer 224 having an island shape is formed over the insulating layer 102, and then a mask is formed over the i-type semiconductor layer 224, and an impurity element is selectively introduced into part of the i-type semiconductor layer 224. The impurity element can be introduced by an ion implantation method, in which mass separation is performed, or an ion doping method, in which mass separation is not performed. The mask is removed after the impurity element is introduced.

The p-type semiconductor layer 221, the i-type semiconductor layer 224, and the n-type semiconductor layer 225 can be formed using a single crystal semiconductor, a polycrystalline semiconductor, a microcrystalline semiconductor, a nanocrystalline semiconductor, a semi-amorphous semiconductor, an amorphous semiconductor, or the like. For example, amorphous silicon or microcrystalline germanium can be used. Alternatively, a compound semiconductor such as silicon carbide or gallium arsenide can be used.

In the case where silicon is used as a material for the p-type semiconductor layer 221, the i-type semiconductor layer 224, and the n-type semiconductor layer 225, a Group 13 element can be used as a p-type impurity element, for example. As an n-type impurity element, for example, a Group 15 element can be used.

It is preferable that the p-type semiconductor layer 221 and the n-type semiconductor layer 225 be each formed into a comb-like shape in a plan view and engage with each other with the i-type semiconductor layer 224 provided therebetween. When the p-type semiconductor layer 221 and the n-type semiconductor layer 225 each have a comb-like shape, the length of a region where the p-type semiconductor layer 221 and the n-type semiconductor layer 225 face each other can be increased. By increasing the length of the region where the p-type semiconductor layer 221 and the n-type semiconductor layer 225 face each other, the detection sensitivity of the light-receiving element 220 can be increased. Accordingly, the imaging device 100 with high detection sensitivity can be provided.

In the case where the semiconductor layer is formed using SOI, for example, the insulating layer 102 may be a buried oxide (BOX) layer.

The imaging device 100 described in this embodiment includes an insulating layer 103 and an insulating layer 104 over the p-type semiconductor layer 221, the i-type semiconductor layer 224, and the n-type semiconductor layer 225. The insulating layer 103 and the insulating layer 104 can be formed using a material and a method similar to those of the insulating layer 102. Note that one of the insulating layers 103 and 104 may be omitted or another insulating layer may be stacked thereover.

Further, in the imaging device 100 described in this embodiment, an insulating layer 105 having a flat surface is formed over the insulating layer 104. The insulating layer 105 can be formed using a material and a method similar to those of the insulating layer 102. It is also possible to use a low-dielectric constant material (a low-k material), a siloxane-based resin, phosphosilicate glass (PSG), borophosphosilicate glass (BPSG), or the like for the insulating layer 105. Further, the surface of the insulating layer 105 may be subjected to chemical mechanical polishing (CMP) treatment (hereinafter also referred to as CMP treatment). By the CMP treatment, unevenness of the surface can be reduced, and coverage with an insulating layer or a conductive layer formed later can be increased.

Further, openings 222 are formed in regions of the insulating layers 103 to 105, which overlap with the p-type semiconductor layer 221, and openings 226 are formed in regions of the insulating layers 103 to 105, which overlap with the n-type semiconductor layer 225. Contact plugs 106 are formed in the openings 222 and the openings 226. The contact plugs 106 are formed by filling the openings provided in the insulating layers with a conductive material. As the conductive material, for example, a conductive material with high embeddability, such as tungsten or polysilicon, can be used. Although not illustrated, the side surface and the bottom surface of the material can be covered with a barrier layer (a diffusion prevention layer) such as a titanium layer, a titanium nitride layer, or a stack of these layers. In this case, the barrier layer is regarded as part of the contact plug.

Further, an electrode 223 and an electrode 227 are formed over the insulating layer 105. The electrode 223 is electrically connected to the p-type semiconductor layer 221 through the contact plug 106 in the opening 222. The electrode 227 is electrically connected to the n-type semiconductor layer 225 through the contact plug 106 in the opening 226.

Further, an insulating layer 107 is formed to cover the electrode 223 and the electrode 227. The insulating layer 107 can be formed using a material and a method similar to those of the insulating layer 105. A surface of the insulating layer 107 may be subjected to CMP treatment. By the CMP treatment, unevenness of the surface can be reduced, and coverage with an insulating layer or a conductive layer formed later can be increased.

The electrode 223 and the electrode 227 can be formed to have a single-layer structure or a stacked-layer structure including a metal such as aluminum, titanium, chromium, nickel, copper, yttrium, zirconium, molybdenum, manganese, silver, tantalum, or tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film which contains aluminum and one or more elements selected from titanium, tantalum, tungsten, molybdenum, chromium, neodymium, and scandium may be used.

Note that a conductive material containing oxygen, such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride, may be used. It is also possible to use a stacked-layer structure formed using the above material containing a metal element and the above conductive material containing oxygen. It is also possible to use a stacked-layer structure formed using the above material containing a metal element and the above conductive material containing nitrogen. It is also possible to use a stacked-layer structure formed using the above material containing a metal element, the above conductive material containing oxygen, and the above conductive material containing nitrogen.

The light-receiving element 220 detects light 260 incident from the insulating layer 102 side.

[Pixel Circuit 230]

The pixel circuit 230 includes a transistor 231, a transistor 236, the transistor 241, and a transistor 246. As an example, the transistor 231, the transistor 236, the transistor 241, and the transistor 246 are described as top-gate transistors in this embodiment; however, a bottom-gate transistor may also be used.

Alternatively, an inverted staggered transistor or a forward staggered transistor can also be used as the transistors. It is also possible to use a dual-gate transistor, in which a semiconductor layer in which a channel is formed is provided between two gate electrodes. Further, not limited to a transistor having a single-gate structure, a multi-gate transistor having a plurality of channel formation regions, such as a double-gate transistor, may be used.

A transistor with any of a variety of structures such as a planar type, a FIN-type, a Tri-Gate type, and the like can be used.

The above transistors may have the same structure or different structures. The size (e.g., channel length and channel width) or the like of each transistor can be adjusted as appropriate.

In the case where all the plurality of transistors included in the pixel circuit 230 have the same structure, the transistors can be formed at the same time through the same process.

The transistor 231 described in this embodiment includes an electrode 233 which can function as a gate electrode, an electrode 234 which can function as one of a source electrode and a drain electrode, an electrode 235 which can function as the other of the source electrode and the drain electrode, and a semiconductor layer 232. The transistor 236 includes an electrode 238 which can function as a gate electrode, an electrode 239 which can function as one of a source electrode and a drain electrode, the electrode 235 which can function as the other of the source electrode and the drain electrode, and a semiconductor layer 237 (see FIG. 2 and FIG. 3).

Note that in the pixel circuit 230 described in this embodiment as an example, the electrode which can function as the other of the source electrode and the drain electrode of the transistor 231 and the electrode which can function as the other of the source electrode and the drain electrode of the transistor 236 are both formed using the electrode 235. However, one embodiment of the present invention is not limited to the structure. The electrode which can function as the other of the source electrode and the drain electrode of the transistor 231 and the electrode which can function as the other of the source electrode and the drain electrode of the transistor 236 may be formed using different electrodes.

Further, the transistor 241 includes an electrode 243 which can function as a gate electrode, an electrode 244 which can function as one of a source electrode and a drain electrode, an electrode 245 which can function as the other of the source electrode and the drain electrode, and a semiconductor layer 110. The transistor 246 includes an electrode 248 which can function as a gate electrode, the electrode 245 which can function as one of a source electrode and a drain electrode, an electrode 249 which can function as the other of the source electrode and the drain electrode, and a semiconductor layer 247 (see FIG. 2 and FIG. 3).

The electrode 238 is electrically connected to a wiring 263, and the electrode 239 is electrically connected to a wiring 264. The electrode 233 is electrically connected to a wiring 262, and the electrode 243 is electrically connected to the electrode 235 in an opening 252. The electrode 244 is electrically connected to a wiring 265. The electrode 248 is electrically connected to a wiring 266, and the electrode 249 is electrically connected to a wiring 267.

The pixel circuit 230 is formed so as to overlap with the light-receiving element 220. Specifically, the transistor 231, the transistor 236, the transistor 241, and the transistor 246 are formed over the insulating layer 107 with an insulating layer 108 and an insulating layer 109 provided therebetween.

The insulating layer 108 is preferably formed using an insulating film that has a function of preventing diffusion of impurities such as oxygen, hydrogen, water, alkali metal, and alkaline earth metal. Examples of the insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that the use of silicon nitride, gallium oxide, hafnium oxide, yttrium oxide, aluminum oxide, or the like for the insulating film can prevent impurities that diffuse from the light-receiving element 220 side from reaching the semiconductor layer 110, the semiconductor layer 232, the semiconductor layer 237, and the semiconductor layer 247 (hereinafter these semiconductor layers, which are formed at the same time as the semiconductor layer 110, are collectively referred to as the semiconductor layer 110 in some cases). Note that the insulating layer 108 can be formed by a sputtering method, a CVD method, an evaporation method, a thermal oxidation method, or the like. The insulating layer 108 can be formed to have a single-layer structure or a stacked-layer structure including any of these materials.

The insulating layer 109 can be formed using a material and a method similar to those of the insulating layer 102.

Further, in the case where an oxide semiconductor is used for the semiconductor layer 110, it is preferable that an insulating layer containing oxygen at a higher proportion than the stoichiometric composition be formed as the insulating layer 108. From the insulating layer containing oxygen at a higher proportion than the stoichiometric composition, part of oxygen is released by heating. The insulating layer containing oxygen at a higher proportion than the stoichiometric composition is an insulating layer of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the surface temperature of the film in the TDS analysis is preferably higher than or equal to 100° C. and lower than or equal to 700° C., or higher than or equal to 100° C. and lower than or equal to 500° C.

The insulating layer containing oxygen at a higher proportion than the stoichiometric composition can be formed by treatment for adding oxygen to the insulating layer. Oxygen can be added by heat treatment in an oxygen atmosphere or with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as oxygen doping treatment.

In this embodiment, an oxide semiconductor is used for the semiconductor layer 110. In addition, the case where the semiconductor layer 110 is a stack of a semiconductor layer 110a, a semiconductor layer 110b, and a semiconductor layer 110c is described in this embodiment.

The semiconductor layer 110a, the semiconductor layer 110b, and the semiconductor layer 110c are each formed using a material containing In and/or Ga. Typical examples are an In—Ga oxide (an oxide including In and Ga), an In—Zn oxide (an oxide including In and Zn), and an In-M-Zn oxide (an oxide including In, an element M, and Zn; the element M is one or more metal elements selected from Al, Ti, Ga, Y, Zr, La, Ce, Nd, and Hf, which have higher bonding strength to oxygen than In).

The semiconductor layer 110a and the semiconductor layer 110c are preferably formed using a material containing one or more kinds of metal elements contained in the semiconductor layer 110b. By using such a material, interface states are less likely to be generated at an interface between the semiconductor layer 110a and the semiconductor layer 110b and an interface between the semiconductor layer 110c and the semiconductor layer 110b. Accordingly, carriers are not likely to be scattered or captured at the interfaces, which results in an improvement in field-effect mobility of the transistor. Further, variation in threshold voltage of the transistor can be reduced. Thus, a semiconductor device having favorable electrical characteristics can be obtained.

The thicknesses of the semiconductor layer 110a and the semiconductor layer 110c are each greater than or equal to 3 nm and less than or equal to 100 nm, preferably greater than or equal to 3 nm and less than or equal to 50 nm. The thickness of the semiconductor layer 110b is greater than or equal to 3 nm and less than or equal to 200 nm, preferably greater than or equal to 3 nm and less than or equal to 100 nm, further preferably greater than or equal to 3 nm and less than or equal to 50 nm.

Assumed is the case where an In-M-Zn oxide is used for the semiconductor layer 110b as well as the semiconductor layer 110a and the semiconductor layer 110c. When the semiconductor layer 110a and the semiconductor layer 110c have an atomic ratio of In:M:Zn=$x_1$:$y_1$:$z_1$ and the semiconductor layer 110b has an atomic ratio of In:M:Zn=$x_2$:$y_2$:$z_2$, the semiconductor layer 110a, the semiconductor layer 110c, and the semiconductor layer 110b are selected so that $y_1/x_1$ is larger than $y_2/x_2$. It is preferable that the semiconductor layer 110a, the semiconductor layer 110c, and the semiconductor layer 110b be selected so that $y_1/x_1$ is 1.5 times or more of $y_2/x_2$. It is further preferable that the semiconductor layer 110a, the semiconductor layer 110c, and the semiconductor layer 110b be selected so that $y_1/x_1$ is twice or more of $y_2/x_2$. It is still further preferable that the semiconductor layer 110a, the semiconductor layer 110c, and the semiconductor layer 110b be selected so that $y_1/x_1$ is three times or more of $y_2/x_2$. Here, regarding the semiconductor layer 110b, $y_2$ is preferably larger than or equal to $x_2$ because the transistor can have stable electrical characteristics. However, when $y_2$ is three times or more of $x_2$, the field-effect mobility of the transistor is decreased; accordingly, $y_2$ is preferably smaller than three times $x_2$. When the semiconductor layer 110a, the semiconductor layer 110b, and the semiconductor layer 110c have the above composition, the semiconductor layer 110a and the semiconductor layer 110c can be layers in which an oxygen vacancy is less likely to be generated than in the semiconductor layer 110b.

In the case of using an In-M-Zn oxide for the semiconductor layer 110a and the semiconductor layer 110c, when Zn and O are not taken into consideration, the proportion of In and the proportion of the element M are preferably lower than 50 atomic % and higher than or equal to 50 atomic %, respectively, further preferably lower than 25 atomic % and higher than or equal to 75 atomic %, respectively. In the case of using an In-M-Zn oxide for the semiconductor layer 110b, when Zn and O are not taken into consideration, the proportion of In and the proportion of the element M are preferably higher than or equal to 25 atomic % and lower than 75 atomic %, respectively, further preferably higher than or equal to 34 atomic % and lower than 66 atomic %, respectively.

For example, an In—Ga—Zn oxide which is formed using a target having an atomic ratio of In:Ga:Zn=1:3:2, 1:3:4, 1:3:6, 1:6:4, 1:9:6, or the like or an In—Ga oxide which is formed using a target having an atomic ratio of In:Ga=1:9 or the like can be used for each of the semiconductor layers 110a and 110c containing In or Ga. Further, an In—Ga—Zn oxide which is formed using a target having an atomic ratio of In:Ga:Zn=3:1:2, 1:1:1, 5:5:6 or the like can be used for the semiconductor layer 110b. In each of the semiconductor layers 110a to 110c, the proportions of the atoms in the above atomic ratio may vary within a margin of error of ±20%.

In order to give stable electrical characteristics to the transistor including the semiconductor layer 110b, it is preferable that impurities and oxygen vacancies in the semiconductor layer 110b be reduced to highly purify the semiconductor layer 110b so that the semiconductor layer 110b can be regarded as an intrinsic or substantially intrinsic oxide semiconductor layer. Furthermore, it is preferable that at least a channel formation region of the semiconductor layer 110b be regarded as an intrinsic or substantially intrinsic semiconductor layer.

Note that the substantially intrinsic oxide semiconductor layer refers to an oxide semiconductor layer in which the carrier density is higher than or equal to $1 \times 10^{-9}$/cm$^3$ and lower than $8 \times 10^{11}$/cm$^3$, preferably lower than $1 \times 10^{11}$/cm$^3$, further preferably lower than $1 \times 10^{10}$/cm$^3$.

[Energy Band Structure of Oxide Semiconductor]

Figure 7:
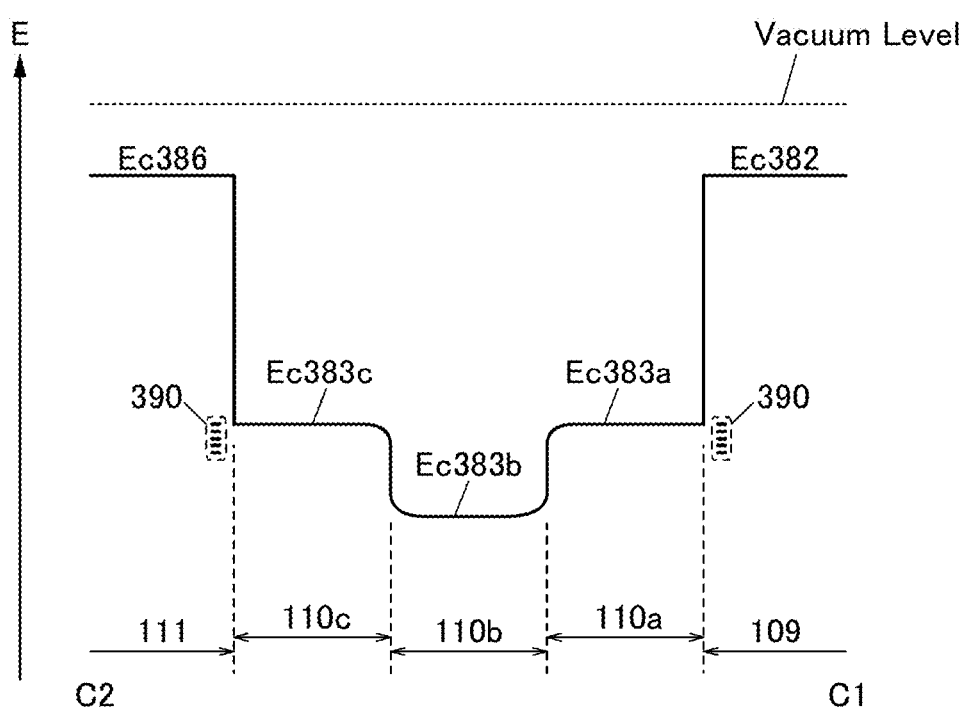
FIG. 7 illustrates an energy band structure.

Here, a function and an effect of the semiconductor layer 110 in which the semiconductor layer 110a, the semiconductor layer 110b, and the semiconductor layer 110c are stacked are described with reference to an energy band structure illustrated in FIG. 7. FIG. 7 illustrates the energy band structure of a portion indicated by the dashed-dotted line C1-C2 in FIG. 6A. FIG. 7 illustrates the energy band structure of a channel formation region of the transistor 241.

In FIG. 7, Ec382, Ec383a, Ec383b, Ec383c, and Ec386 are the energies of the conduction band minimum in the insulating layer 109, the semiconductor layer 110a, the semiconductor layer 110b, the semiconductor layer 110c, and an insulating layer 111, respectively.

Here, an energy difference between the vacuum level and the conduction band minimum (the difference is also referred to as electron affinity) corresponds to a value obtained by subtracting an energy gap from an energy difference between the vacuum level and the valence band maximum (the difference is also referred to as ionization potential). Note that the energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 109 and the insulating layer 111 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 110a and the semiconductor layer 110b and the vicinity of the interface between the semiconductor layer 110b and the semiconductor layer 110c, mixed regions are formed; thus, the energy of the conduction band minimum continuously changes. In other words, no state or few states exist at these interfaces.

Accordingly, electrons transfer mainly through the semiconductor layer 110b in the stacked-layer structure having the above energy band structure. Therefore, even when a state exists at an interface between the semiconductor layer 110a and the insulating layer 109 or an interface between the semiconductor layer 110c and the insulating layer 111, the state hardly influences the electron transfer. In addition, since no state or few states exist at the interface between the semiconductor layer 110a and the semiconductor layer 110b and the interface between the semiconductor layer 110c and the semiconductor layer 110b, the electron transfer is not interrupted in the regions. Accordingly, high field-effect mobility can be obtained in the transistor 241 having the above stacked-layer structure of the oxide semiconductors.

Note that although trap levels 390 due to impurities or defects might be formed in the vicinity of the interface between the semiconductor layer 110a and the insulating layer 109 and the interface between the semiconductor layer 110c and the insulating layer 111 as illustrated in FIG. 7, the semiconductor layer 110b can be separated from the trap levels owing to the existence of the semiconductor layer 110a and the semiconductor layer 110c.

In the transistor 241 described in this embodiment as an example, the top surface and the side surfaces of the semiconductor layer 110b are in contact with the semiconductor layer 110c, and the bottom surface of the semiconductor layer 110b is in contact with the semiconductor layer 110a. In this manner, the semiconductor layer 110b is surrounded by the semiconductor layer 110a and the semiconductor layer 110c, whereby the influence of the trap level can be further reduced.

However, in the case where an energy difference between Ec383a or Ec383c and Ec383b is small, an electron in the semiconductor layer 110b might reach the trap level by passing over the energy difference. The electron is captured by the trap level, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

The bandgap of each of the semiconductor layers 110a and 110c is preferably wider than that of the semiconductor layer 110b.

According to one embodiment of the present invention, a transistor with a small variation in electrical characteristics can be provided. Accordingly, a semiconductor device with a small variation in electrical characteristics can be provided. According to one embodiment of the present invention, a transistor with high reliability can be provided. Accordingly, a semiconductor device with high reliability can be provided.

An oxide semiconductor has a bandgap of 2 eV or more; therefore, a transistor including an oxide semiconductor in a semiconductor layer in which a channel is formed has an extremely low off-state current. Specifically, the off-state current per micrometer of channel width at room temperature can be lower than $1\times10^{-20}$ A, preferably lower than $1\times10^{-22}$ A, further preferably lower than $1\times10^{-24}$ A. That is, the on/off ratio can be greater than or equal to 20 digits and less than or equal to 150 digits.

According to one embodiment of the present invention, a transistor with low power consumption can be provided. Accordingly, a semiconductor device with low power consumption can be provided.

Furthermore, since an oxide semiconductor has a wide bandgap, a semiconductor device including an oxide semiconductor can be used in a wide range of ambient temperature. According to one embodiment of the present invention, a semiconductor device which can operate in a wide temperature range can be provided.

Note that the above-described three-layer structure is an example. For example, a two-layer structure without either one of the semiconductor layers 110a and 110c may be employed.

[Oxide Semiconductor]

An oxide semiconductor which can be used for the semiconductor layer 110 is now described in detail.

As an example of an oxide semiconductor which can be used for the semiconductor layer 110a, the semiconductor layer 110b, and the semiconductor layer 110c, an oxide containing indium can be given. An oxide containing indium can have a high carrier mobility (electron mobility), for example. An oxide semiconductor preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element that can increase the energy gap of the oxide, for example. Further, the oxide semiconductor preferably contains zinc. When the oxide contains zinc, the oxide is easy to crystallize, for example.

Note that the oxide semiconductor is not limited to the oxide containing indium. The oxide semiconductor may be, for example, zinc oxide, zinc tin oxide, gallium tin oxide, or gallium oxide.

As the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

An influence of impurities in the oxide semiconductor is described below. In order to obtain stable electrical characteristics of a transistor, it is effective to reduce the impurity concentration in the oxide semiconductor so that the oxide semiconductor has a lower carrier density and higher purity. In order to reduce the impurity concentration in the oxide semiconductor, the impurity concentration in a film which is adjacent to the oxide semiconductor is preferably reduced.

For example, silicon in the oxide semiconductor might serve as a carrier trap or a carrier generation source. The silicon concentration in the oxide semiconductor measured by secondary ion mass spectrometry (SIMS) is lower than $1 \times 10^{19}$ atoms/cm$^3$, preferably lower than $5 \times 10^{18}$ atoms/cm$^3$, further preferably lower than $2 \times 10^{18}$ atoms/cm$^3$.

Furthermore, when hydrogen is contained in the oxide semiconductor, the carrier density is increased in some cases. The hydrogen concentration in the oxide semiconductor measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. When nitrogen is contained in the oxide semiconductor, the carrier density is increased in some cases. The nitrogen concentration in the oxide semiconductor measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

To reduce the hydrogen concentration in the oxide semiconductor, it is preferable to reduce the hydrogen concentration in the insulating layer 109 and the insulating layer 111, which are in contact with the semiconductor layer 110. The hydrogen concentration in the insulating layer 109 and the insulating layer 111 measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. To reduce the nitrogen concentration in the oxide semiconductor, it is preferable to reduce the nitrogen concentration in the insulating layer 109 and the insulating layer 111. The nitrogen concentration in the insulating layer 109 and the insulating layer 111 measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

<Structure of Oxide Semiconductor>

Next, a structure of an oxide semiconductor film is described.

Oxide semiconductors are classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

From the contraposition, this means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

[CAAC-OS]

First, a CAAC-OS is described.

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 30A:
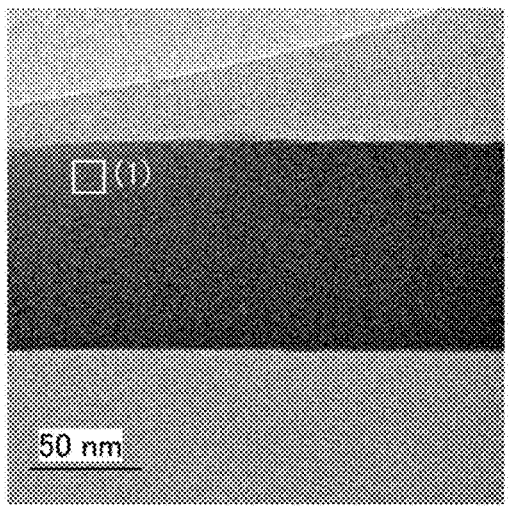
FIGS. 30A to 30C are Cs-corrected high-resolution TEM images of a cross section of a CAAC-OS.

A CAAC-OS observed with a TEM is described below. FIG. 30A shows a high-resolution TEM image of a cross section of the CAAC-OS which is observed from a direction substantially parallel to the sample surface. The high-resolution TEM image is obtained with a spherical aberration correction function. The high-resolution TEM image obtained with a spherical aberration correction function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 30B:
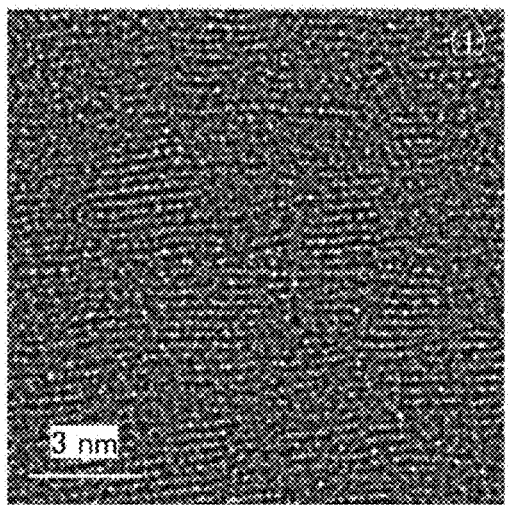

FIG. 30B is an enlarged Cs-corrected high-resolution TEM image of a region (1) in FIG. 30A. FIG. 30B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 30C:
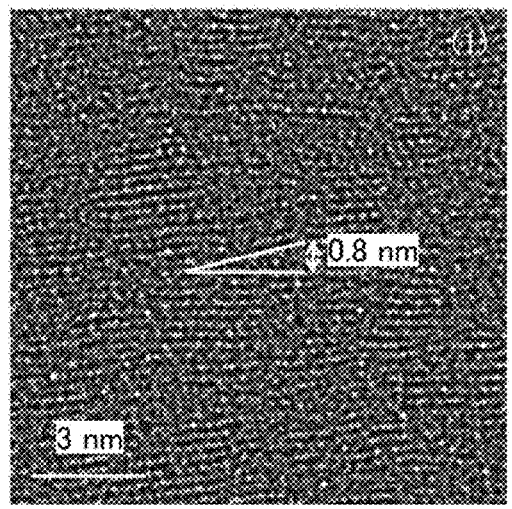

As shown in FIG. 30B, the CAAC-OS has a characteristic atomic arrangement. The characteristic atomic arrangement is denoted by an auxiliary line in FIG. 30C. FIGS. 30B and 30C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 30D:
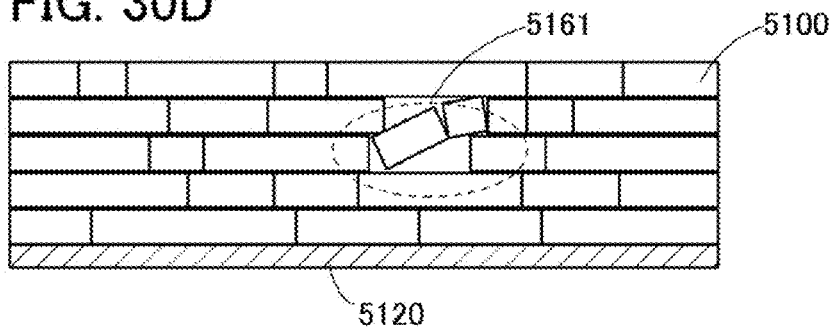
FIG. 30D is a cross-sectional schematic view of a CAAC-OS.

Here, according to the Cs-corrected high-resolution TEM images, the schematic arrangement of pellets 5100 of a CAAC-OS over a substrate 5120 is illustrated by such a structure like stacked bricks or blocks (see FIG. 30D). The part in which the pellets are tilted as observed in FIG. 30C corresponds to a region 5161 shown in FIG. 30D.

FIG. 31A shows a Cs-corrected high-resolution TEM image of a plane of the CAAC-OS observed from a direction substantially perpendicular to the sample surface. FIGS. 31B, 31C, and 31D are enlarged Cs-corrected high-resolution TEM images of regions (1), (2), and (3) in FIG. 31A, respectively. FIGS. 31B, 31C, and 31D indicate that metal atoms are arranged in a triangular, quadrangular, or hexagonal configuration in a pellet. However, there is no regularity of arrangement of metal atoms between different pellets.

Figure 32A:
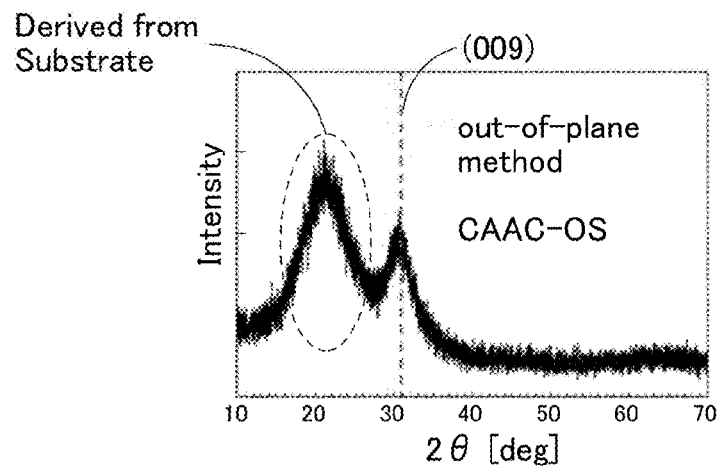
FIGS. 32A to 32C explain structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 32A. This peak is derived from the (009) plane of the $InGaZnO_4$ crystal, which indicates that crystals in the CAAC-OS have c-axis alignment, and that the c-axes are aligned in a direction substantially perpendicular to the formation surface or its top surface.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 32B:
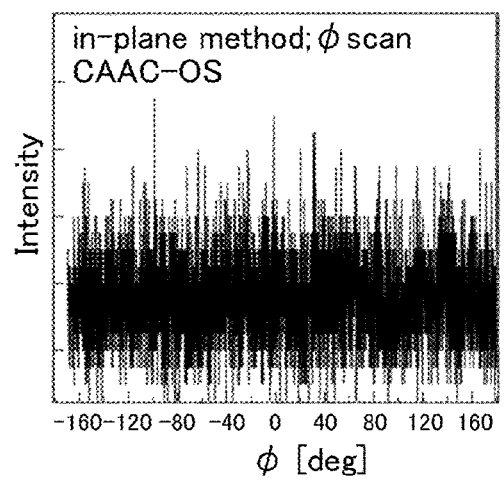
Figure 32C:
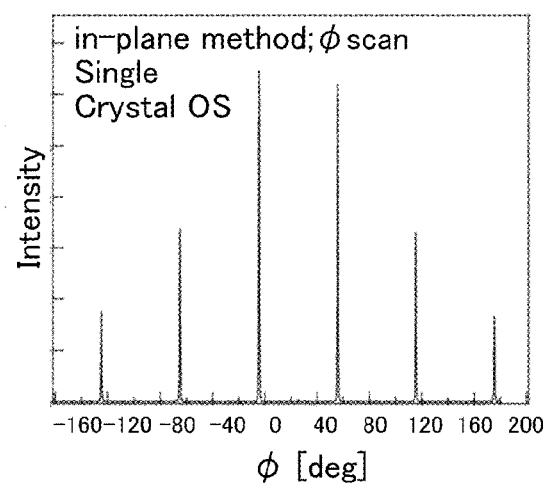

On the other hand, in structural analysis by an in-plane method in which an X-ray is incident on the CAAC-OS in a direction substantially perpendicular to its c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated about a normal vector of the sample surface as an axis ($\phi$ axis), as shown in FIG. 32B, a peak is not clearly observed. In contrast, in the case of a single crystal oxide semiconductor of $InGaZnO_4$, when $\phi$ scan is performed with $2\theta$ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 33A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 33B shows a diffraction pattern obtained in such a manner that an electron beam with a probe diameter of 300 nm is incident on the same sample in a direction perpendicular to the sample surface. As shown in FIG. 33B, a ring-like diffraction pattern is observed. Thus, the electron diffraction also indicates that the a-axes and b-axes of the pellets included in the CAAC-OS do not have regular alignment. The first ring in FIG. 33B is considered to be derived from the (010) plane, the (100) plane, and the like of the $InGaZnO_4$ crystal. The second ring in FIG. 33B is considered to be derived from the (110) plane and the like.

As described above, the CAAC-OS is an oxide semiconductor with high crystallinity. Entry of impurities, formation of defects, or the like might decrease the crystallinity of an oxide semiconductor. From the contraposition, this means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher bonding strength to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

[nc-OS]

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction of the nc-OS, using an electron beam having a probe diameter close to or smaller than the size of a pellet. Moreover, in a nanobeam electron diffraction of the nc-OS, as drawing a circle, (ring-like) high luminance regions are shown in some cases. In addition, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

[a-Like OS]

An a-like OS has an intermediate structure between the nc-OS and the amorphous oxide semiconductor.

In a high-resolution TEM image of the a-like OS film, a void may be observed. Furthermore, in the high-resolution TEM image, there are a region in which a crystal part is clearly observed and a region in which a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing (also referred to as a d-value) on the (009) plane. The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 34:
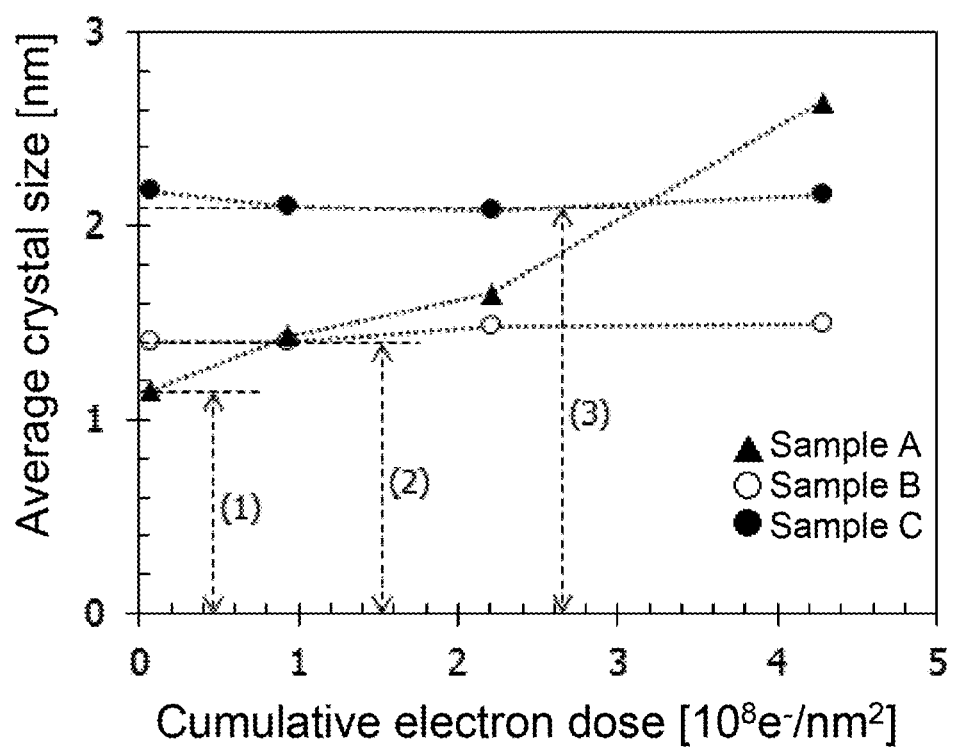
FIG. 34 shows a change in crystal parts of an In—Ga—Zn oxide due to electron irradiation.

FIG. 34 shows examples of examining the average size of crystal parts (22 points to 45 points) in each sample. Note that the crystal part size is assumed as the length of a lattice fringe. FIG. 34 indicates that the crystal part size in the a-like OS increases with an increase in the cumulative electron dose. Specifically, as shown by (1) in FIG. 34, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 34, the average crystal sizes in the nc-OS and the CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal having the same composition. The density of each of the nc-OS and the CAAC-OS is higher than or equal to 92.3% and lower than 100% of the density of the single crystal having the same composition. Note that it is difficult even to deposit an oxide semiconductor having a density of lower than 78% of that of the single crystal.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that a single crystal having a certain composition may not exist. In that case, single crystals with different compositions are combined in an adequate ratio, which makes it possible to calculate the density equivalent to that of a single crystal with the desired composition. The density of a single crystal having the desired composition can be calculated using a weighted average according to the combination ratio of the single crystals with different compositions. Note that it is preferable to use as few kinds of single crystals as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

[Deposition Model]

Next, deposition models of a CAAC-OS and an nc-OS are described.

Figure 35A:
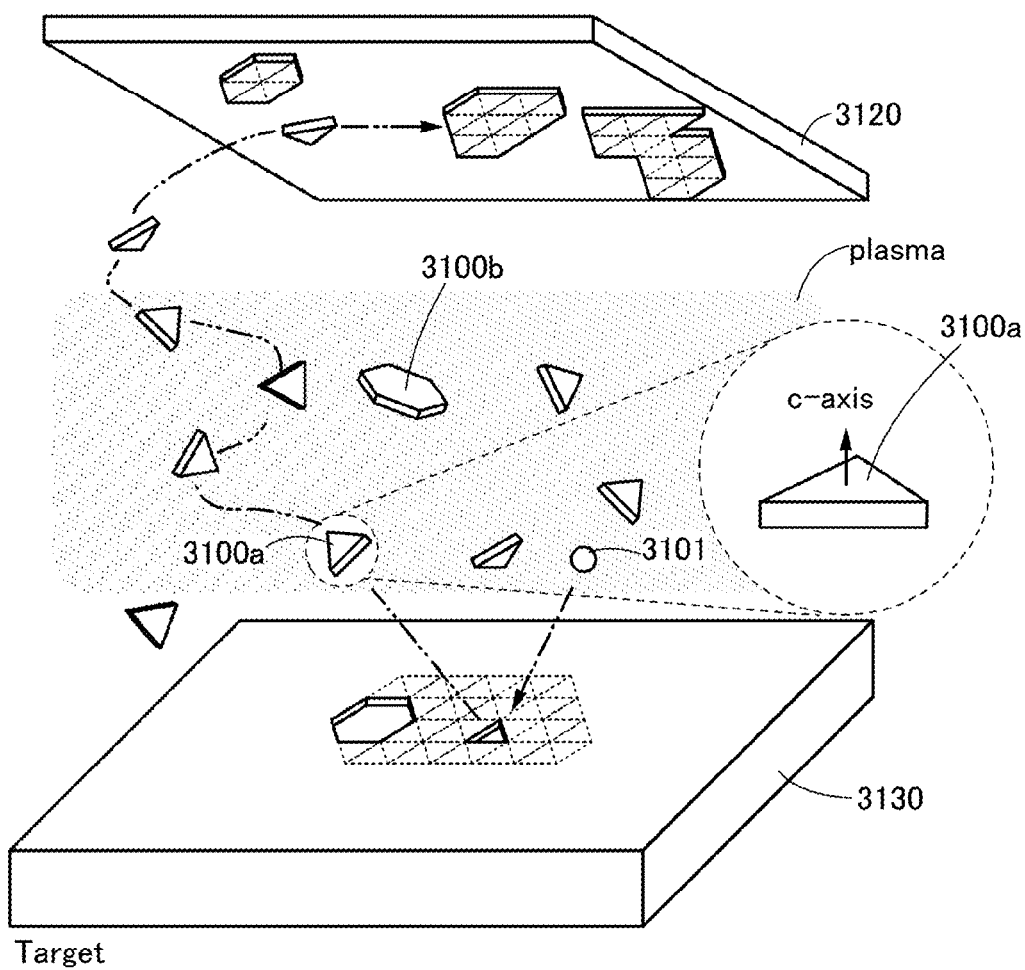
FIG. 35A schematically illustrates a deposition model of a CAAC-OS.

FIG. 35A a schematic view of the inside of a deposition chamber where a CAAC-OS is deposited by a sputtering method.

A target 3130 is attached to a backing plate. Under the target 3130 and the backing plate, a plurality of magnets is placed. The plurality of magnets generates a magnetic field over the target 3130. A sputtering method in which the disposition speed is increased by utilizing a magnetic field of magnets is referred to as a magnetron sputtering method.

The target 3130 has a polycrystalline structure in which a cleavage plane exists in at least one crystal grain. Note that the details of the cleavage plane are described later.

A substrate 3120 is placed to face the target 3130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 3130, and plasma is observed. Note that the magnetic field over the target 3130 forms a high-density plasma region. In the high-density plasma region, the deposition gas is ionized, so that an ion 3101 is generated. Examples of the ion 3101 include an oxygen cation ($O^+$) and an argon cation ($Ar^+$).

The ion 3101 is accelerated toward the target 3130 by an electric field, and collides with the target 3130 eventually. At this time, a pellet 3100a and a pellet 3100b which are flat-plate-like (pellet-like) sputtered particles are separated and sputtered from the cleavage plane. Note that structures of the pellet 3100a and the pellet 3100b may be distorted by an impact of collision of the ion 3101.

The pellet 3100a is a flat-plate-like (pellet-like) sputtered particle having a triangle plane, e.g., a regular triangle plane. The pellet 3100b is a flat-plate-like (pellet-like) sputtered particle having a hexagon plane, e.g., regular hexagon plane. Note that flat-plate-like (pellet-like) sputtered particles such as the pellet 3100a and the pellet 3100b are collectively called pellets 3100. The shape of a flat plane of the pellet 3100 is not limited to a triangle or a hexagon. For example, the flat plane may have a shape formed by combining 2 or more and 6 or less triangles. For example, a square (rhombus) is formed by combining two triangles (regular triangles) in some cases.

The thickness of the pellet 3100 is determined depending on the kind of deposition gas and the like. The thicknesses of the pellets 3100 are preferably uniform; the reason for this is described later. In addition, the sputtered particle preferably has a pellet shape with a small thickness as compared to a dice shape with a large thickness.

Figure 37:
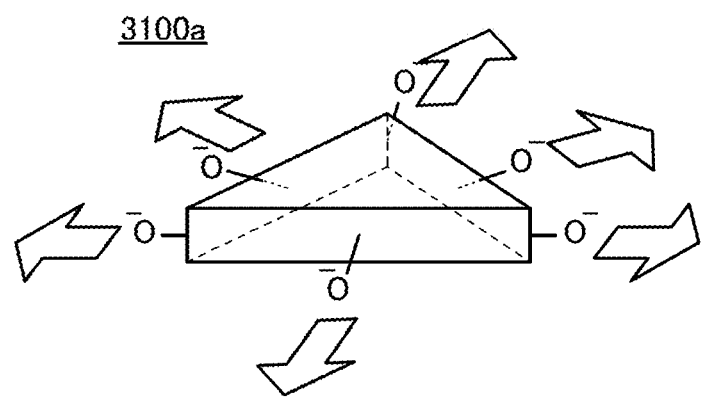
FIG. 37 illustrates a pellet.

The pellet 3100 receives electric charge when passing through the plasma, so that side surfaces of the pellet 3100 are negatively or positively charged in some cases. The pellet 3100 includes an oxygen atom on its side surface, and the oxygen atom may be negatively charged. For example, the case in which the pellet 3100a includes, on side surfaces, oxygen atoms that are negatively charged is illustrated in FIG. 37. As in this view, when the side surfaces are charged in the same polarity, electric charges repel each other, and accordingly, the pellet 3100a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 38:
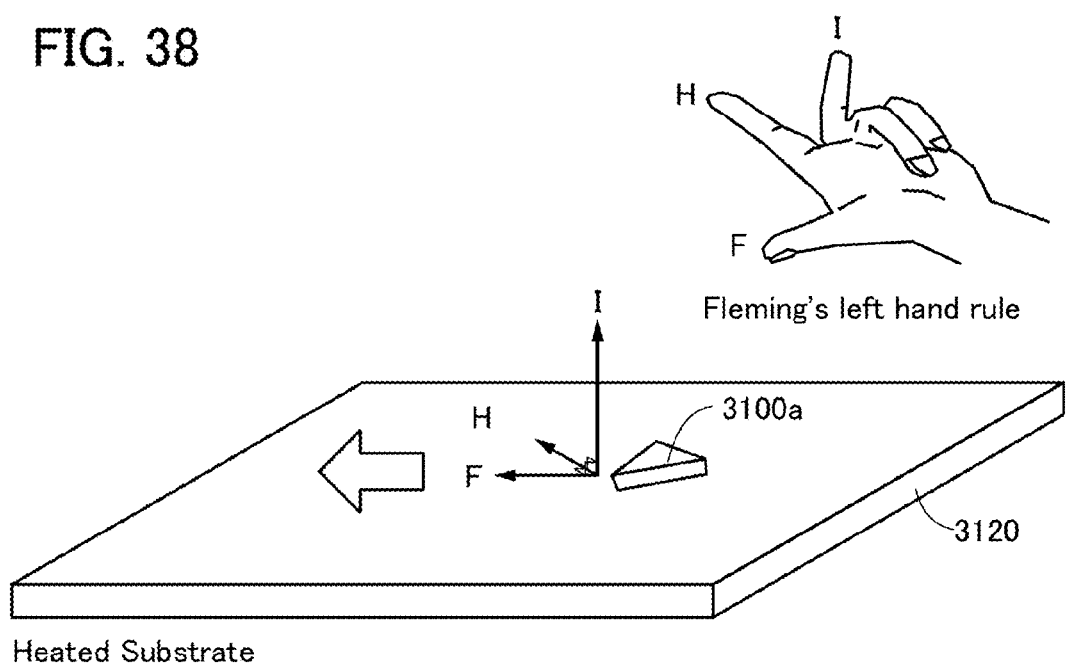
FIG. 38 illustrates force applied to a pellet on a formation surface.

As illustrated in FIG. 35A, the pellet 3100 flies like a kite in plasma and flutters up to the substrate 3120. Since the pellets 3100 are charged, when one pellet 3100 gets close to a region where another pellet 3100 has already been deposited, repulsion is generated. Here, above the substrate 3120, a magnetic field is generated in a direction parallel to a top surface of the substrate 3120. A potential difference is given between the substrate 3120 and the target 3130, and accordingly, a current flows from the substrate 3120 toward the target 3130. Thus, the pellet 3100 is given a force (Lorentz force) on the top surface of the substrate 3120 by an effect of the magnetic field and the current (see FIG. 38). This is explainable with Fleming's left-hand rule. In order to increase a force applied to the pellet 3100, it is preferable to provide, around the top surface of the substrate 3120, a region where the magnetic field parallel to the top surface of the substrate 3120 is 10 G or higher, preferably 20 G or higher, further preferably 30 G or higher, still further preferably 50 G or higher. Alternatively, it is preferable to provide, around the top surface of the substrate 3120, a region where the magnetic field parallel to the top surface of the substrate 3120 is 1.5 times or more, preferably twice or more, further preferably 3 times or more, still further preferably 5 times or more as high as the magnetic field perpendicular to the top surface of the substrate 3120.

Figure 39A:
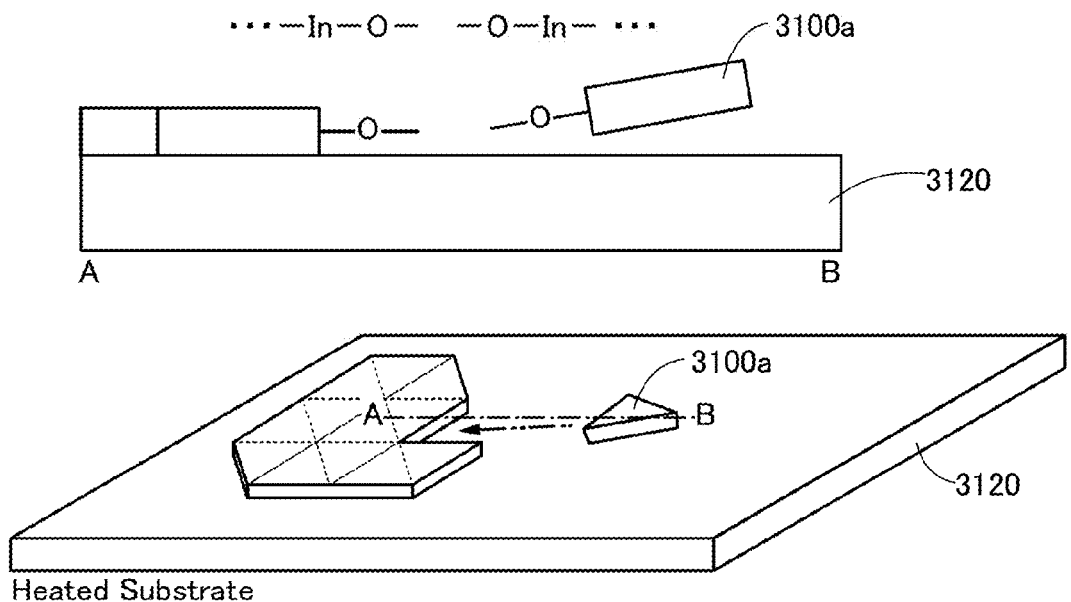
FIGS. 39A and 39B illustrate movement of a pellet on a formation surface.
Figure 39B:
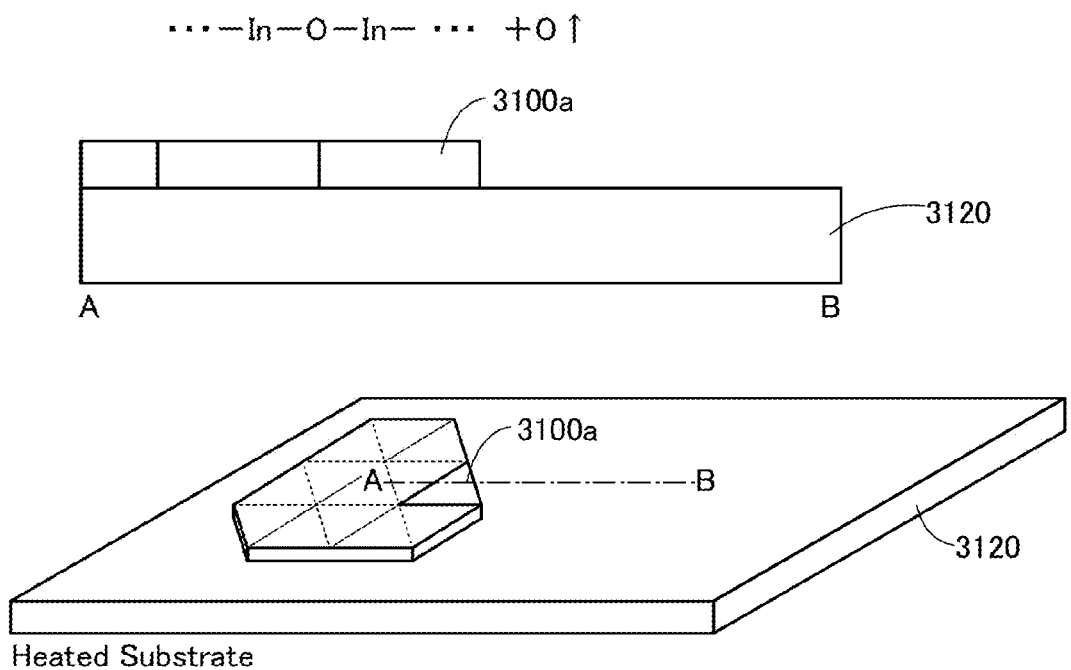

Further, the substrate 3120 is heated, and the resistance such as friction between the pellet 3100 and the substrate 3120 is low. As a result, as illustrated in FIG. 39A, the pellet 3100 glides on the top surface of the substrate 3120. The glide of the pellet 3100 is caused in a state where its flat plane faces the substrate 3120. Then, as illustrated in FIG. 39B, when the pellet 3100 reaches the side surface of another pellet 3100 that has already been deposited, the side surfaces of the pellets 3100 are bonded. At this time, the oxygen atom on the side surface of the pellet 3100 is released. With the released oxygen atom, an oxygen vacancy in a CAAC-OS is filled in some cases; thus, the CAAC-OS has a low density of defect states.

Further, the pellet 3100 is heated over the substrate 3120, whereby atoms are rearranged and the structure distortion caused by the collision of the ion 3101 can be reduced. The pellet 3100 whose structure distortion is reduced is substantially single crystal. Even when the pellets 3100 are heated after being bonded, expansion and contraction of the pellet 3100 itself hardly occur because the pellet 3100 is substantially single crystal. Thus, formation of defects such as a grain boundary due to expansion of a space between the pellets 3100 can be prevented, and accordingly, generation of crevasses can be prevented. Further, it is considered that the space is filled with elastic metal atoms and the like that have a function, like a highway, of jointing side surfaces of the pellets 3100 which are not aligned with each other.

As shown in such a model, the pellets 3100 are considered to be deposited on the substrate 3120. Thus, a CAAC-OS film can be deposited even when a formation surface does not have a crystal structure, unlike epitaxial growth. For example, even when the top surface (formation surface) of the substrate 3120 has an amorphous structure, a CAAC-OS can be deposited.

Figure 35B:
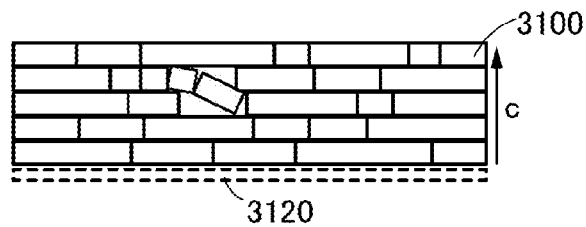
FIGS. 35B and 35C are each a cross-sectional view of pellets and a CAAC-OS.

It is also found that, not only on a flat surface, but also on an uneven portion at the formation surface, i.e., the top surface of the substrate 3120, the pellets 3100 in the CAAC-OS are arranged in accordance with its shape. For example, in the case where the top surface of the substrate 3120 is flat at the atomic level, the pellets 3100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 35B).

Figure 35C:
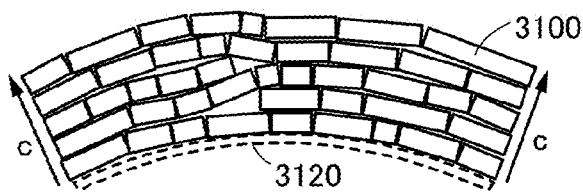

In the case where the top surface of the substrate 3120 has unevenness, a CAAC-OS in which n layers (n is a natural number) in each of which the pellets 3100 are arranged along the convex surface are stacked is formed. Since the substrate 3120 has unevenness, a space is easily generated between the pellets 3100 in the CAAC-OS in some cases. Note that owing to intermolecular force, the pellets 3100 are arranged so that a space between the pellets is as small as possible even on the uneven surface. Therefore, even when the formation surface has unevenness, a CAAC-OS with high crystallinity can be formed (see FIG. 35C).

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 3120 vary; thus, the thicknesses and orientations of the crystals cannot be uniform in some cases.

According to the deposition model described above, a CAAC-OS with high crystallinity can be formed even on a formation surface with an amorphous structure.

Further, formation of a CAAC-OS can be explained by a deposition model including a zinc oxide particle besides the pellet 3100.

The zinc oxide particle reaches the substrate 3120 before the pellet 3100 does because the zinc oxide particle is smaller than the pellet 3100 in mass. On the top surface of the substrate 3120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 3120. The zinc oxide layer serves as a seed layer that makes a CAAC-OS grow and thus has a function of increasing the crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, hardly any grain boundary is observed.

Thus, in order to deposit a CAAC-OS with high crystallinity, a target containing zinc at a higher proportion than the stoichiometric composition is preferably used.

An nc-OS can be understood with a deposition model illustrated in FIG. 36. Note that a difference between FIG. 36 and FIG. 35A lies only in whether the substrate 3120 is heated or not.

Thus, the substrate 3120 is not heated, and the resistance such as friction between the pellet 3100 and the substrate 3120 is high. As a result, the pellets 3100 cannot glide on the top surface of the substrate 3120 and are stacked randomly, so that an nc-OS can be obtained.

[Cleavage Plane]

A cleavage plane of a target that has been mentioned in the deposition model of the CAAC-OS is described below.

Figure 40A:
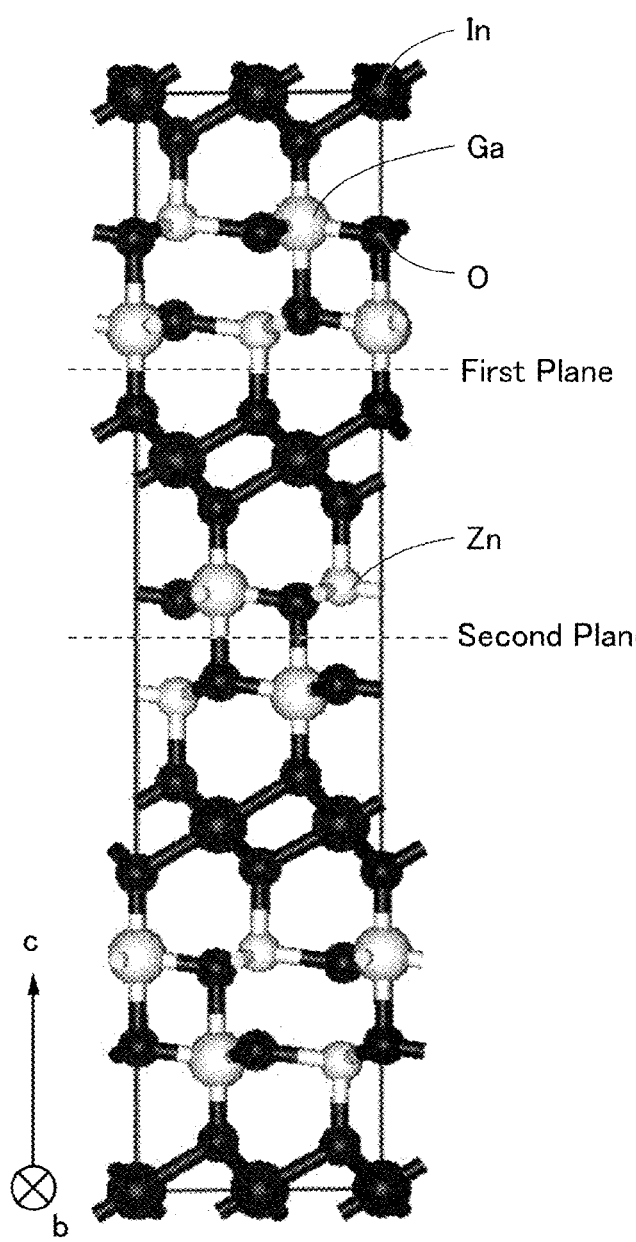
FIGS. 40A and 40B show an $InGaZnO_4$ crystal.
Figure 40B:
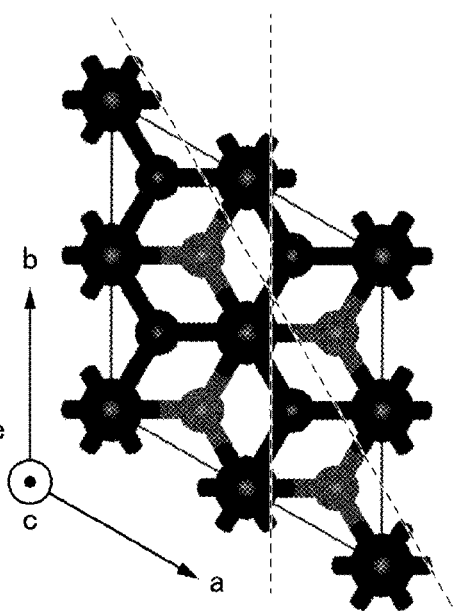

First, a cleavage plane of a target is described with reference to FIGS. 40A and 40B. FIGS. 40A and 40B show a structure of an $InGaZnO_4$ crystal. Note that FIG. 40A shows a structure of the $InGaZnO_4$ crystal observed from a direction parallel to the b-axis when the c-axis is in an upward direction. Further, FIG. 40B shows a structure of the $InGaZnO_4$ crystal observed from a direction parallel to the c-axis.

Energy needed for cleavage at each crystal plane of the $InGaZnO_4$ crystal is calculated by the first principles calculation. Note that a pseudopotential and a program (here, CASTEP) of density functional theory using the plane wave basis are used for the calculation. Note that an ultrasoft pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal shown in FIGS. 40A and 40B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 40A). The second plane is a crystal plane between a Ga—Zn—O layer and a Ga—Zn—O layer and is parallel to the (001) plane (or the a-b plane) (see FIG. 40A). The third plane is a crystal plane parallel to the (110) plane (see FIG. 40B). The fourth plane is a crystal plane parallel to the (100) plane (or the b-c plane) (see FIG. 40B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane is 2.60 $J/m^2$, that of the second plane is 0.68 $J/m^2$, that of the third plane is 2.18 $J/m^2$, and that of the fourth plane is 2.12 $J/m^2$ (see Table 1).

TABLE 1

| | Cleavage energy [$J/m^2$] |
|---|---|
| First plane | 2.60 |
| Second plane | 0.68 |
| Third plane | 2.18 |
| Fourth plane | 2.12 |

From the calculations, in the structure of the $InGaZnO_4$ crystal shown in FIGS. 40A and 40B, the cleavage energy at the second plane is the lowest. In other words, along a plane between a Ga—Zn—O layer and a Ga—Zn—O layer, cleavage is caused most easily (cleavage plane). Therefore, in this specification, the cleavage plane indicates the second plane, which is a plane where cleavage is caused most easily.

Since the cleavage plane is the second plane between a Ga—Zn—O layer and a Ga—Zn—O layer, the $InGaZnO_4$ crystals in FIG. 40A can be separated at two planes equivalent to the second plane. Therefore, when an ion or the like collides with a target, a wafer-like unit (we call this a pellet) which is cleaved at a plane with the lowest cleavage energy is separated off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 41A:
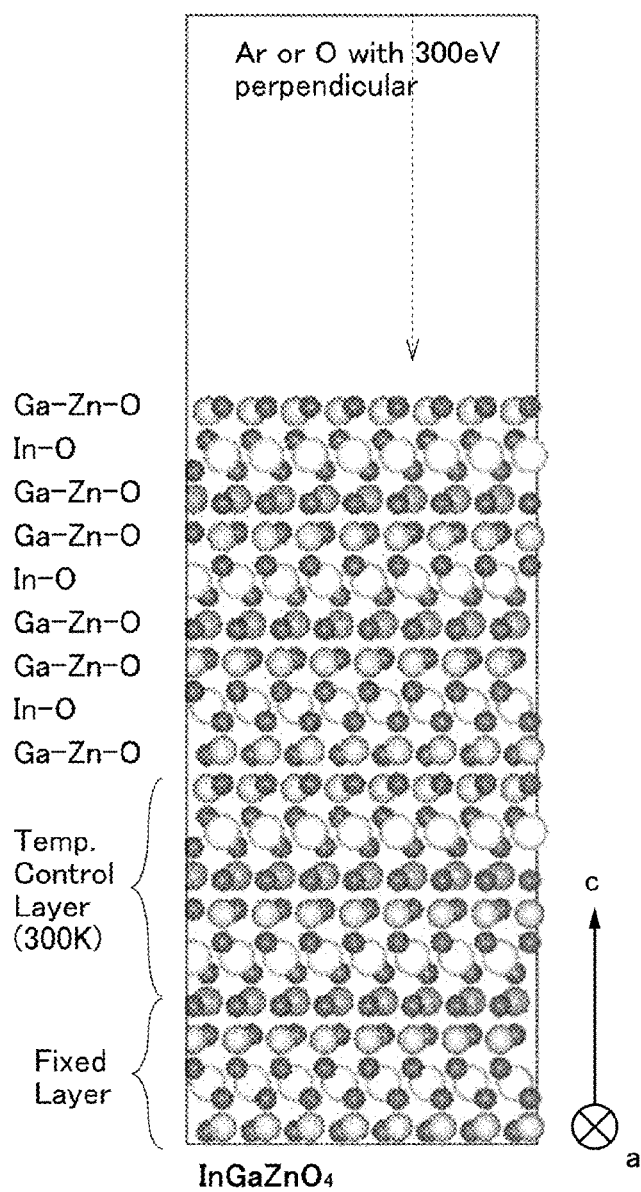
FIGS. 41A and 41B show a structure and the like of $InGaZnO_4$ before collision of atoms.
Figure 41B:
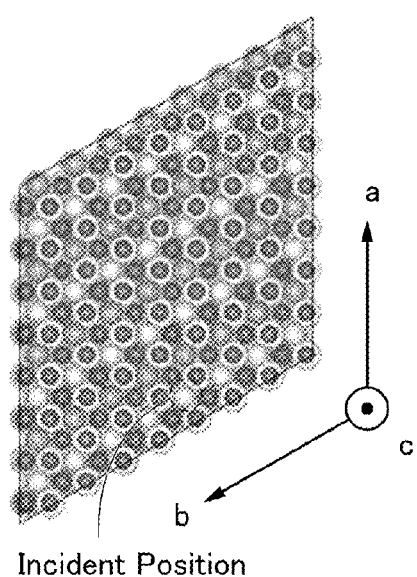

Next, classical molecular dynamics calculation is conducted to examine a cleavage plane, assuming that an InGaZnO$_4$ crystal having a homologous structure is used as a target and the target is sputtered using argon (Ar) or oxygen (O). FIG. 41A shows a cross-sectional structure of an InGaZnO$_4$ crystal (2688 atoms) used for the calculation, and FIG. 41B shows a top structure thereof. Note that a fixed layer in FIG. 41A is a layer which prevents the positions of the atoms from moving. A temperature control layer in FIG. 41A is a layer whose temperature is fixed at a constant temperature (300 K).

For the classical molecular dynamics calculation, Materials Explorer 5.0 manufactured by Fujitsu Limited. is used. Note that the initial temperature, the cell size, the time step size, and the number of steps are set to be 300 K, constant, 0.01 fs, and ten million, respectively. In calculation, an atom to which an energy of 300 eV is applied is made to collide with a cell from a direction perpendicular to the a-b plane of the InGaZnO$_4$ crystal under the above conditions.

Figure 42A:
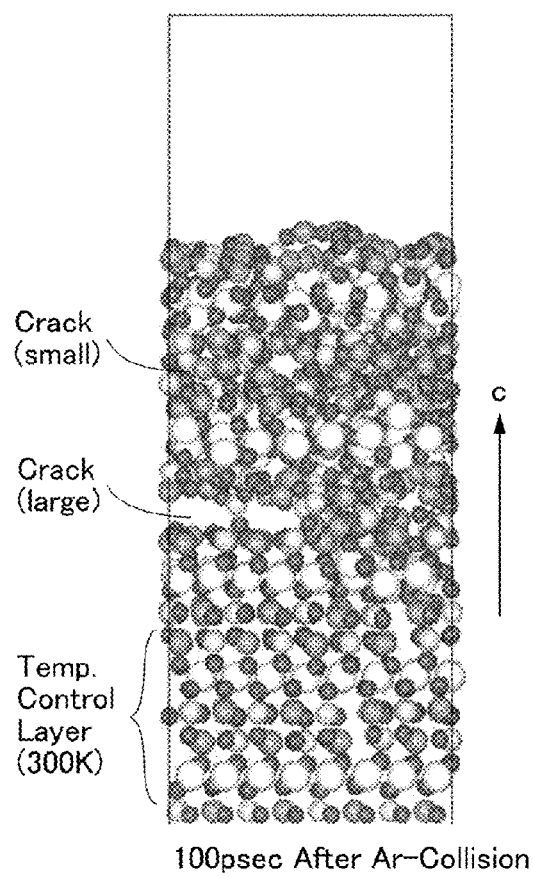
FIGS. 42A and 42B each show a structure and the like of $InGaZnO_4$ after collision of atoms.
Figure 42B:
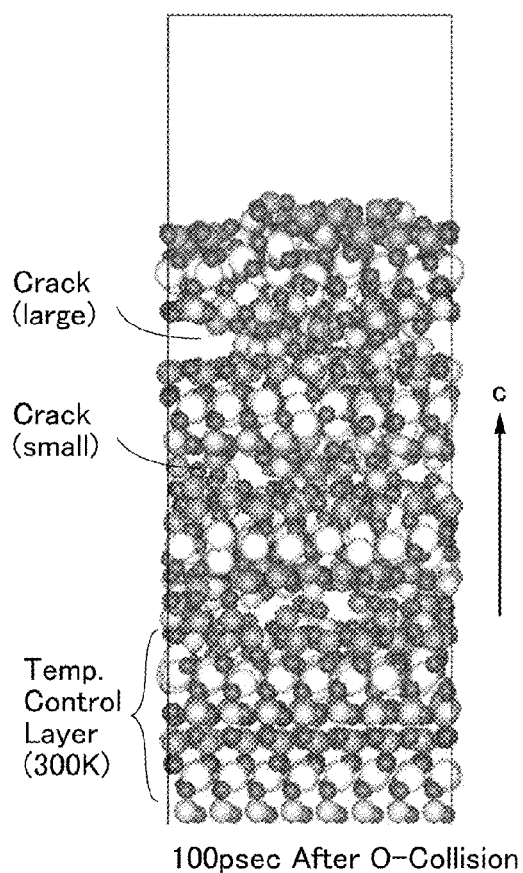

FIG. 42A shows an atomic arrangement when 100 picoseconds have passed after argon collides with the cell including the InGaZnO$_4$ crystal in FIGS. 41A and 41B. FIG. 42B shows an atomic arrangement when 100 picoseconds have passed after oxygen collides with the cell. Note that in FIGS. 42A and 42B, part of the fixed layer in FIG. 41A is omitted.

According to FIG. 42A, between the collision of argon with the cell and 100 picoseconds later, a crack is formed from the cleavage plane corresponding to the second plane shown in FIG. 40A. Thus, in the case where argon collides with the InGaZnO$_4$ crystal and the uppermost surface is the second plane (the zero-th), a large crack is found to be formed in the second plane (the second).

On the other hand, according to FIG. 42B, between the collision of oxygen with the cell and 100 picoseconds later, a crack is found to be formed from the cleavage plane corresponding to the second plane in FIG. 40A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms which are made to collide is studied.

Figure 43A:
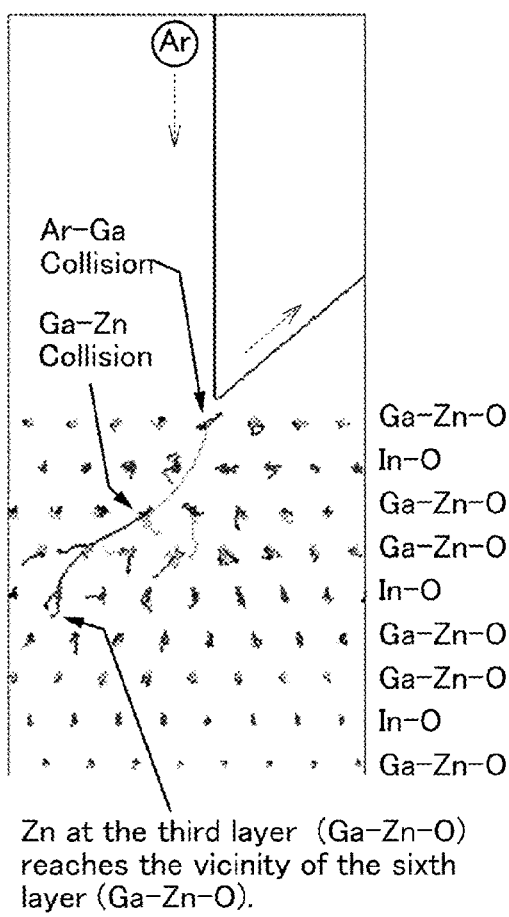
FIGS. 43A and 43B show trajectories of atoms after collision of atoms.

FIG. 43A shows trajectories of the atoms from 0 picoseconds to 0.3 picoseconds after argon collides with the cell including the InGaZnO$_4$ crystal in FIGS. 41A and 41B. Accordingly, FIG. 43A corresponds to a period from FIGS. 41A and 41B to FIG. 42A.

According to FIG. 43A, when argon collides with gallium (Ga) of the first layer (Ga—Zn—O layer), the gallium collides with zinc (Zn) of the third layer (Ga—Zn—O layer) and then, the zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 41A.

Figure 43B:
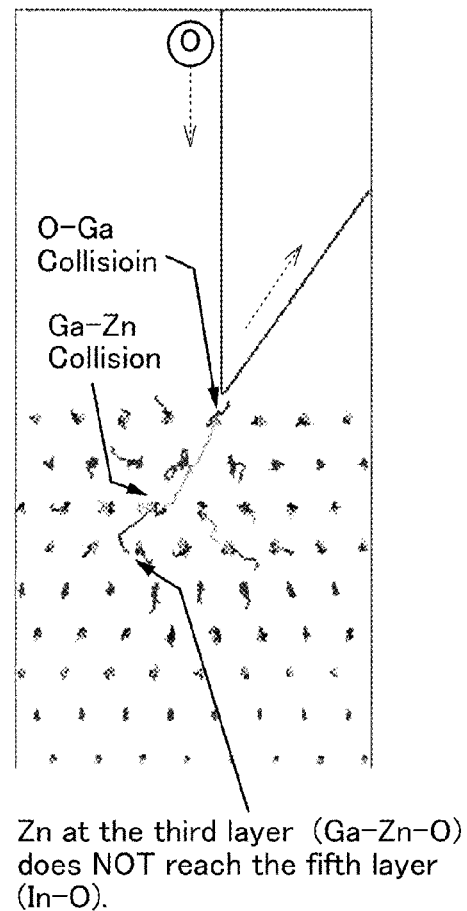

FIG. 43B shows trajectories of the atoms from 0 picoseconds to 0.3 picoseconds after oxygen collides with the cell including the InGaZnO$_4$ crystal in FIGS. 41A and 41B. Accordingly, FIG. 43B corresponds to a period from FIGS. 41A and 41B to FIG. 42A.

On the other hand, according to FIG. 43B, when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 41A.

This calculation also shows that the InGaZnO$_4$ crystal with which an atom (ion) collides is separated from the cleavage plane.

In addition, a difference in depth of a crack is examined in view of conservation laws. The conservation law of energy and the conservation law of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]
$$E = \frac{1}{2}m_A v_A^2 + \frac{1}{2}m_{Ga} v_{Ga}^2 \quad (1)$$

[Formula 2]
$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]
$$v'_A - v'_{Ga} = -(v_A - v_{Ga}) \quad (3)$$

From the formulae (1), (2), and (3), when $v_{Ga}$ is 0, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In Formula (4), mass of argon or oxygen is substituted into $m_A$, and the speeds of gallium after collision of the atoms are compared. In the case where argon and oxygen have the same energy before collision, the speed of gallium in the case where argon collides with gallium was found to be 1.24 times the speed of gallium in the case where oxygen collides with gallium. Thus, the energy of gallium in the case where argon collides with gallium is higher than that in the case where oxygen collides with gallium by the square of the speed.

The speed (energy) of gallium after collision in the case where argon collides with gallium is found to be higher than that in the case where oxygen collides with gallium. Accordingly, it is considered that a crack is formed at a deeper position in the case where argon collides with gallium than in the case where oxygen collides with gallium.

The above calculation shows that when sputtering is performed using a target including the InGaZnO$_4$ crystal having a homologous structure, separation occurs from the cleavage plane to form a pellet. In contrast, when a region of a target having no cleavage plane is sputtered, a pellet is not formed, and a sputtered particle which has an atomic-level size and is finer than a pellet is formed. Since the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 35A, for example, in which sputtered pellets are deposited to form a CAAC-OS is reasonable.

The CAAC-OS deposited in such a manner has a density substantially equal to that of a single crystal OS. For example, the density of the single crystal OS having a homologous structure of InGaZnO$_4$ is 6.36 g/cm$^3$, and the density of the CAAC-OS having substantially the same atomic ratio is approximately 6.3 g/cm$^3$.

Figure 44A:
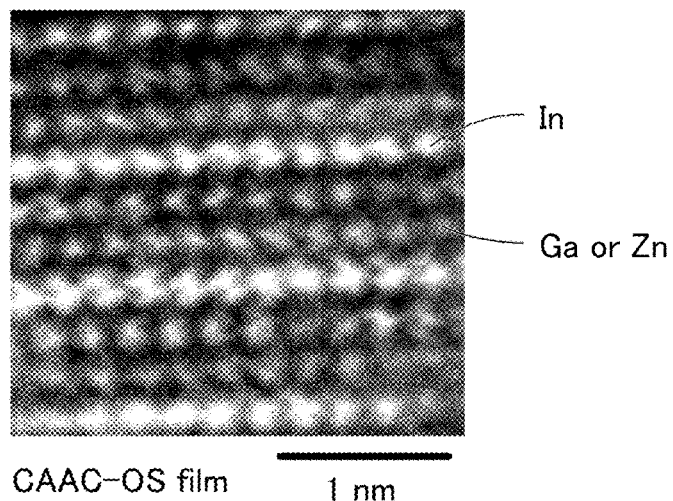
FIGS. 44A and 44B are cross-sectional HAADF-STEM images of a CAAC-OS and a target, respectively.
Figure 44B:
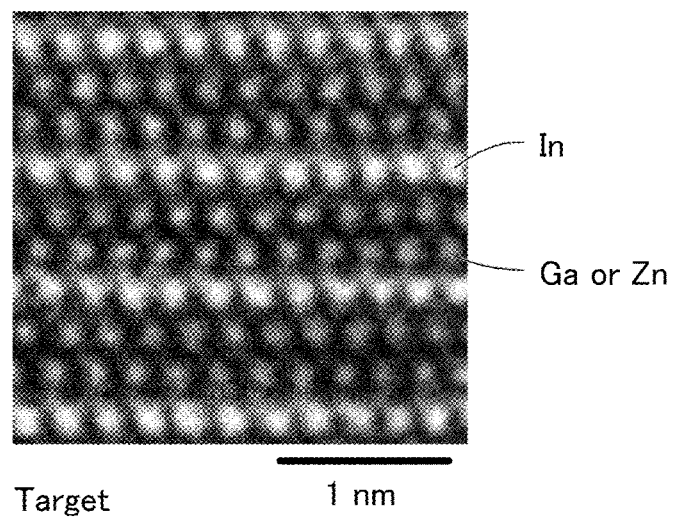

FIGS. 44A and 44B show atomic arrangements of cross sections of an In—Ga—Zn oxide (see FIG. 44A) that is a CAAC-OS deposited by a sputtering method and a target thereof (see FIG. 44B). For observation of the atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 44A and FIG. 44B are compared, it is found that the CAAC-OS and the target each have a homologous structure and arrangements of atoms in the CAAC-OS correspond to those in the target. Thus, as illustrated in the deposition model in FIG. 35A, for example, the crystal structure of the target is transferred, whereby a CAAC-OS is formed.

In this embodiment, the semiconductor layer 110a is formed over the insulating layer 109 first, and the semiconductor layer 110b is formed over the semiconductor layer 110a.

Note that the oxide semiconductor layers are preferably formed by a sputtering method. As a sputtering method, an RF sputtering method, a DC sputtering method, an AC sputtering method, or the like can be used. A DC sputtering method or an AC sputtering method can achieve uniform deposition as compared to an RF sputtering method.

In this embodiment, as the semiconductor layer 110a, a 20-nm-thick In—Ga—Zn oxide is formed by a sputtering method using an In—Ga—Zn oxide target (In:Ga:Zn=1:3:2). Note that the constituent elements and composition applicable to the semiconductor layer 110a are not limited thereto.

After the formation of the semiconductor layer 110a, oxygen doping treatment may be performed.

Next, the semiconductor layer 110b is formed over the semiconductor layer 110a. In this embodiment, as the semiconductor layer 110b, a 30-nm-thick In—Ga—Zn oxide is formed by a sputtering method using an In—Ga—Zn oxide target (In:Ga:Zn=1:1:1). Note that the constituent elements and composition applicable to the semiconductor layer 110b are not limited thereto.

After the formation of the semiconductor layer 110b, oxygen doping treatment may be performed.

Next, heat treatment may be performed to reduce impurities such as moisture and hydrogen contained in the semiconductor layer 110a and the semiconductor layer 110b and to purify the semiconductor layer 110a and the semiconductor layer 110b.

For example, the semiconductor layer 110a and the semiconductor layer 110b are subjected to heat treatment in a reduced-pressure atmosphere, an inert gas atmosphere of nitrogen, a rare gas, or the like, an oxidation atmosphere, or an ultra-dry air (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere which contains the oxidation gas at lower than 10 ppm and is filled with nitrogen or a rare gas.

By the heat treatment, in addition to the release of the impurities, diffusion of oxygen contained in the insulating layer 109 into the semiconductor layers 110a and 110b occurs to reduce oxygen vacancies in the semiconductor layers 110a and 110b. Note that the heat treatment may be performed in such a manner that heat treatment is performed in an inert gas atmosphere, and then further heat treatment is performed in an atmosphere containing an oxidation gas at 10 ppm or more, 1% or more, or 10% or more. The heat treatment may be performed at any time after the semiconductor layer 110b is formed. For example, the heat treatment may be performed after the semiconductor layer 110b is selectively etched.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is decreased.

Next, a resist mask is formed over the semiconductor layer 110b, and part of the semiconductor layer 110a and part of the semiconductor layer 110b are selectively etched using the resist mask. At this time, the insulating layer 109 might be partly etched, thereby having a projection.

The etching of the semiconductor layer 110a and the semiconductor layer 110b may be conducted by a dry etching method, a wet etching method, or both of them. After the etching, the resist mask is removed.

Further, the transistor 241 includes the electrode 244 and the electrode 245 over and partly in contact with the semiconductor layer 110b. The electrode 244 and the electrode 245 (including another electrode or wiring that is formed in the same layer as these electrodes) can be formed using a material and a method similar to those of the electrode 223.

Further, the transistor 241 includes the semiconductor layer 110c over the semiconductor layer 110b, the electrode 244, and the electrode 245. The semiconductor layer 110c is in contact with part of the semiconductor layer 110b, part of the electrode 244, and part of the electrode 245.

In this embodiment, the semiconductor layer 110c is formed by a sputtering method using an In—Ga—Zn oxide target (In:Ga:Zn=1:3:2). Note that the constituent elements and composition applicable to the semiconductor layer 110c are not limited thereto. For example, gallium oxide may be used for the semiconductor layer 110c. The semiconductor layer 110c may be subjected to oxygen doping treatment.

Further, the transistor 241 includes the insulating layer 111 over the semiconductor layer 110c. The insulating layer 111 can function as a gate insulating layer. The insulating layer 111 can be formed using a material and a method similar to those of the insulating layer 102. The insulating layer 111 may be subjected to oxygen doping treatment.

After the semiconductor layer 110c and the insulating layer 111 are formed, a mask may be formed over the insulating layer 111 and part of the semiconductor layer 110c and part of the insulating layer 111 may be selectively etched, whereby the semiconductor layer 110c having an island shape and the insulating layer 111 having an island shape are formed.

Further, the transistor 241 includes the electrode 243 over the insulating layer 111. The electrode 243 (including another electrode or wiring that is formed in the same layer as this electrode) can be formed using a material and a method similar to those of the electrode 223.

In this embodiment, an example in which the electrode 243 has a stacked-layer structure including an electrode 243a and an electrode 243b is shown. For example, the electrode 243a is formed using tantalum nitride, and the electrode 243b is formed using copper. The electrode 243a functions as a barrier layer to prevent copper diffusion. Thus, a semiconductor device with high reliability can be obtained.

Further, the transistor 241 includes an insulating layer 112 which covers the electrode 243. The insulating layer 112 can be formed using a material and a method similar to those of the insulating layer 102. The insulating layer 112 may be subjected to oxygen doping treatment. A surface of the insulating layer 112 may be subjected to CMP treatment. By the CMP treatment, unevenness of the surface can be reduced, and coverage with an insulating layer or a conductive layer formed later can be increased.

Further, an insulating layer 113 is provided over the insulating layer 112. The insulating layer 113 can be formed using a material and a method similar to those of the insulating layer 105. A surface of the insulating layer 113 may be subjected to CMP treatment. By the CMP treatment, unevenness of the surface can be reduced, and coverage with an insulating layer or a conductive layer formed later can be increased. Further, openings are formed in part of the insulating layer 113 and part of the insulating layer 112. Contact plugs 114 are formed in the openings.

Further, a wiring 261, the wiring 262, the wiring 264, the wiring 265, and the wiring 267 (including another electrode or wiring that is formed in the same layer as these wirings) are formed over the insulating layer 113. In FIG. 5, the wiring 265 is electrically connected to the electrode 244 through the contact plug 114 in the opening. The wiring 267 is electrically connected to the electrode 249 through the contact plug 114 in the opening.

Further, the imaging device 100 includes an insulating layer 115 which covers the wiring 261, the wiring 262, the wiring 264, the wiring 265, and the wiring 267. The insulating layer 115 can be formed using a material and a method similar to those of the insulating layer 105. A surface of the insulating layer 115 may be subjected to CMP treatment. By the CMP treatment, unevenness of the surface can be reduced, and coverage with an insulating layer or a conductive layer formed later can be increased. Further, an opening is formed in part of the insulating layer 115. A contact plug is formed in the opening.

Although not illustrated in FIG. 5, the wiring 261, the wiring 262, and the wiring 264 are also each electrically connected to a wiring or an electrode in the lower layer through a contact plug in an opening formed in an insulating layer.

Further, the wiring 263 and the wiring 266 (including another electrode or wiring that is formed in the same layer as these wirings) are formed over the insulating layer 115 (not illustrated in FIG. 5). The wiring 263 and the wiring 266 (including another electrode or wiring that is formed in the same layer as these wirings) can each be electrically connected to a wiring or an electrode in a different layer through a contact plug in an opening formed in an insulating layer.

Further, an insulating layer 116 is provided to cover the wiring 263 and the wiring 266. The insulating layer 116 can be formed using a material and a method similar to those of the insulating layer 105. A surface of the insulating layer 116 may be subjected to CMP treatment.

[Connection Between Light-Receiving Element 220 and Pixel Circuit 230]

As described above, in the imaging device 100 of one embodiment of the present invention, the pixel circuit 230 is formed so as to overlap with the light-receiving element 220. By providing the pixel circuit 230 over the light-receiving element 220, the area occupied by the light-receiving element 220 in a plan view can be increased. Accordingly, the light sensitivity of the imaging device 100 can be improved. Moreover, it is possible to provide the imaging device 100 whose light sensitivity is less likely to decrease even when the resolution is increased.

The electrode 234 included in the pixel circuit 230 is connected to the electrode 223 included in the light-receiving element 220 through an opening 251. The electrode 227 included in the light-receiving element 220 is connected to the wiring 261 through an opening 253.

[Peripheral Circuit]

FIG. 5 illustrates the transistor 281 and a transistor 282 as examples of transistors included in a peripheral circuit. In this embodiment, the case where the transistor 281 is a p-channel transistor is described as an example. FIG. 6B is an enlarged view of the transistor 281 in FIG. 5.

The transistor 281 includes an i-type semiconductor layer 283 in which a channel is formed, p-type semiconductor layers 285, an insulating layer 286, an electrode 287, and sidewalls 288. Further, in regions of the i-type semiconductor layer 283, which overlap with the sidewalls 288, low-concentration impurity regions 284 are provided.

The i-type semiconductor layer 283 of the transistor 281 can be formed at the same time through the same process as the i-type semiconductor layer 224 of the light-receiving element 220. The p-type semiconductor layers 285 of the transistor 281 can be formed at the same time through the same process as the p-type semiconductor layer 221 of the light-receiving element 220.

The insulating layer 286 can function as a gate insulating layer. The electrode 287 can function as a gate electrode. The low-concentration impurity regions 284 can be formed in such a manner that, after formation of the electrode 287 and before formation of the sidewalls 288, an impurity element is introduced using the electrode 287 as a mask. In other words, the low-concentration impurity regions 284 can be formed in a self-aligned manner. The low-concentration impurity regions 284 have the same conductivity type as the p-type semiconductor layers 285 and contain an impurity imparting the conductivity type at a lower concentration than the p-type semiconductor layers 285.

The transistor 282 can be formed at the same time through the same process as the transistor 241. Further, a CMOS circuit can be formed by combining the transistor 281 and the transistor 282. When the peripheral circuit is formed using a CMOS circuit, an imaging device with low power consumption can be provided.

Furthermore, an n-channel transistor used for the peripheral circuit is formed at the same time as a transistor in the pixel circuit 230, whereby the number of steps of manufacturing the imaging device 100 can be reduced. Accordingly, an imaging device can be manufactured at a lower cost.

[Example of Circuit Configuration]

Figure 8A:
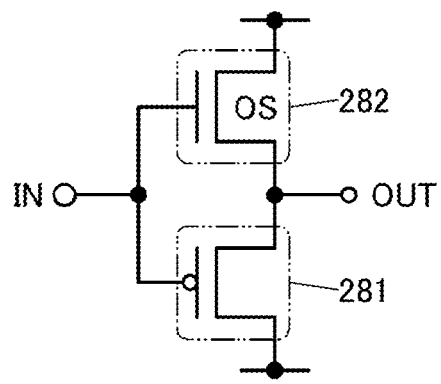
FIGS. 8A to 8D each illustrate an example of a circuit configuration.
Figure 8B:
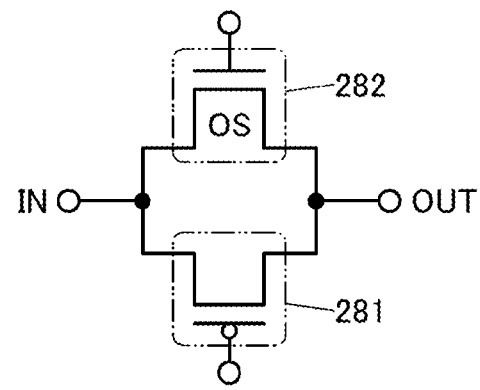
Figure 8C:
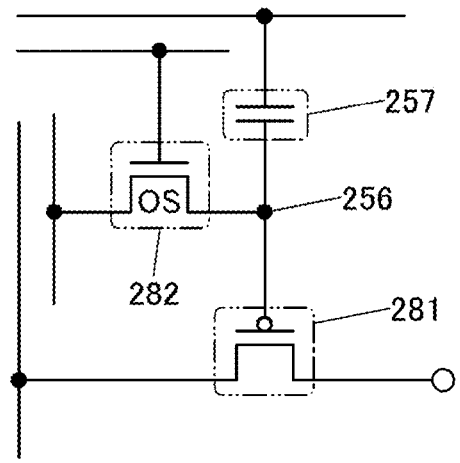
Figure 8D:
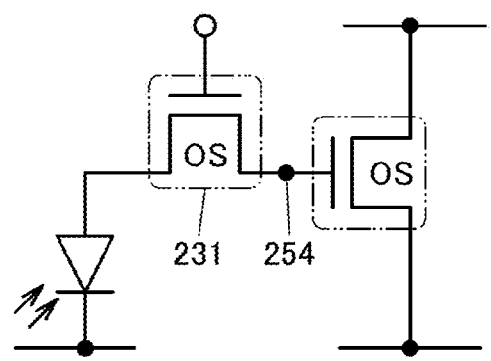

FIGS. 8A to 8C illustrate examples of a CMOS circuit and the like that can be used for the peripheral circuit. FIG. 8D illustrates an example of a circuit configuration that can be used for the pixel 210. In the circuit diagrams in FIGS. 8A to 8D, "OS" is written in a circuit symbol of a transistor including oxide semiconductor in order to clearly demonstrate that the transistor includes an oxide semiconductor.

A CMOS circuit in FIG. 8A is a configuration example of a so-called inverter in which a p-channel transistor and an n-channel transistor are connected in series and in which gates of them are connected to each other.

A CMOS circuit in FIG. 8B is a configuration example of a so-called analog switch in which a p-channel transistor and an n-channel transistor are connected in parallel.

A circuit in FIG. 8C is a configuration example of a so-called memory element in which one of a source and a drain of an n-channel transistor is connected to a gate of a p-channel transistor and one electrode of a capacitor 257. In the circuit in FIG. 8C, electric charges input from the other of the source and the drain of the n-channel transistor can be retained in a node 256. The transistor 281 may also be a transistor including an oxide semiconductor in a semiconductor layer in which a channel is formed. The memory element can be provided in the pixel 210.

A circuit in FIG. 8D is a configuration example of a photosensor. Since a transistor including an oxide semiconductor in a semiconductor layer in which a channel is formed can have an extremely low off-state current, the potential of a node 254, which is determined in accordance with the amount of received light, is less likely to vary. Thus, an imaging device which is less likely to be affected by noise can be provided. Further, an imaging device with high linearity can be provided.

Figure 9A:
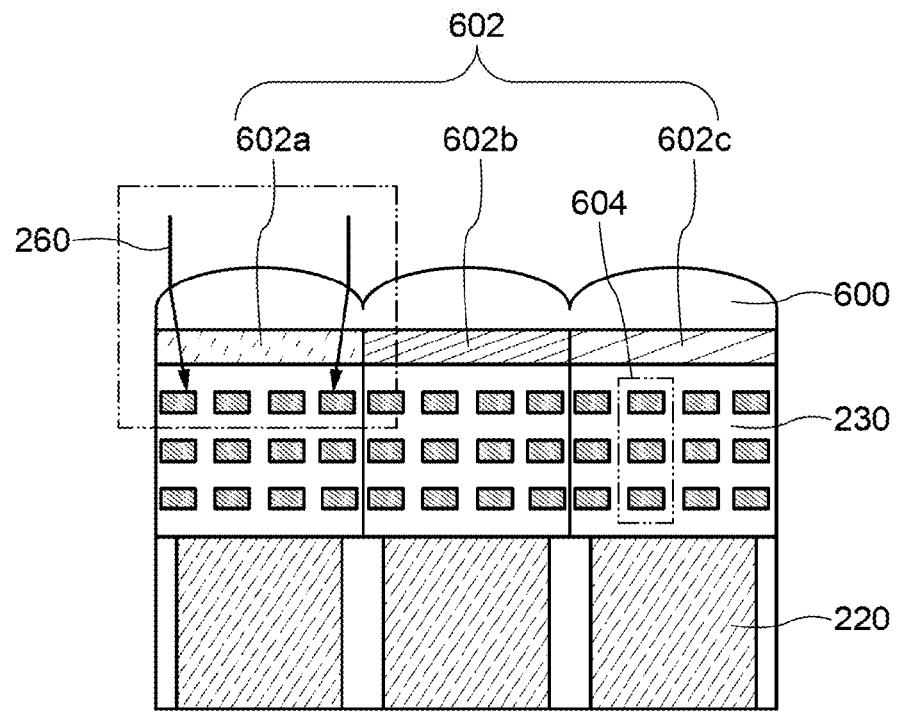
FIGS. 9A and 9B are each a cross-sectional view illustrating a structure of a pixel of an imaging device.
Figure 9B:
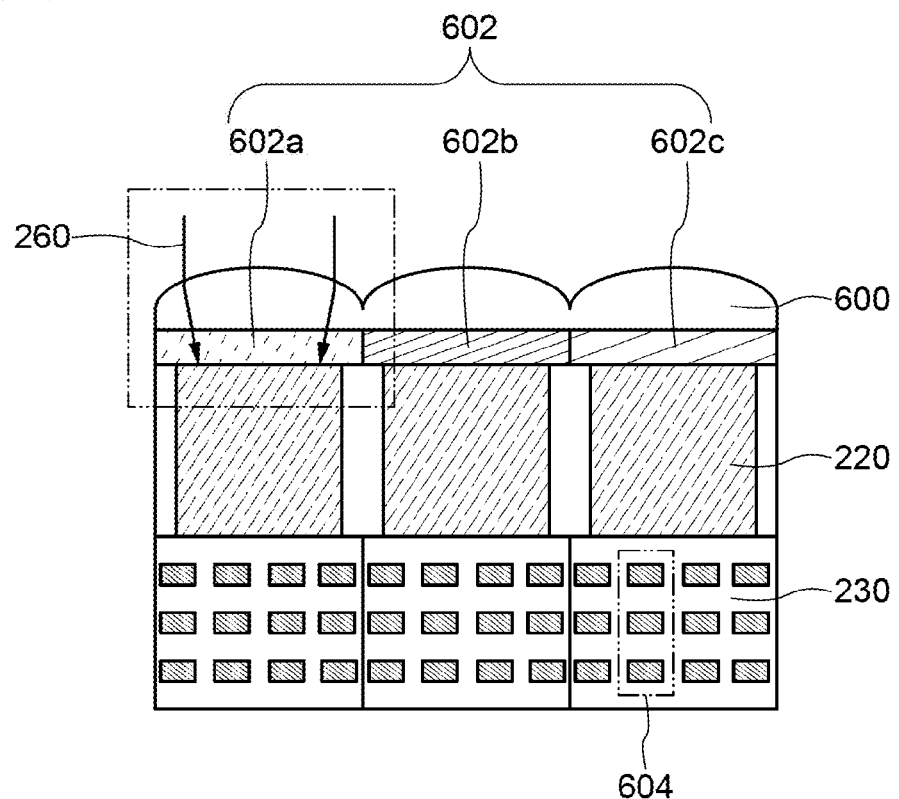

Note that a pixel can have a structure illustrated in the cross-sectional view in FIG. 9A, in which the light 260 enters the light-receiving element 220 through a lens 600 and a filter 602 (a filter 602*a*, a filter 602*b*, or a filter 602*c*) which are formed over the pixel circuit 230, through the pixel circuit 230, and the like. As indicated by a region surrounded with dashed-two dotted lines, however, part of the light 260 indicated by arrows might be blocked by some wiring layers 604. Therefore, in a preferred structure, as illustrated in FIG. 9B, the lens 600 and the filter 602 are formed on the light-receiving element 220 side, whereby the light-receiving element 220 receives the incident light efficiently. By making the light 260 enter the light-receiving element 220 from the light-receiving element 220 side, the imaging device 100 with high detection sensitivity can be provided.

When a color filter is used as the filter 602, a wavelength band of light to be received by a pixel 210 can be different from that by another. For example, with the use of the light-receiving element 220 that overlaps with the filter 602*a* which transmits light in a red wavelength band, the light-receiving element 220 that overlaps with the filter 602*b* which transmits light in a green wavelength band, and the light-receiving element 220 that overlaps with the filter 602*c* which transmits light in a blue wavelength band, data for displaying a full-color image can be acquired. In this case, the ratio of the number of pixels for detecting red to that for detecting green and that for detecting blue (or the ratio of light-receiving areas) need not necessarily be 1:1:1. For example, it is possible to employ the Bayer arrangement, in which the ratio of the number of pixels (the ratio of light-receiving areas) is set to red:green:blue=1:2:1. Alternatively, the ratio of the number of pixels (or the ratio of light-receiving areas) may be red:green:blue=1:6:1. In addition, the combination of colors used for the color filter is not limited to red, green, and blue. For example, yellow, cyan, and magenta may also be used. Further, the number of colors used for the color filter is not limited to three, and two or less or four or more colors may be used. By increasing the kinds of color filters used for one pixel 210, the color reproducibility of an obtained image can be improved.

Furthermore, when a neutral density (ND) filter (dark filter) is used as the filter 602, output saturation of the pixel 210, which occurs when a large amount of light is incident on the light-receiving element 220, can be prevented. By using a combination of ND filters which are different in the degree of light reduction, the dynamic range of the imaging device can be expanded.

Furthermore, when an infrared (IR) filter (infrared light filter) is used as the filter 602, the imaging device 100 can detect infrared light.

This embodiment can be implemented in an appropriate combination with any of the structures described in the other embodiments.

(Embodiment 2)

In this embodiment, an example of a circuit configuration that can be used for the pixel 210 and the operation of the imaging device 100 are described.

Example 1 of Circuit Configuration

Figure 10A:
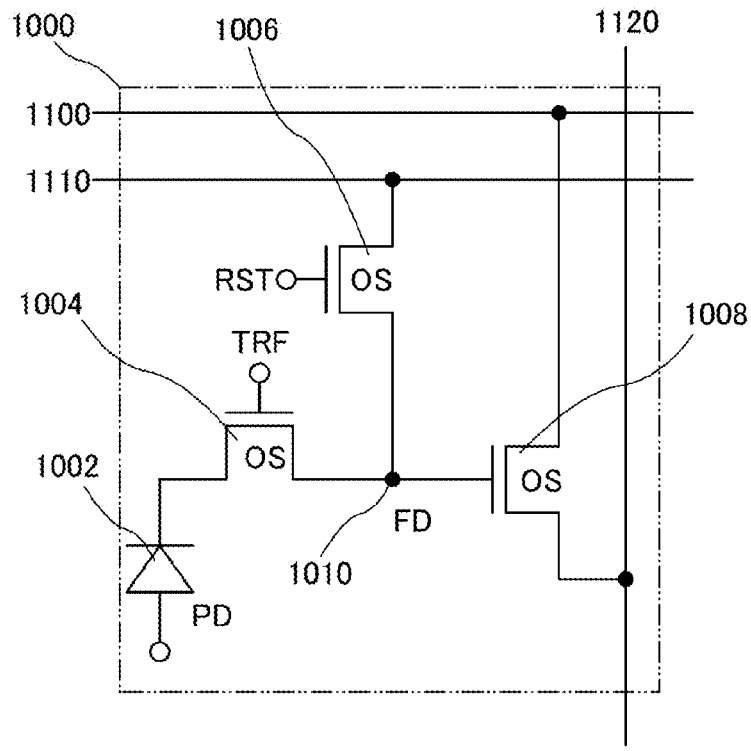
FIGS. 10A and 10B each illustrate a configuration of a pixel of an image sensor.

FIG. 10A illustrates an example of a circuit configuration that can be used for the pixel 210. A circuit 1000 in FIG. 10A includes a photodiode 1002 which is a photoelectric conversion element, a transfer transistor 1004, a reset transistor 1006, an amplifier transistor 1008, a wiring 1100, a wiring 1110, and a wiring 1120. A pixel array can be formed by arranging a plurality of circuits 1000 in a matrix.

The photodiode 1002 corresponds to the light-receiving element 220 described in the above embodiment, for example. The transfer transistor 1004 corresponds to the transistor 231, for example. The reset transistor 1006 corresponds to the transistor 236, for example. The amplifier transistor 1008 corresponds to the transistor 241, for example.

In the circuit 1000, the photodiode 1002 is electrically connected to one of a source and a drain of the transfer transistor 1004, and the other of the source and the drain of the transfer transistor 1004 is electrically connected to a signal charge storage portion 1010 (also referred to as floating diffusion (FD)). One of a source and a drain of the reset transistor 1006 and a gate of the amplifier transistor 1008 are electrically connected to the signal charge storage portion 1010. The other of the source and the drain of the reset transistor 1006 is electrically connected to the wiring 1110. One of a source and a drain of the amplifier transistor 1008 is electrically connected to the wiring 1120, and the other of the source and the drain of the amplifier transistor 1008 is electrically connected to the wiring 1100.

The wiring 1100 is supplied with VDD, for example. The wiring 1110 is supplied with a reset potential, for example. Note that, as another structure, the wiring 1110 can be eliminated. For example, the other of the source and the drain of the reset transistor 1006 may be connected not to the wiring 1110 but to the wiring 1100 or the wiring 1120.

Figure 11:
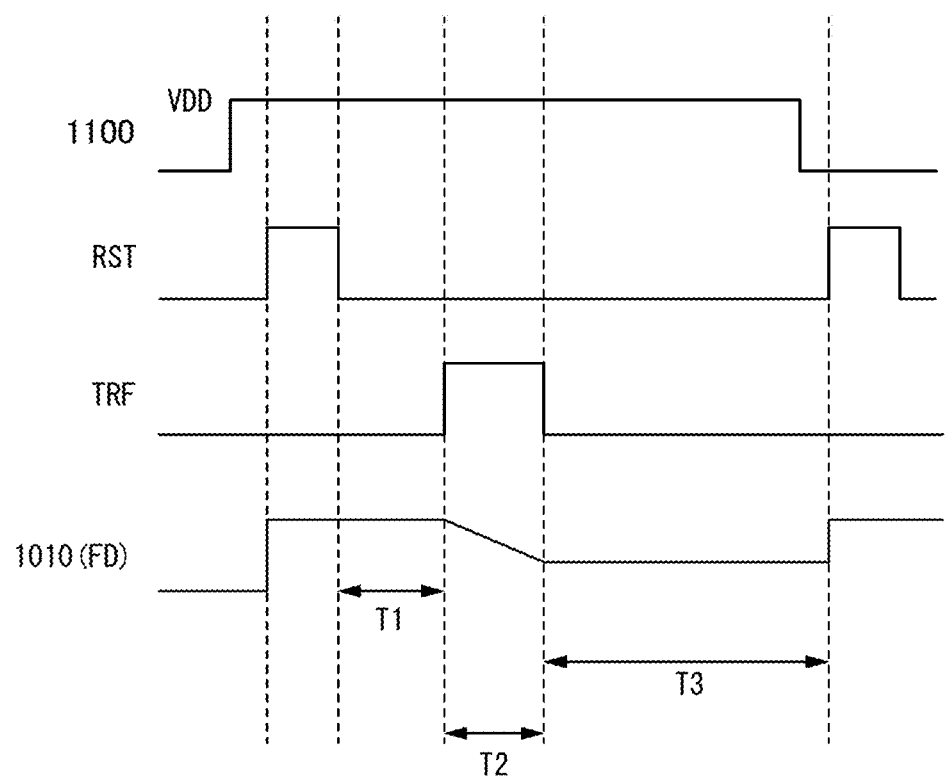
FIG. 11 illustrates the operation of a pixel of an image sensor.

Next, the operation is described with reference to a timing chart in FIG. 11. First, VDD is supplied to the wiring 1100. Then, a reset signal (RST) is supplied to a gate of the reset transistor 1006, so that the reset transistor 1006 is turned on. The signal charge storage portion 1010 is charged with a reset potential (e.g., VDD). Subsequently, the supply of RST is stopped, so that the reset transistor 1006 is turned off and the reset potential is held in the signal charge storage portion 1010 (Period T1). Here, when almost no leakage current flows through the reset transistor 1006 and the transfer transistor 1004, the potential is held until the next operation of the transistor starts.

Next, a transfer signal (TRF) is supplied to a gate of the transfer transistor 1004, so that the transfer transistor 1004 turned on and a current corresponding to the intensity of light received by the photodiode 1002 flows through the photodiode 1002 and the transfer transistor 1004. That is, the potential of the signal charge storage portion 1010 is changed in accordance with the amount of received light (Period T2). When the supply of TRF is stopped to turn off the transfer transistor 1004, the potential at the time when the transfer transistor 1004 is turned off is held in the signal charge storage portion 1010 (Period T3). When almost no leakage current flows through the reset transistor 1006 and the transfer transistor 1004, the potential is held until the next operation of the transistor starts.

Then, a potential corresponding to the potential held in the signal charge storage portion 1010 is output to the wiring 1120 through the amplifier transistor 1008. By measuring the potential of the wiring 1120, the amount of light received by the photodiode 1002 can be determined. After that, the supply of VDD to the wiring 1100 is stopped.

The use of transistors whose off-state current is extremely low as the reset transistor 1006 and the transfer transistor 1004 enables almost no leakage current to flow from the signal charge storage portion 1010 through the transistors; thus, a potential can be held highly effectively in the holding periods T1 and T3.

In the case where the amount of light incident on the photodiode is small, a long period is required for one imaging. When transistors whose off-state current is extremely low are used as the reset transistor 1006 and the transfer transistor 1004, the amount of electric charge in the signal charge storage portion 1010 is less likely to change even in a long imaging period. In other words, even in the case where the imaging device is operated at a low speed, the amount of electric charge in the signal charge storage portion 1010 does not change too much, and a favorable image can be obtained.

Figure 10B:
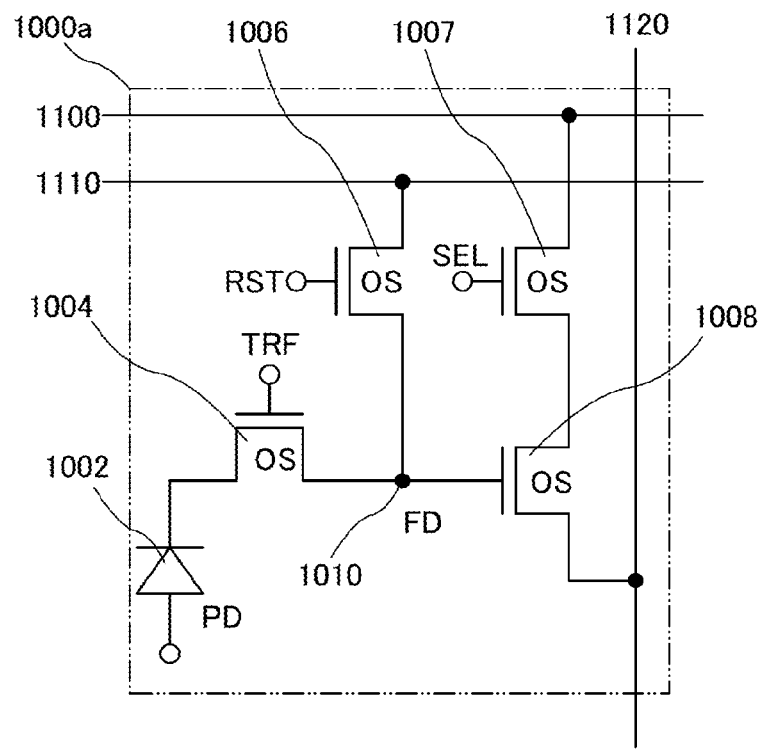

As in a circuit 1000a illustrated in FIG. 10B, a selection transistor 1007 may be provided between the other of the source and the drain of the amplifier transistor 1008 and the wiring 1100 in the circuit 1000. The selection transistor 1007 corresponds to the transistor 246, for example. When a selection signal (SEL) is supplied to a gate of the selection transistor 1007, the selection transistor 1007 is turned on. By measuring the potential output to the wiring 1120 while the selection transistor 1007 is on, the amount of light received by the photodiode 1002 can be determined.

[Operation Example of Photodiode]

Figure 12:
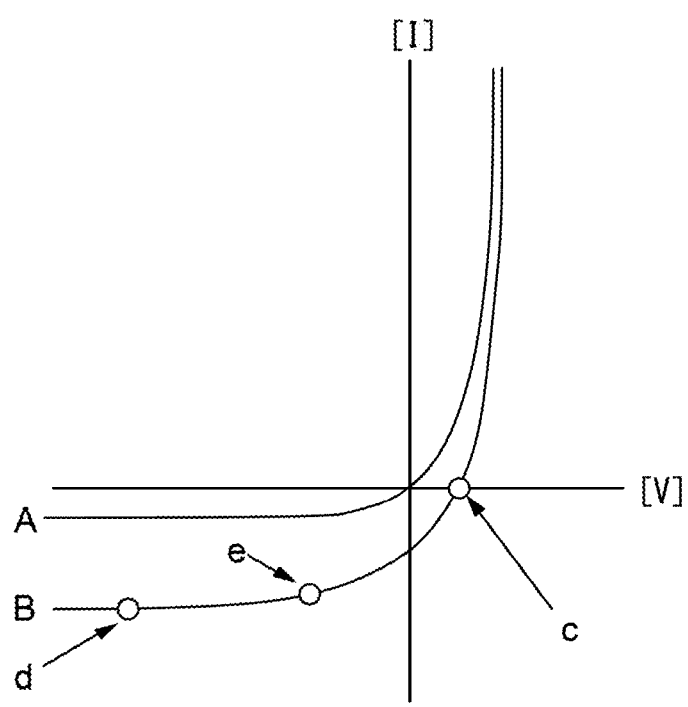
FIG. 12 illustrates the operation of a photodiode.

Next, the operation of the photodiode 1002 is described with reference to FIG. 12. Without light irradiation, the photodiode shows the same voltage-current characteristics as a general diode (Curve A in FIG. 12). Under light irradiation, especially in a reverse bias state, a high current flows as compared to the case without light irradiation (Curve B in FIG. 12). The transition of an operating point of the photodiode is described with reference to the operation of the pixel in FIG. 10A. When the transfer transistor 1004 is off, there is no current path to the photodiode 1002; thus, under light irradiation, the potential of a cathode (or an anode) of the photodiode is positioned at Point c in FIG. 12. After the reset transistor 1006 is turned on and a reset power supply potential is held in the signal charge storage portion 1010, the transfer transistor 1004 is turned on, whereby the potential of the cathode (or the anode) of the photodiode 1002 becomes the reset power supply potential. The operating point transfers to Point d in FIG. 12. Then, a discharge current flows from the signal charge storage portion 1010 through the transfer transistor 1004 to the photodiode 1002, so that the potential of the signal charge storage portion 1010 is lowered. Assuming that the potential at which the discharge is stopped by turning off the transfer transistor 1004 is positioned at Point e in FIG. 12, a potential difference between d and e corresponds to a potential difference of a signal obtained by the discharge of the photodiode 1002.

Figure 13:
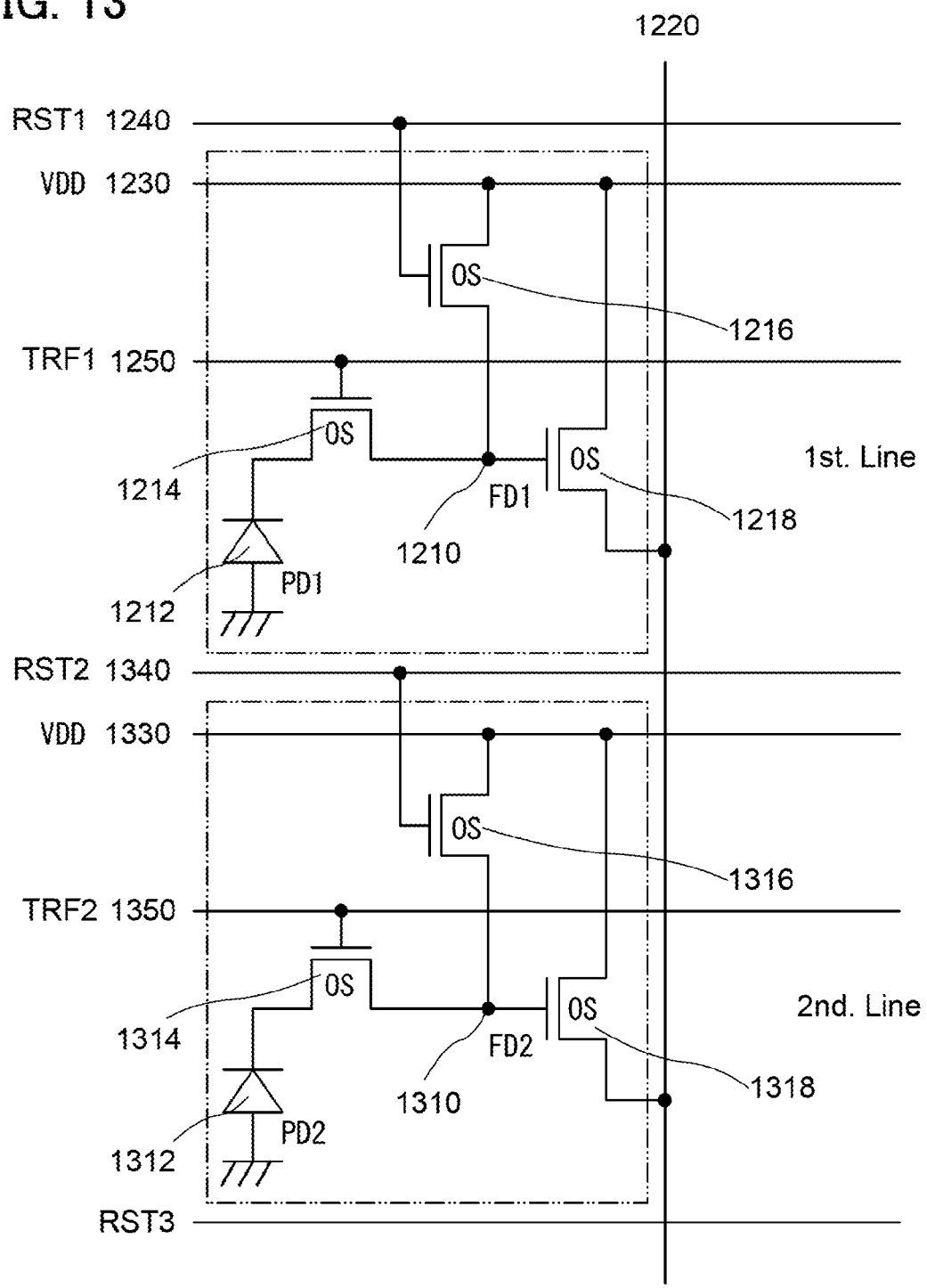
FIG. 13 illustrates a configuration of pixels of an imaging device.

Next, the operation in the case where a reset transistor, an amplifier transistor, and wirings are shared by a plurality of pixels is described. FIG. 13 illustrates a basic configuration in which one reset transistor, one transfer transistor, one amplifier transistor, and one photodiode are provided in each pixel and a reset line, a transfer switch line, and a wiring are connected to the pixel.

Figure 14:
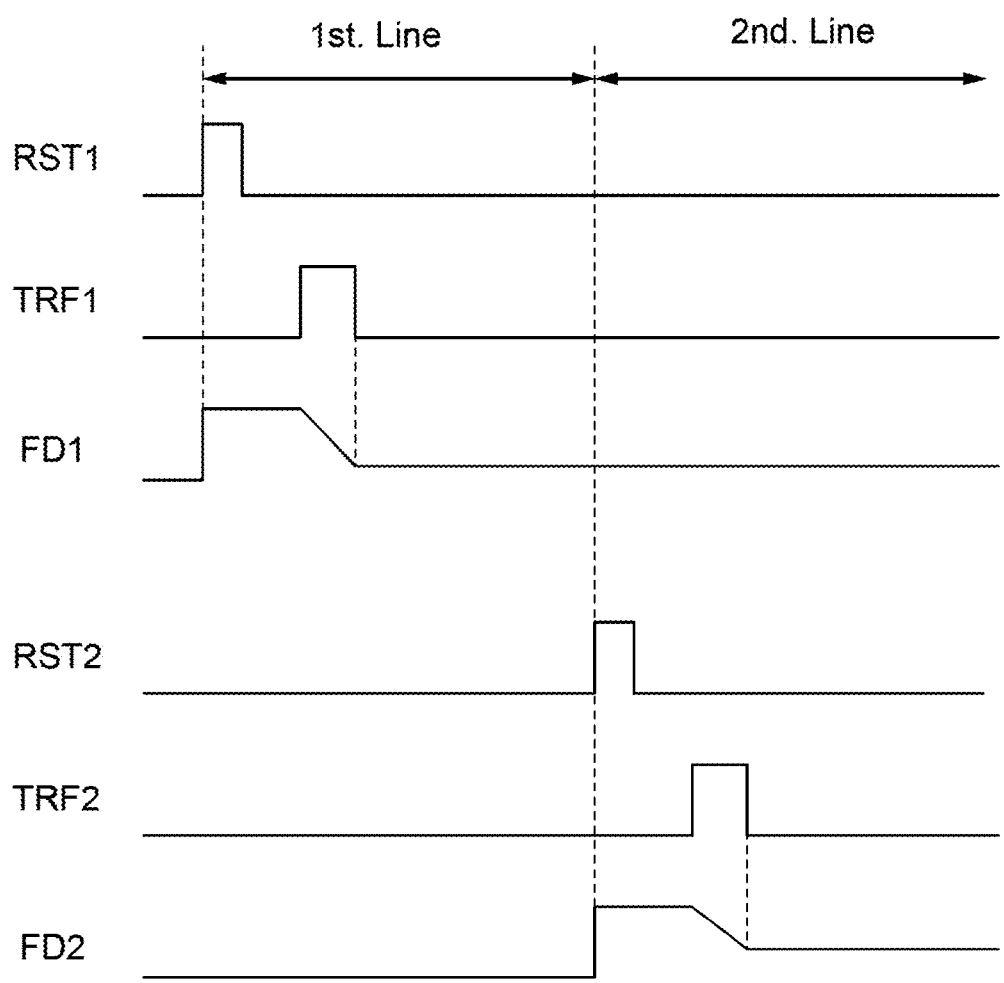
FIG. 14 illustrates the operation of pixels of an imaging device.

The operation in the basic configuration is described with reference to a timing chart in FIG. 14. A wiring 1230 and a wiring 1330 are supplied with VDD. The driving in a first line is performed as follows. First, a first reset signal (RST1) is supplied to a first reset line 1240, so that a first reset transistor 1216 is turned on and the potential of a first signal charge storage portion 1210 (FD1) becomes VDD. After that, the supply of RST1 is stopped, so that the first reset transistor 1216 is turned off and the potential of the first signal charge storage portion 1210 is held at VDD. At this time, the potential of FD1 is held at VDD, unless another current path exists. Next, a first transfer signal (TRF1) is supplied to a first transfer switch line 1250 to turn on a first transfer transistor 1214. When a first photodiode 1212 (PD1) is irradiated with light, a current corresponding to the intensity of received light flows through the first photodiode 1212 and the first transfer transistor 1214, so that the potential of FD1 is lowered. Subsequently, the supply of TRF1 is stopped, so that the first transfer transistor 1214 is turned off and the potential of FD1 at this time is held. Then, a potential corresponding to the potential held in FD1 is output to a wiring 1220 through a first amplifier transistor 1218. By measuring the potential of the wiring 1220, the amount of light received by PD1 can be determined.

Then, the driving in a second line is performed. First, a second reset signal (RST2) is supplied to a second reset line 1340, so that a second reset transistor 1316 is turned on and the potential of the second signal charge storage portion 1310 (FD2) becomes VDD. After that, the supply of RST2 is stopped, so that the second reset transistor 1316 is turned off and the potential of FD2 is held at VDD. Next, a second transfer signal (TRF2) is supplied to a second transfer switch line 1350 to turn on a second transfer transistor 1314. When a second photodiode 1312 (PD2) is irradiated with light, a current corresponding to the amount of received light flows through the second photodiode 1312 and the second transfer transistor 1314, so that the potential of FD2 is lowered. Subsequently, the supply of TRF2 is stopped, so that the second transfer transistor 1314 is turned off and the potential of FD2 at this time is held. Then, a potential corresponding to the potential held in FD2 is output to the wiring 1220 through a second amplifier transistor 1318. By measuring the potential of the wiring 1220, the amount of light received by PD2 can be determined. In this manner, sequential driving can be performed.

Example 2 of Circuit Configuration

Figure 15:
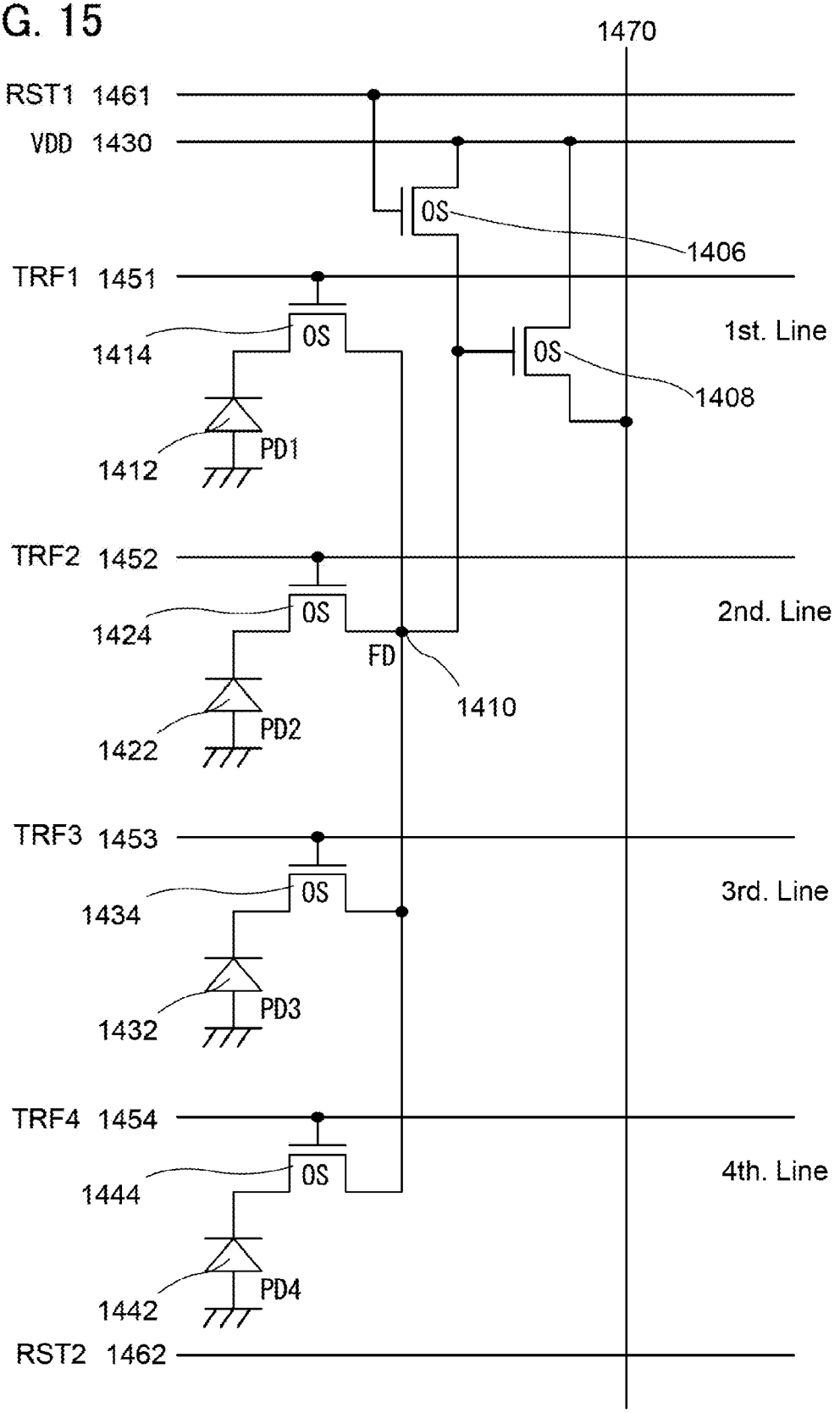
FIG. 15 illustrates a configuration of pixels of an imaging device.

FIG. 15 illustrates a configuration which is different from the above circuit configuration and in which a reset transistor, an amplifier transistor, and a reset line are shared by vertically adjacent four pixels. When the number of transistors and the number of wirings are reduced, the pixel area can be reduced, which leads to miniaturization, and the light-receiving area of a photodiode can be increased, which leads to noise reduction. Drains of transfer transistors in the vertically adjacent four pixels are electrically connected to each other, so that a signal charge storage portion 1410 is formed. A source of a reset transistor 1406 and a gate of an amplifier transistor 1408 are connected to the signal charge storage portion 1410.

Figure 16:
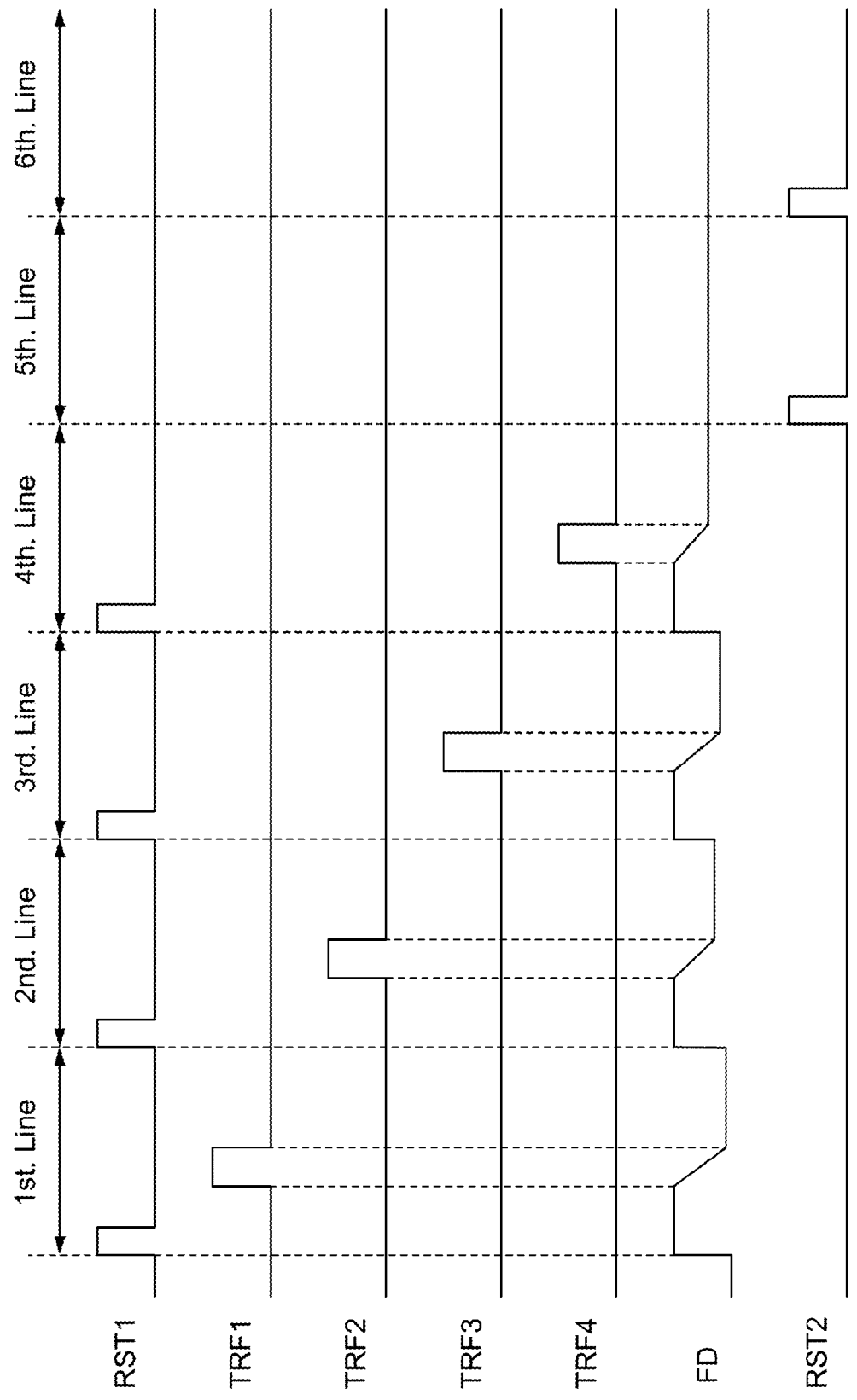
FIG. 16 illustrates the operation of pixels of an imaging device.

The operation in the configuration in which components are shared by vertically adjacent four pixels is described with reference to a timing chart in FIG. 16. First, VDD is supplied to a wiring 1430. The driving in a first line is performed as follows. First, RST1 is supplied to a first reset line 1461 to turn on the first reset transistor 1406. As a result, the potential of the signal charge storage portion 1410 (FD) becomes VDD. When the supply of RST1 is stopped, the first reset transistor 1406 is turned off and the potential of FD is held at VDD. Next, a first transfer signal (TRF1) is supplied to a first transfer switch line 1451, so that a first transfer transistor 1414 is turned on. At this time, when a first photodiode 1412 (PD1) is irradiated with light, a current corresponding to the intensity of received light flows through PD1 and the first transfer transistor 1414, so that the potential of the signal charge storage portion 1410 is lowered. When the supply of TRF1 is stopped, the first transfer transistor 1414 is turned off and the potential at this time is held in FD. A potential corresponding to this potential is output to a wiring 1470 through the first amplifier transistor 1408. By measuring the potential of the wiring 1470, the amount of light received by PD1 can be determined.

The driving in a second line is performed as follows. RST1 is supplied to the first reset line 1461 again to turn on the first reset transistor 1406. As a result, the potential of FD becomes VDD. When the supply of RST1 is stopped, the first reset transistor 1406 is turned off and the potential of the signal charge storage portion 1410 is held at VDD. Next, a second transfer signal (TRF2) is supplied to a second transfer switch line 1452, so that a second transfer transistor 1424 is turned on. At this time, when a second photodiode 1422 (PD2) is irradiated with light, a current corresponding to the intensity of received light flows through PD2 and the second transfer transistor 1424, so that the potential of FD is lowered. When the supply of TRF2 is stopped, the second transfer transistor 1424 is turned off and the potential at this time is held in FD. A potential corresponding to this potential is output to the wiring 1470 through the first amplifier transistor 1408. By measuring the potential of the wiring 1470, the amount of light received by PD2 can be determined.

The driving in a third line is performed as follows. RST1 is supplied to the first reset line 1461 again to turn on the first reset transistor 1406. Accordingly, the potential of FD becomes VDD. When the supply of RST1 is stopped, the first reset transistor 1406 is turned off and the potential of FD is held at VDD. Next, a third transfer signal (TRF3) is supplied to a third transfer switch line 1453, so that a third transfer transistor 1434 is turned on. At this time, when a third photodiode 1432 (PD3) is irradiated with light, a current corresponding to the intensity of received light flows through the third photodiode 1432 and the third transfer transistor 1434, so that the potential of FD is lowered. When the supply of TRF3 is stopped, the third transfer transistor 1434 is turned off and the potential at this time is held in FD. A potential corresponding to this potential is output to the wiring 1470 through the first amplifier transistor 1408. By measuring the potential of the wiring 1470, the amount of light received by PD3 can be determined.

The driving in a fourth line is performed as follows. RST1 is supplied to the first reset line 1461 again to turn on the first reset transistor 1406. Accordingly, the potential of FD becomes VDD. When the supply of RST1 is stopped, the first reset transistor 1406 is turned off and the potential of FD is held at VDD. Next, a fourth transfer signal (TRF4) is supplied to a fourth transfer switch line 1454, so that a fourth transfer transistor 1444 is turned on. At this time, when a fourth photodiode 1442 (PD4) is irradiated with light, a current corresponding to the intensity of received light flows through the fourth photodiode 1442 and the fourth transfer transistor 1444, so that the potential of FD is lowered. When the supply of TRF4 is stopped, the fourth transfer transistor 1444 is turned off and the potential at this time is held in FD. A potential corresponding to this potential is output to the wiring 1470 through the first amplifier transistor 1408. By measuring the potential of the wiring 1470, the amount of light received by PD4 can be determined.

As the driving in fifth to eighth lines, RST2 is supplied to a second reset line 1462 and sequential driving is performed as in the first to fourth lines.

Example 3 of Circuit Configuration

Figure 17:
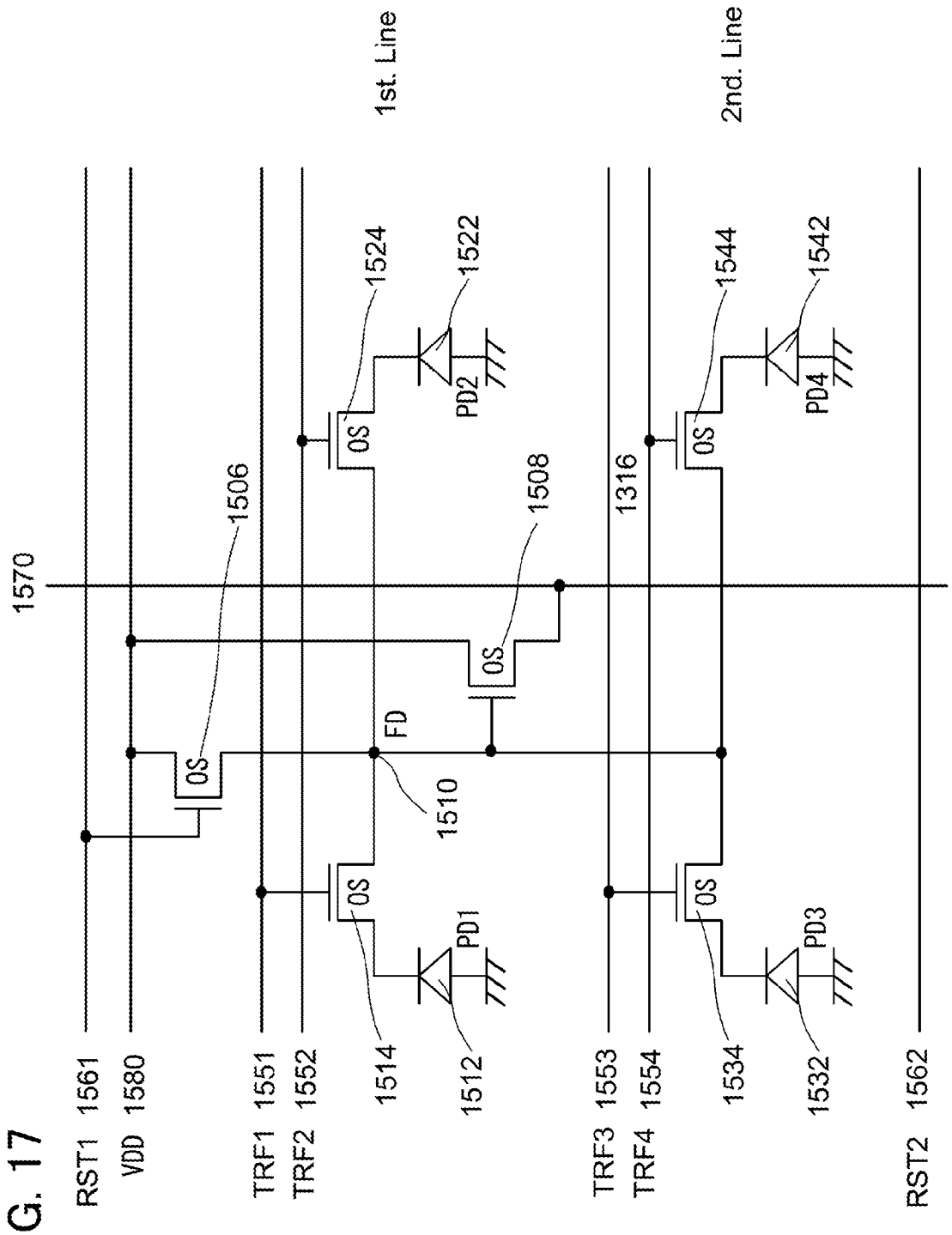
FIG. 17 illustrates a configuration of pixels of an imaging device.

A configuration in which components are shared by pixels in a manner different from that in FIG. 15 is illustrated in FIG. 17, where a reset line, a reset transistor, and an amplifier transistor are shared by two-by-two vertically and horizontally adjacent pixels, i.e., by vertically and horizontally adjacent four pixels. As in the configuration in which components are shared by vertically adjacent four pixels, when the number of transistors and the number of wirings are reduced, the pixel area can be reduced, which leads to miniaturization, and the light-receiving area of a photodiode can be increased, which leads to noise reduction. Drains of transfer transistors in the vertically and horizontally adjacent four pixels are electrically connected to each other, so that a signal charge storage portion 1510 is formed. A source of a reset transistor 1506 and a gate of an amplifier transistor 1508 are connected to the signal charge storage portion 1510.

Figure 18:
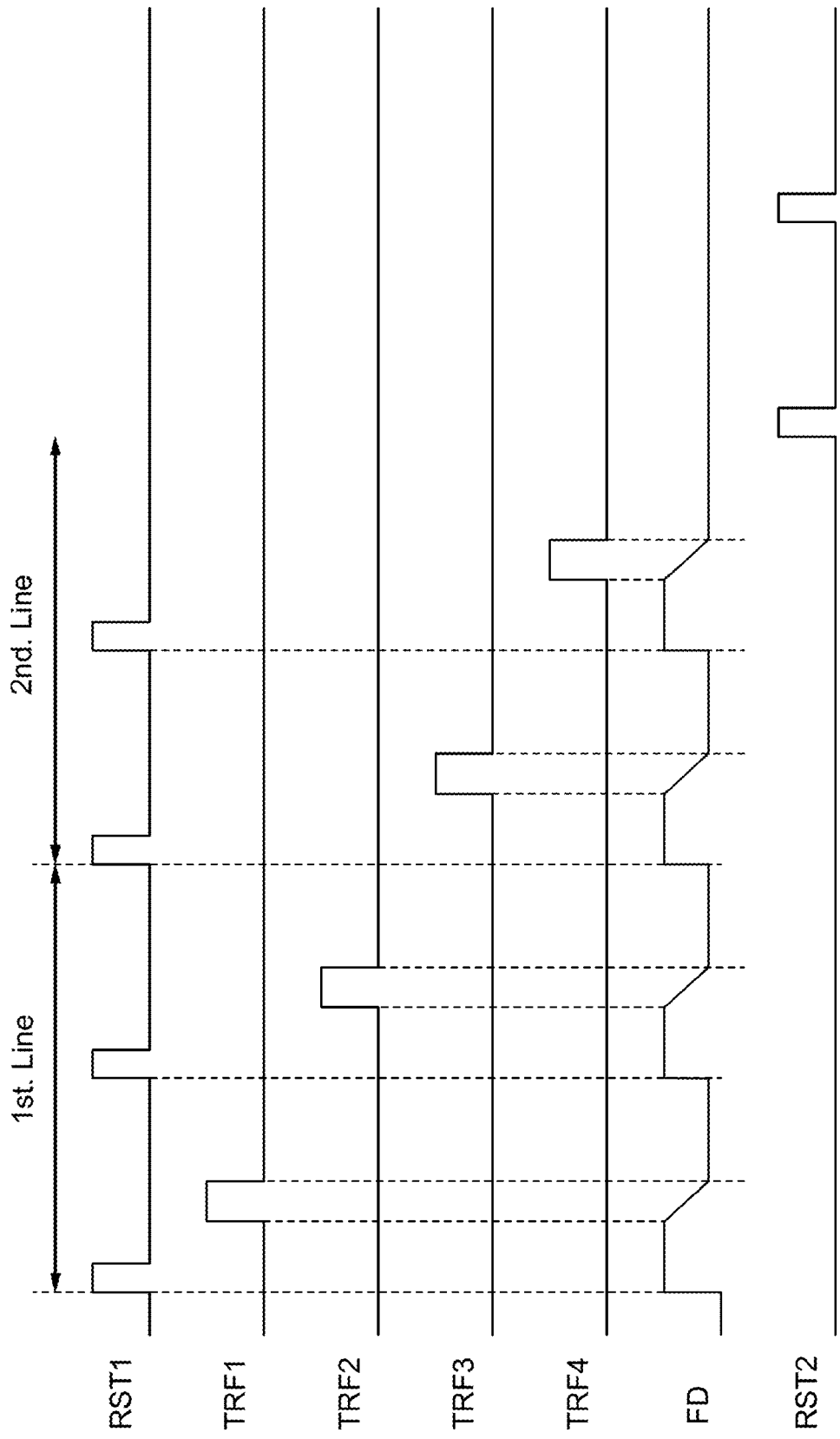
FIG. 18 illustrates the operation of pixels of an imaging device.

The operation in the configuration in which components are shared by vertically and horizontally adjacent four pixels is described with reference to a timing chart in FIG. 18. First, VDD is supplied to a wiring 1580. Next, the driving in a first line is described. First, RST1 is supplied to a first reset line 1561 to turn on the first reset transistor 1506. Accordingly, the potential of the signal charge storage portion 1510 (FD) becomes VDD. After that, the supply of RST1 is stopped, so that the first reset transistor 1506 is turned off and the potential of FD is held at VDD. Next, a first transfer signal (TRF1) is supplied to a first transfer switch line 1551, so that a first transfer transistor 1514 is turned on. At this time, when a first photodiode 1512 (PD1) is irradiated with light, a current corresponding to the intensity of received light flows through PD1 and the first transfer transistor 1514, so that the potential of FD is lowered. When the supply of TRF1 is stopped, the first transfer transistor 1514 is turned off and the potential at this time is held in FD. A potential corresponding to this potential is output to a wiring 1570 through the first amplifier transistor 1508. By measuring the potential of the wiring 1570, the amount of light received by PD1 can be determined.

Subsequently, when RST1 is supplied to the first reset line 1561 again, the first reset transistor 1506 is turned on. As a result, the potential of the signal charge storage portion 1510 (FD) becomes VDD. When the supply of RST1 is stopped, the first reset transistor 1506 is turned off and the potential of FD is held at VDD. Next, a second transfer signal (TRF2) is supplied to a second transfer switch line 1552, so that a second transfer transistor 1524 is turned on. At this time, when a second photodiode 1522 (PD2) is irradiated with light, a current corresponding to the intensity of received light flows through PD2 and the second transfer transistor 1524, so that the potential of FD is lowered. When the supply of TRF2 is stopped, the second transfer transistor 1524 is turned off and the potential at this time is held in FD. A potential corresponding to this potential is output to the wiring 1570 through the first amplifier transistor 1508. By measuring the potential of the wiring 1570, the amount of light received by PD2 can be determined Through these two operations, outputs of the pixels in the first line are sequentially output to the wiring 1570.

Next, the driving in a second line is described. When RST1 is supplied to the first reset line 1561 again, the first reset transistor 1506 is turned on. As a result, the potential of the signal charge storage portion 1510 (FD) becomes VDD. When the supply of RST1 is stopped, the first reset transistor 1506 is turned off and the potential of the signal charge storage portion 1510 is held at VDD. Next, a third transfer signal (TRF3) is supplied to a third transfer switch line 1553, so that a third transfer transistor 1534 is turned on. At this time, when a third photodiode 1532 (PD3) is irradiated with light, a current corresponding to the intensity of received light flows through PD3 and the third transfer transistor 1534, so that the potential of FD is lowered. When the supply of TRF3 is stopped, the third transfer transistor 1534 is turned off and the potential at this time is held in FD. A potential corresponding to this potential is output to the wiring 1570 through the first amplifier transistor 1508. By measuring the potential of the wiring 1570, the amount of light received by PD3 can be determined.

Subsequently, when RST1 is supplied to the first reset line 1561 again, the first reset transistor 1506 is turned on. As a result, the potential of the signal charge storage portion 1510 (FD) becomes VDD. When the supply of RST1 is stopped, the first reset transistor 1506 is turned off and the potential of FD is held at VDD. Next, a fourth transfer signal (TRF4) is supplied to a fourth transfer switch line 1554, so that a fourth transfer transistor 1544 is turned on. At this time, when a fourth photodiode 1542 (PD4) is irradiated with light, a current corresponding to the intensity of received light flows through PD4 and the fourth transfer transistor 1544, so that the potential of the signal charge storage portion 1510 is lowered. When the supply of TRF4 is stopped, the fourth transfer transistor 1544 is turned off and the potential at this time is held in FD. A potential corresponding to this potential is output to the wiring 1570 through the first amplifier transistor 1508. By measuring the potential of the wiring 1570, the amount of light received by PD4 can be determined. Subsequently, a second reset signal (RST2) is supplied to a second reset line 1562, and driving in a third line and a fourth line is sequentially performed.

Example 4 of Circuit Configuration

Figure 19:
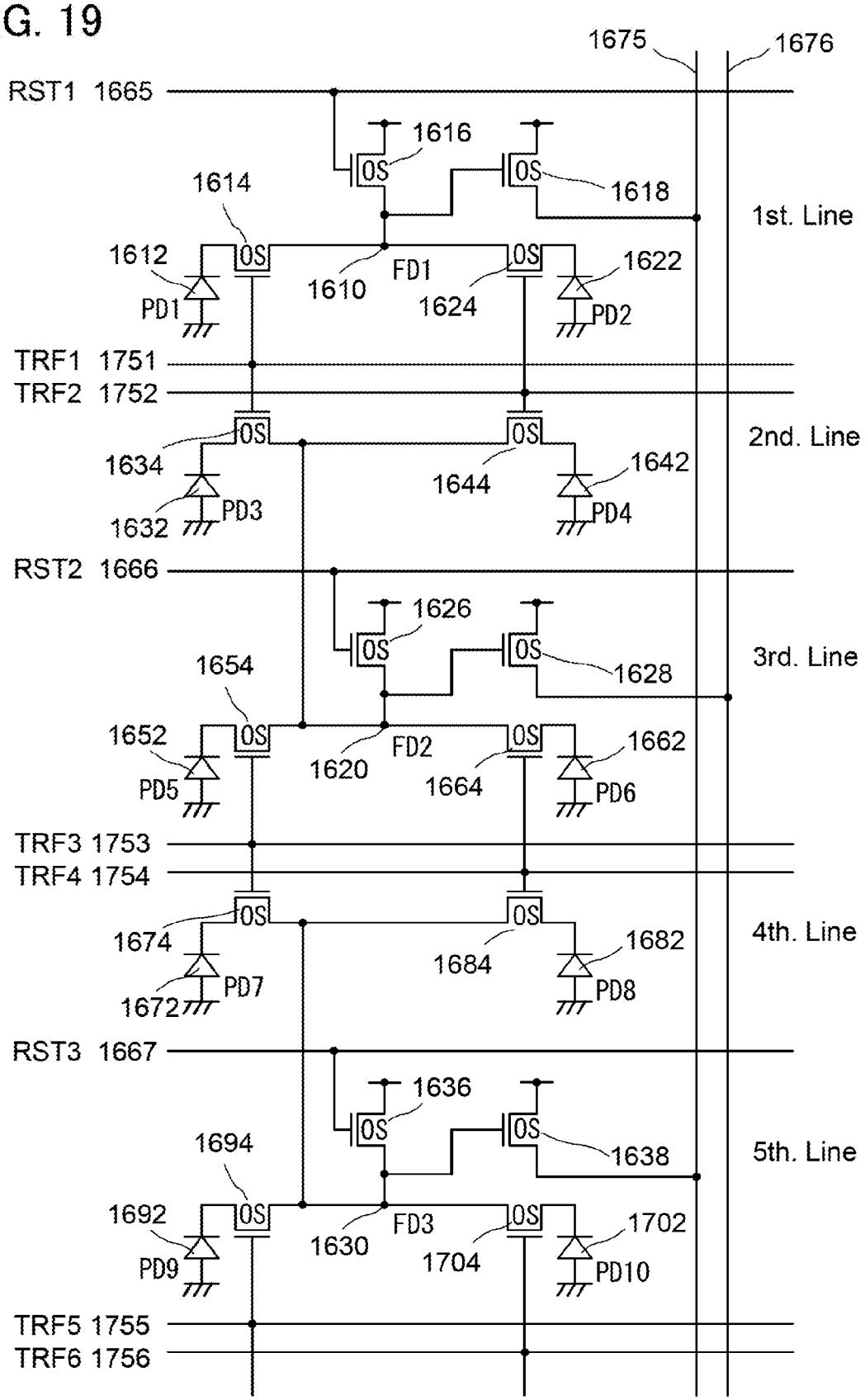
FIG. 19 illustrates a configuration of pixels of an imaging device.

FIG. 19 illustrates a configuration in which a transfer switch line as well as a reset line, a reset transistor, and an amplifier transistor is shared by two-by-two vertically and horizontally adjacent pixels. A common transfer switch line is added to the above-described configuration in which components are shared by pixels. When the number of transistors and the number of wirings are reduced, the pixel area can be reduced, which leads to miniaturization, and the light-receiving area of a photodiode can be increased, which leads to noise reduction. Drains of transfer transistors in the vertically and horizontally adjacent four pixels are electrically connected to each other, so that a signal charge storage portion is formed. A source of a reset transistor and a gate of an amplifier transistor are connected to the signal charge storage portion. In this configuration, the transfer switch line is shared by vertically adjacent two transfer transistors; thus, transistors which concurrently operate exist not only in the horizontal direction but also in the vertical direction.

Figure 20:
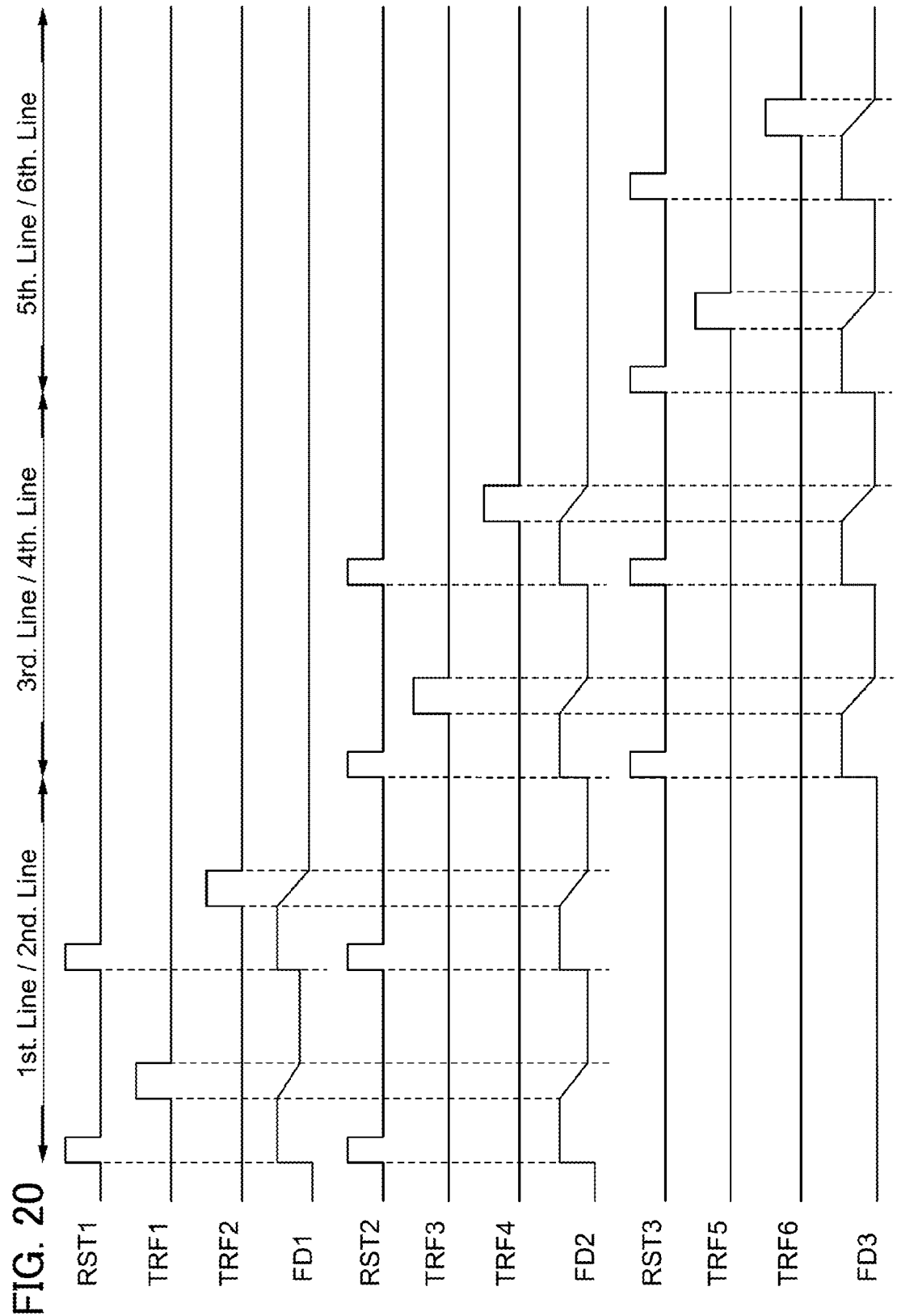
FIG. 20 illustrates the operation of pixels of an imaging device.

The operation in the configuration in which the transfer switch line is shared is described with reference to a timing chart in FIG. 20. First of all, the driving in a first line and a second line is described. First, a first reset signal (RST1) is supplied to a first reset line 1665 to turn on a first reset transistor 1616. Further, a second reset signal (RST2) is supplied to a second reset line 1666 to turn on a second reset transistor 1626. As a result, the potential of a first signal charge storage portion 1610 (FD1) and the potential of a second signal charge storage portion 1620 (FD2) become VDD. Next, when the supply of RST1 and RST2 is stopped, the first reset transistor 1616 and the second reset transistor 1626 are turned off and the potential of FD1 and the potential of FD2 are held at VDD.

Next, a first transfer signal (TRF1) is supplied to a first transfer switch line 1751, so that a first transfer transistor 1614 and a third transfer transistor 1634 are turned on. At this time, when a first photodiode 1612 (PD1) is irradiated with light, a current corresponding to the intensity of received light flows through the first photodiode 1612 and the first transfer transistor, so that the potential of FD1 is lowered. Further, when a third photodiode 1632 (PD3) is irradiated with light, a current corresponding to the intensity of received light flows through the third photodiode 1632 and the third transfer transistor 1634, so that the potential of FD2 is lowered.

When the supply of TRF1 is stopped, the first transfer transistor 1614 and the third transfer transistor 1634 are turned off and the potential of FD1 and the potential of FD2 are held. Then, a potential corresponding to the potential held in FD1 is output to a first wiring 1675 through a first amplifier transistor 1618. By measuring the potential of the first wiring 1675, the amount of light received by PD1 can be determined. Further, a potential corresponding to the potential held in FD2 is output to a second wiring 1676 through a second amplifier transistor 1628. By measuring the potential of the second wiring 1676, the amount of light received by PD3 can be determined.

Next, RST1 is supplied to the first reset line 1665 again to turn on the first reset transistor 1616. Further, RST2 is supplied to the second reset line 1666 to turn on the second reset transistor 1626. As a result, the potential of FD1 and the potential of FD2 become VDD. After that, when the supply of RST1 and RST2 is stopped, the first reset transistor 1616 and the second reset transistor 1626 are turned off and the potential of FD1 and the potential of FD2 are held.

Next, a second transfer signal (TRF2) is supplied to a second transfer switch line 1752, so that a second transfer transistor 1624 and a fourth transfer transistor 1644 are turned on. At this time, when a second photodiode 1622 (PD2) is irradiated with light, a current corresponding to the intensity of received light flows through PD2 and the second transfer transistor 1624, so that the potential of FD1 is lowered. Further, at this time, when a fourth photodiode 1642 (PD4) is irradiated with light, a current corresponding to the intensity of received light flows through PD4 and the fourth transfer transistor 1644, so that the potential of FD2 is lowered. When the supply of TRF2 is stopped, the second transfer transistor 1624 and the fourth transfer transistor 1644 are turned off and the potential of FD1 and the potential of FD2 are held. Then, a potential corresponding to the potential held in FD1 is output to the first wiring 1675 through the first amplifier transistor 1618. By measuring the potential of the first wiring 1675, the amount of light received by PD2 can be determined. Further, a current corresponding to the potential held in FD2 flows to the second wiring 1676 through the second amplifier transistor 1628. By measuring the potential of the second wiring 1676, the amount of light received by PD4 can be determined. In this manner, data of the pixels in the first line and the second line can be output to the first wiring 1675 and the second wiring 1676 one by one.

Next, the driving in the second line and a third line is described. First, RST2 is supplied to the second reset line 1666 to turn on the second reset transistor 1626. Further, a third reset signal (RST3) is supplied to a third reset line 1667 to turn on a third reset transistor 1636. As a result, the potential of FD2 and the potential of a third signal charge storage portion 1630 (FD3) become VDD. Next, when the supply of RST2 and RST3 is stopped, the second reset transistor 1626 and the third reset transistor 1636 are turned off and the potential of FD2 and the potential of FD3 are held at VDD.

Next, a third transfer signal (TRF3) is supplied to a third transfer switch line 1753, so that a fifth transfer transistor 1654 and a seventh transfer transistor 1674 are turned on. At this time, when a fifth photodiode 1652 (PD5) is irradiated with light, a current corresponding to the intensity of received light flows through PD5 and the fifth transfer transistor 1654, so that the potential of FD2 is lowered. Further, when a seventh photodiode 1672 (PD7) is irradiated with light, a current corresponding to the intensity of received light flows through PD7 and the seventh transfer transistor 1674, so that the potential of FD3 is lowered.

When the supply of TRF3 is stopped, the fifth transfer transistor 1654 and the seventh transfer transistor 1674 are turned off and the potential of FD2 and the potential of FD3 are held. Then, a potential corresponding to the potential held in FD2 is output to the second wiring 1676 through the second amplifier transistor 1628. By measuring the potential of the second wiring 1676, the amount of light received by PD5 can be determined. Further, a potential corresponding to the potential held in FD3 is output to the first wiring 1675 through a third amplifier transistor 1638. By measuring the potential of the first wiring 1675, the amount of light received by PD7 can be determined.

Next, RST2 is supplied to the second reset line 1666 to turn on the second reset transistor 1626. Further, RST3 is supplied to the third reset line 1667 to turn on the third reset transistor 1636. As a result, the potential of FD2 and the potential of FD3 become VDD. After that, when the supply of RST2 and RST3 is stopped, the second reset transistor 1626 and the third reset transistor 1636 are turned off and the potential of FD2 and the potential of FD3 are held.

Next, a fourth transfer signal (TRF4) is supplied to a fourth transfer switch line 1754, so that a sixth transfer transistor 1664 and an eighth transfer transistor 1684 are turned on. At this time, when a sixth photodiode 1662 (PD6) is irradiated with light, a current corresponding to the intensity of received light flows through PD6 and the sixth transfer transistor 1664, so that the potential of FD2 is lowered. Further, at this time, when an eighth photodiode 1662 (PD8) is irradiated with light, a current corresponding to the intensity of received light flows through PD8 and the eighth transfer transistor 1684, so that the potential of FD3 is lowered. When the supply of TRF4 is stopped, the sixth transfer transistor 1664 and the eighth transfer transistor 1684 are turned off and the potential of FD2 and the potential of FD3 are held. Then, a potential corresponding to the potential held in FD2 is output to the second wiring 1676 through the second amplifier transistor 1628. By measuring the potential of the second wiring 1676, the amount of light received by PD6 can be determined. Further, a potential corresponding to the potential held in FD3 is output to the first wiring 1675 through the third amplifier transistor 1638. By measuring the potential of the first wiring 1675, the amount of light received by PD8 can be obtained. In this manner, data of the pixels in the third line and the fourth line can be output to the second wiring 1676 and the first wiring 1675 one by one. Subsequently, RST3 is supplied to the third reset line 1667, and a fourth reset signal is supplied to a fourth reset line. These operations are sequentially performed.

Note that FIG. 19 also illustrates a ninth photodiode 1692 (PD9), a tenth photodiode 1702 (PD10), a ninth transfer transistor 1694, and a tenth transfer transistor 1704 which are provided in pixels in a fifth line, a fifth transfer switch line 1755 through which a fifth transfer signal (TRF5) is supplied, and a sixth transfer switch line 1756 through which a sixth transfer signal (TRF6) is supplied.

[Configuration Example of Imaging Device]

Figure 21:
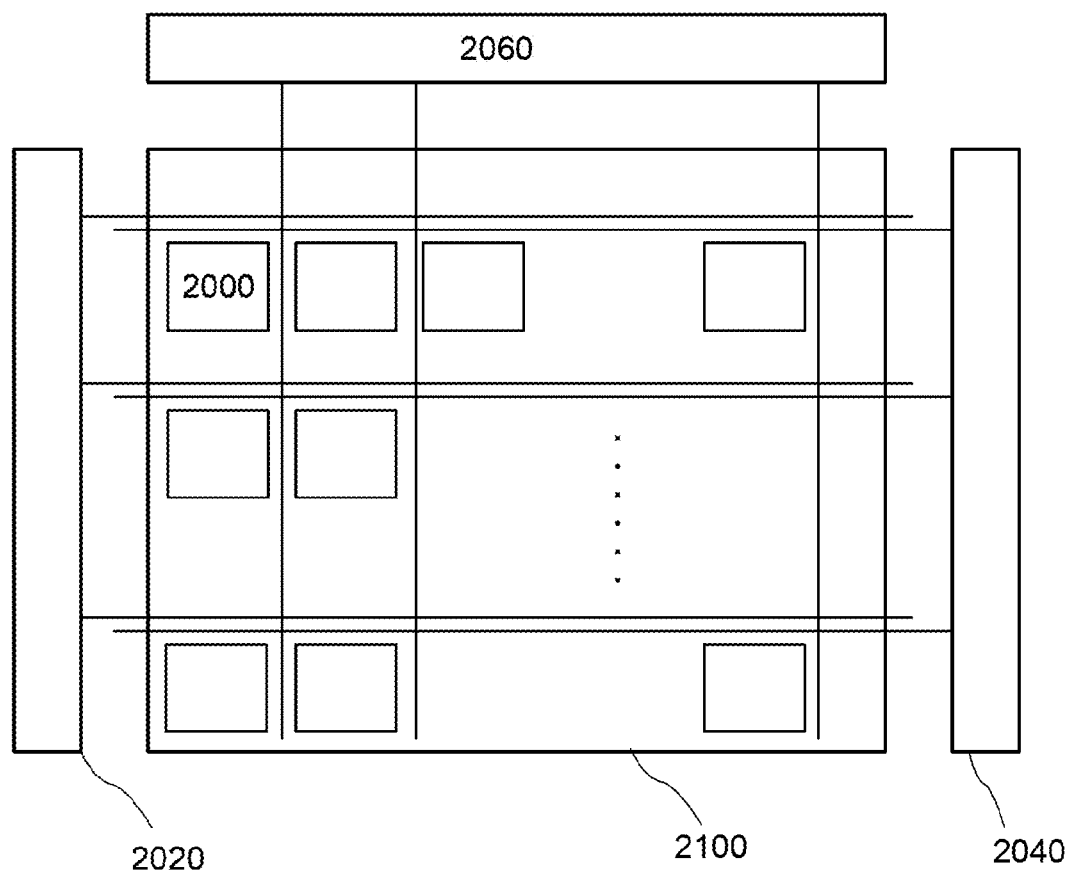
FIG. 21 illustrates a configuration of an imaging device.
Figure 22:
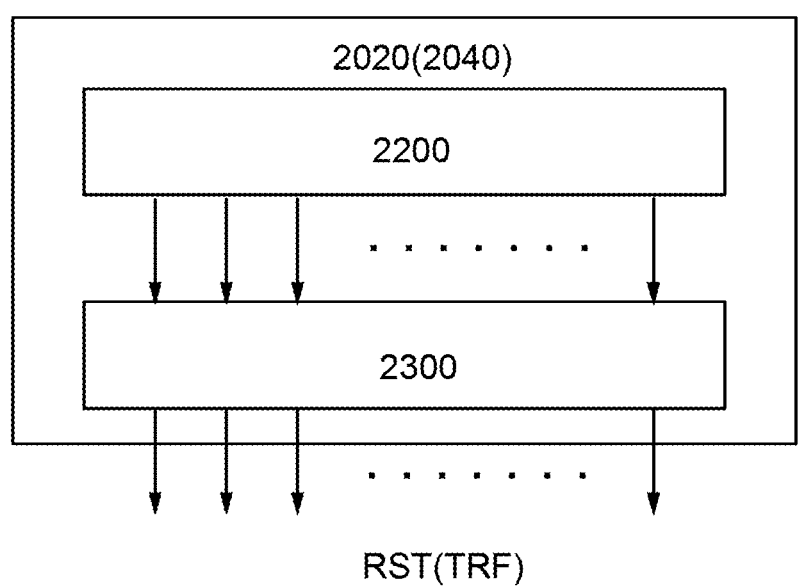
FIG. 22 illustrates a configuration of a reset terminal driver circuit and a transfer terminal driver circuit.

FIG. 21 is an overall view of an imaging device. A reset terminal driver circuit 2020 and a transfer terminal driver circuit 2040 are provided on opposite sides of a pixel array 2100 including pixels 2000. The driver circuits are provided on both sides of the pixel array 2100 in FIG. 21; however, both of the driver circuits may be provided on one side. A wiring driver circuit 2060 is provided on a side on which the above driver circuits are not provided. The reset terminal driver circuit 2020 and the transfer terminal driver circuit 2040 are each a driver circuit which outputs a binary signal (Low and High); thus, the driving can be performed with a combination of a shift register 2200 and a buffer circuit 2300 as illustrated in FIG. 22. These driver circuits can be formed using a bulk transistor including single crystal silicon or the like, a transistor including an oxide semiconductor, or the like.

Figure 23:
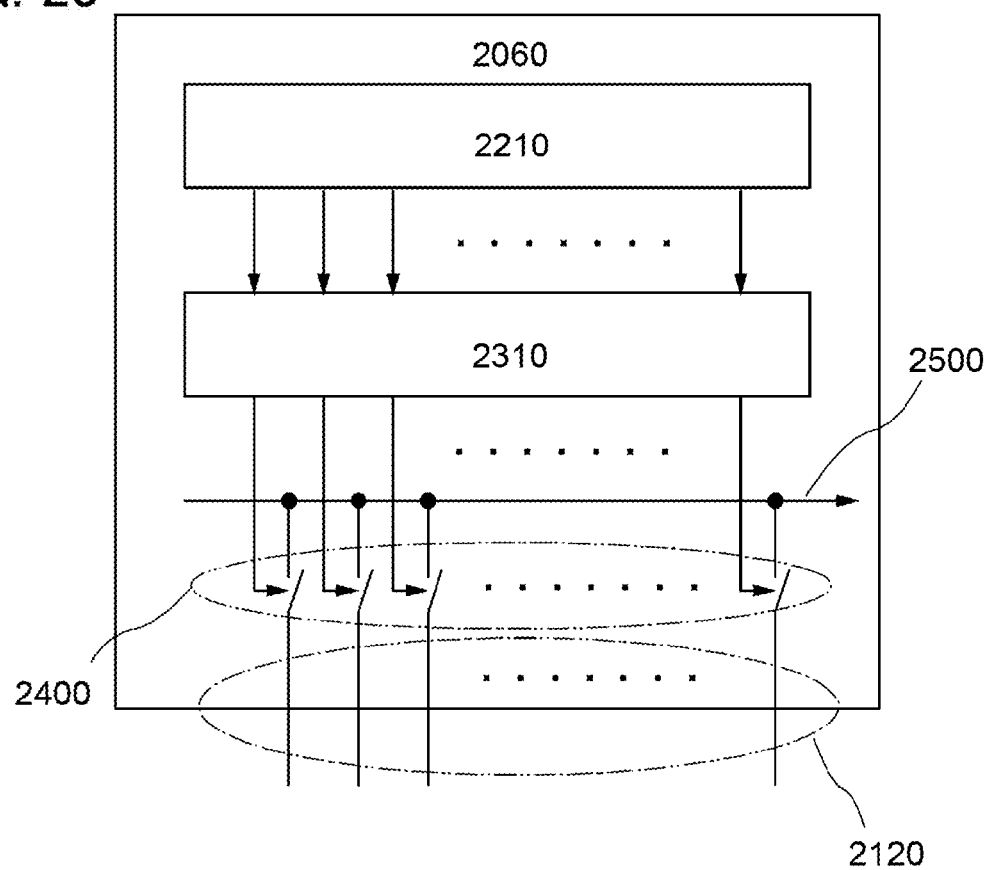
FIG. 23 illustrates a configuration of a wiring driver circuit.

The wiring driver circuit 2060 can include a shift register 2210, a buffer circuit 2310, and analog switches 2400 as illustrated in FIG. 23. Wirings 2120 are selected by the respective analog switches 2400 for outputting to an image output line 2500. The analog switches 2400 are sequentially selected by the shift register 2210 and the buffer circuit 2310. Although the wiring driver circuit 2060 can be formed using bulk transistors or thin film transistors, bulk transistors including a silicon semiconductor are preferably used because complementary transistors can be formed.

Figure 24:
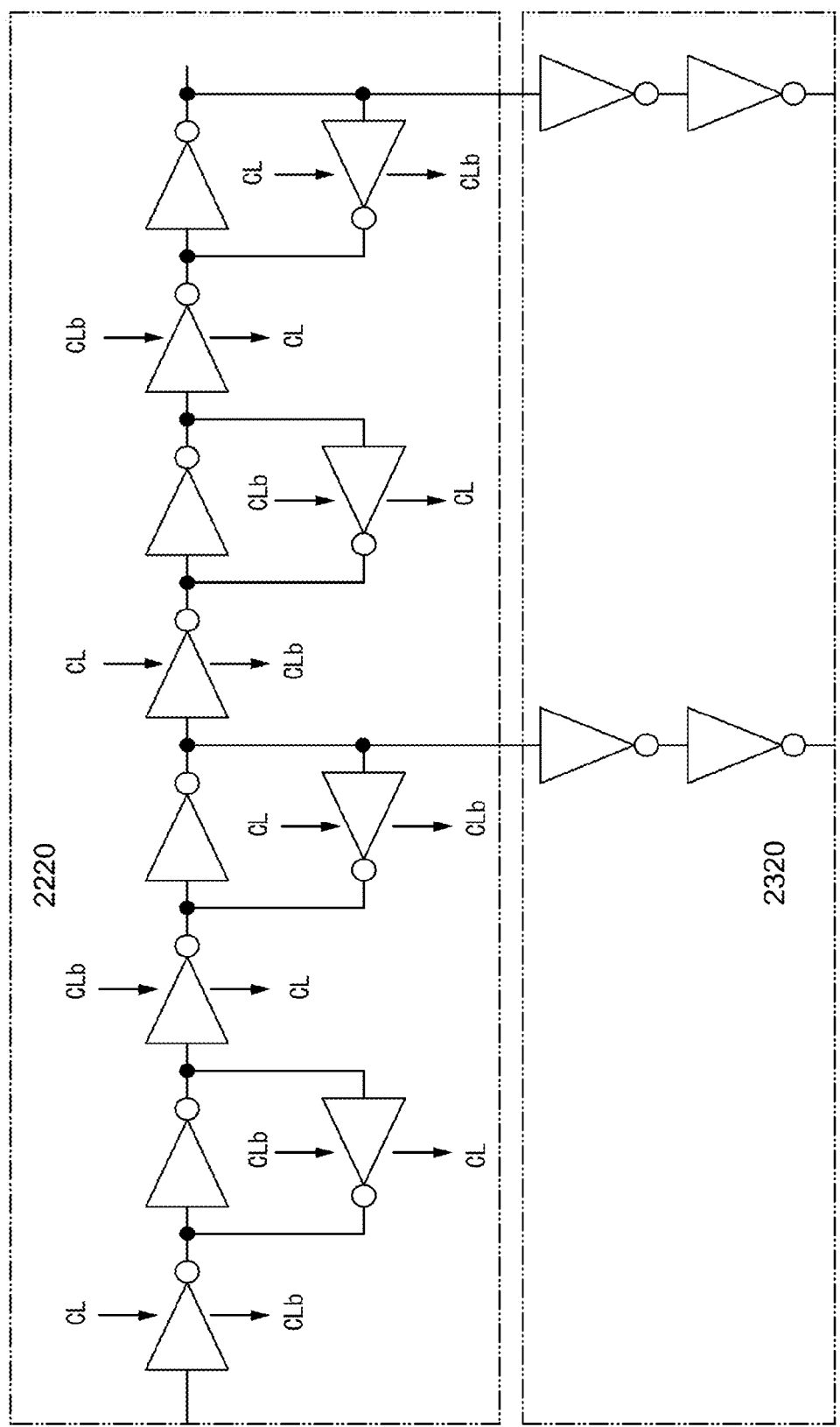
FIG. 24 illustrates examples of a shift register and a buffer circuit.

FIG. 24 illustrates examples of a shift register and a buffer circuit. FIG. 24 illustrates examples of a shift register 2220 including a clocked inverter and a buffer circuit 2320 including an inverter. The shift register and the buffer circuit are not limited to these circuits. The structures of the reset terminal driver circuit 2020, the transfer terminal driver circuit 2040, and the wiring driver circuit 2060 are not limited to the above structures, either.

This embodiment can be implemented in an appropriate combination with any of the other embodiments.
(Embodiment 3)

Figure 25A:
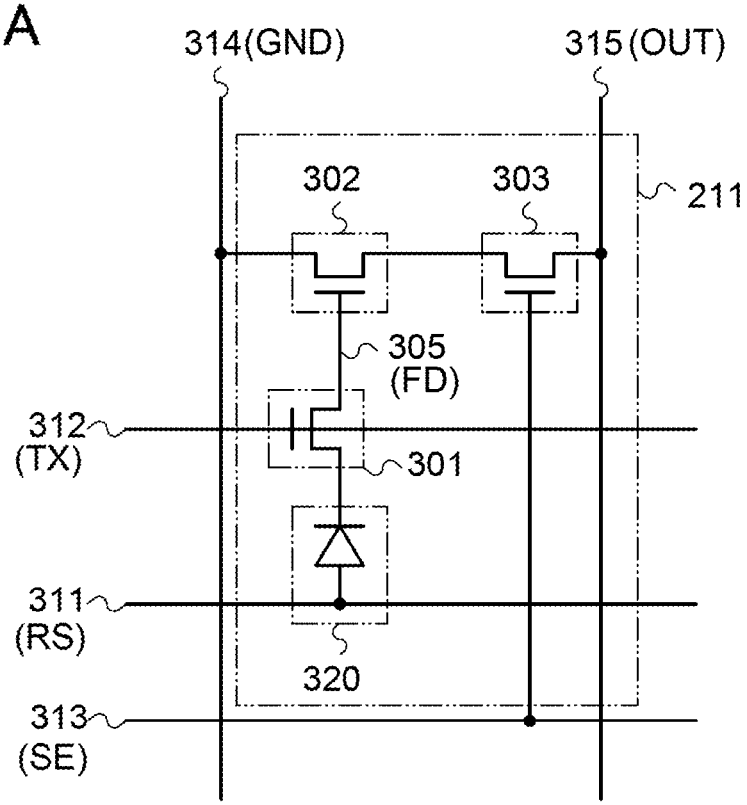
FIGS. 25A and 25B each illustrate a configuration of a pixel circuit.
Figure 25B:
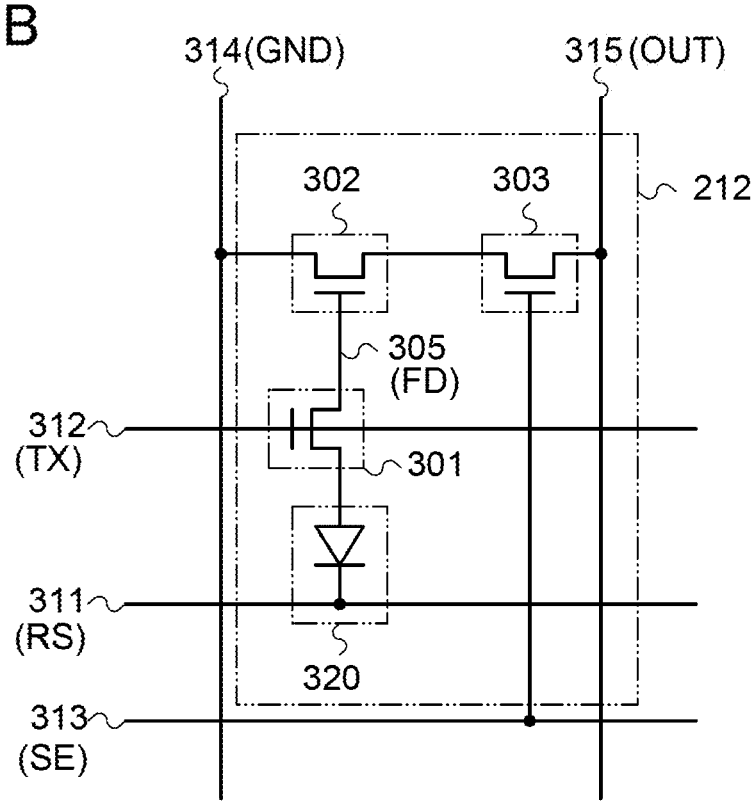

In this embodiment, examples of methods for driving pixel circuits illustrated in FIGS. 25A and 25B are described.

FIG. 25A illustrates a circuit 211 as an example of a circuit that can be used for the pixel 210. The circuit 211 includes a photodiode 320 serving as the light-receiving element 220 and a first transistor 301, a second transistor 302, and a third transistor 303 which are connected to the light-receiving element.

An anode of the photodiode 320 is electrically connected to a first wiring 311 (RS), a cathode of the photodiode 320 is electrically connected to one of a source and a drain of the first transistor 301, the other of the source and the drain of the first transistor 301 is electrically connected to a wiring 305 (FD), a gate of the first transistor 301 is electrically connected to a second wiring 312 (TX), one of a source and a drain of the second transistor 302 is electrically connected to a fourth wiring 314 (GND), the other of the source and the drain of the second transistor 302 is electrically connected to one of a source and a drain of the third transistor 303, a gate of the second transistor 302 is electrically connected to the wiring 305 (FD), the other of the source and the drain of the third transistor 303 is electrically connected to a fifth wiring 315 (OUT), and a gate of the third transistor 303 is electrically connected to a third wiring 313 (SE).

A potential such as GND, VSS, or VDD may be supplied to the fourth wiring 314. Here, a potential or a voltage has a relative value. Therefore, the potential GND is not necessarily 0 V.

The photodiode 320 is a light-receiving element and generates a current corresponding to the light incident on the pixel circuit. The first transistor 301 controls the accumulation in the wiring 305 (FD) of electric charge generated by the photodiode 320. The second transistor 302 outputs a signal corresponding to a potential of the wiring 305 (FD). The third transistor 303 controls the selection of the pixel circuit at the time of reading.

Note that the wiring 305 (FD) is a charge retention node, that is, a charge accumulation portion retaining electric charge whose amount changes depending on the amount of light received by the photodiode 320. Practically, the charge accumulation portion is depletion layer capacitance in the vicinity of a source region or a drain region of the first transistor 301 electrically connected to the wiring 305 (FD), wiring capacitance of the wiring 305 (FD), gate capacitance of the second transistor 302 electrically connected to the wiring 305 (FD), and the like.

Note that the second transistor 302 and the third transistor 303 only need to be connected in series between the fifth wiring 315 and the fourth wiring 314. Hence, the fourth wiring 314, the second transistor 302, the third transistor 303, and the fifth wiring 315 may be arranged in this order, or the fourth wiring 314, the third transistor 303, the second transistor 302, and the fifth wiring 315 may be arranged in this order.

The first wiring 311 (RS) is a signal line for resetting the wiring 305 (FD). The first wiring 311 (RS) in the circuit 211 is also a signal line for charge accumulation in the wiring 305 (FD). The second wiring 312 (TX) is a signal line for controlling the first transistor 301. The third wiring 313 (SE) is a signal line for controlling the third transistor 303. The fourth wiring 314 (GND) is a signal line for setting a reference potential (e.g., GND). The fifth wiring 315 (OUT) is a signal line for reading data obtained in the circuit 211.

FIG. 25B illustrates a circuit 212 as another example of a circuit that can be used for the pixel 210. The circuit 212 in FIG. 25B includes the same components as the circuit 211 in FIG. 25A but is different from the circuit 211 in that the anode of the photodiode 320 is electrically connected to one of the source and the drain of the first transistor 301 and that the cathode of the photodiode 320 is electrically connected to the first wiring 311 (RS).

An element formed using a silicon semiconductor with a pn junction or a pin junction can be as the photodiode 320, for example. Note that a pin photodiode in which an i-type semiconductor layer is formed using amorphous silicon may be used. Since amorphous silicon has high sensitivity in a visible wavelength range, weak visible light can be sensed easily.

Note that an i-type semiconductor refers not only to what is called an intrinsic semiconductor in which the Fermi level lies in the middle of the bandgap, but also to a semiconductor in which the concentration of an impurity imparting p-type conductivity and the concentration of an impurity imparting n-type conductivity are lower than or equal to $1 \times 10^{20}$ atoms/$cm^3$ and in which the photoconductivity is higher than the dark conductivity.

Although a silicon semiconductor such as amorphous silicon, microcrystalline silicon, polycrystalline silicon, or single crystal silicon can be used to form the first transistor 301, the second transistor 302, and the third transistor 303, an oxide semiconductor is preferably used to form the transistors. A transistor in which a channel formation region is formed of an oxide semiconductor has an extremely low off-state current.

In particular, when the first transistor 301 connected to the wiring 305 (FD) has a high leakage current, electric charge accumulated in the wiring 305 (FD) cannot be retained for a sufficiently long time. The use of an oxide semiconductor for the first transistor 301 can prevent unwanted leakage of electric charge through the photodiode 320.

Unwanted leakage of electric charge to the fourth wiring 314 or the fifth wiring 315 also occurs when the second transistor 302 and the third transistor 303 have a high leakage current; thus, a transistor in which a channel formation region is formed of an oxide semiconductor is preferably used as each of these transistors.

When the transistor which includes an oxide semiconductor and has an extremely low off-state current is used as the second transistor 302, wider dynamic range imaging can be performed. In the pixel circuit illustrated in FIG. 25A, a gate potential of the second transistor 302 is decreased when the intensity of light incident on the photodiode 320 is increased. In the pixel circuit illustrated in FIG. 25B, the gate potential of the second transistor 302 is decreased when the intensity of light incident on the photodiode 320 is decreased. Since the transistor including an oxide semiconductor has an extremely low off-state current, a current corresponding to the gate potential can be accurately output even when the gate potential is extremely low. Thus, it is possible to broaden the detection range of illuminance, i.e., the dynamic range.

Further, in the pixel circuit illustrated in FIG. 25B, a sufficiently wide dynamic range can be obtained even when the gate potential of the second transistor 302 is relatively low, i.e., when the intensity of light incident on the photodiode is low.

The operation of the pixel circuit is repetition of a reset operation, an accumulation operation, and a selection operation. When a moving image is taken with the imaging device 100, a period required for one imaging needs to be shortened. To shorten the imaging period, it is necessary to perform the reset operation, the accumulation operation, and the selection operation of all the pixel circuits at high speed.

Figure 26A:
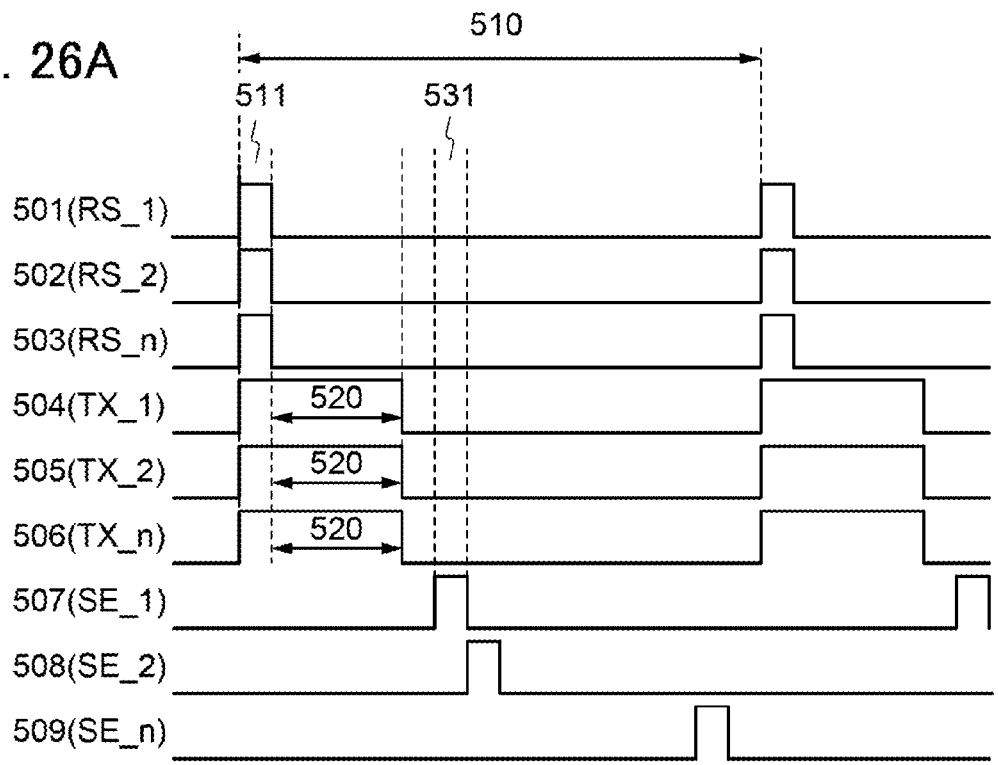
FIGS. 26A and 26B are timing charts illustrating operation in a global shutter system and operation in a rolling shutter system, respectively.

Thus, a driving method using a global shutter system shown in a timing chart in FIG. 26A is preferably used for imaging. FIG. 26A shows the operation of a plurality of pixel circuits 211 in FIG. 25A which are arranged in a matrix in an imaging device, specifically, the operation of the circuits 211 in the first row to the n-th row (n is a natural number of three or more). Note that the following description of the operation can be applied to another circuit disclosed in this specification.

In FIG. 26A, a signal 501, a signal 502, and a signal 503 are input to the first wirings 311 (RS) connected to the pixel circuits in the first row, the second row, and the n-th row, respectively. A signal 504, a signal 505, and a signal 506 are input to the second wirings 312 (TX) connected to the pixel circuits in the first row, the second row, and the n-th row, respectively. A signal 507, a signal 508, and a signal 509 are input to the third wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. The selection operation of the pixel circuits is sequentially performed on the row basis. For example, in a period 531, the selection operation is performed in the pixel circuits in the first row. In this manner, in the global shutter system, the reset operation is performed substantially at the same time in all the pixel circuits, the accumulation operation is performed substantially at the same time in all the pixel circuits, and then the read operation is sequentially performed on the row basis.

That is, in the global shutter system, since the accumulation operation is performed substantially at the same time in all the pixel circuits, imaging is simultaneously performed in the pixel circuits in all the rows. Accordingly, a period required for one imaging can be shortened. That is, in the global shutter system, the accumulation operation can be performed only in the period 520.

Figure 26B:
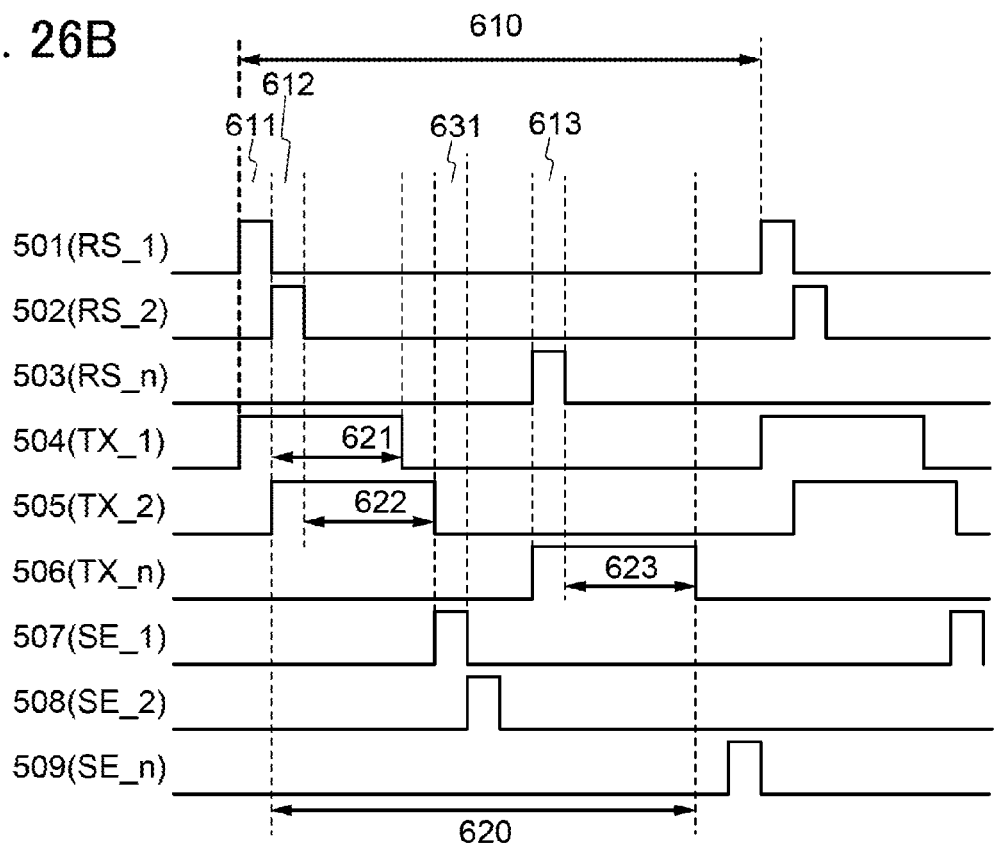

On the other hand, FIG. 26B is a timing chart in the case where a rolling shutter system is used. The description of FIG. 26A can be referred to for the signals 501 to 509. A period 610 is a period required for one imaging. A period 611, a period 612, and a period 612 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but sequentially performed on the row basis; thus, imaging is not simultaneously performed in the pixel circuits in all the rows. Accordingly, the imaging period is longer than that in the global shutter system. However, the period 620 can be shortened, for example, by reducing the accumulation operation period; thus, the rolling shutter system can also be used as a method for driving the imaging device of one embodiment of the present invention.

To perform the global shutter system, even after the accumulation operation, the potential of the wiring 305 (FD) in each pixel circuit needs to be kept for a long time until the read operation is performed. As described above, when a transistor in which a channel formation region is formed of an oxide semiconductor and which has an extremely low off-state current is used as the first transistor 301, the potential of the wiring 305 (FD) can be held for a long time. In the case where a transistor in which a channel formation region is formed of a silicon semiconductor or the like is used as the first transistor 301, the potential of the wiring 305 (FD) cannot be held for a long time because of a high off-state current, which makes it difficult to use the global shutter system.

As described above, the use of the transistor in which a channel formation region is formed of an oxide semiconductor for the pixel circuits makes it easy to perform the global shutter system.

This embodiment can be implemented in an appropriate combination with any of the structures described in the other embodiments.

(Embodiment 4)

In this embodiment, structural examples of a transistor that can be used as the transistor 231, the transistor 236, the transistor 241, the transistor 246, and/or the transistor 282 described in the above embodiments are described with reference to FIGS. 27A1, 27A2, 27B1, and 27B2 and FIGS. 28A1 to 28A3, 28B1 and 28B2.

[Bottom-Gate Transistor]

A transistor 410 illustrated in FIG. 27A1 as an example is a channel-protective transistor that is a type of bottom-gate transistor. The transistor 410 includes an insulating layer 209 that can function as a channel protective layer over a channel formation region in the semiconductor layer 110. The insulating layer 209 can be formed using a material and a method similar to those of the insulating layer 111. Part of the electrode 244 and part of the electrode 249 are formed over the insulating layer 209.

With the insulating layer 209 provided over the channel formation region, the semiconductor layer 110 can be prevented from being exposed at the time of forming the electrode 244 and the electrode 249. Thus, the semiconductor layer 110 can be prevented from being reduced in thickness at the time of forming the electrode 244 and the electrode 249. According to one embodiment of the present invention, a transistor with favorable electrical characteristics can be provided.

A transistor 411 illustrated in FIG. 27A2 is different from the transistor 410 in that an electrode 213 that can function as a back gate electrode is provided over the insulating layer 112. The electrode 213 can be formed using a material and a method similar to those of the electrode 243.

In general, a back gate electrode is formed using a conductive layer and positioned so that a channel formation region of a semiconductor layer is provided between a gate electrode and the back gate electrode. Thus, the back gate electrode can function in a manner similar to that of the gate electrode. The potential of the back gate electrode may be the same as that of the gate electrode or may be a GND potential or a given potential. By changing the potential of the back gate electrode independently of the potential of the gate electrode, the threshold voltage of the transistor can be changed.

The electrodes 243 and 213 can both function as a gate electrode. Thus, the insulating layer 111, the insulating layer 209, and the insulating layer 112 can each function as a gate insulating layer.

In the case where one of the electrodes 243 and 213 is referred to as a gate electrode, the other is referred to as a back gate electrode in some cases. For example, in the transistor 411, in the case where the electrode 213 is referred to as a gate electrode, the electrode 243 may be referred to as a back gate electrode. In the case where the electrode 213 is used as a gate electrode, the transistor 411 can be regarded as a kind of top-gate transistor. Furthermore, one of the electrodes 243 and 213 may be referred to as a first gate electrode, and the other may be referred to as a second gate electrode.

By providing the electrode 243 and the electrode 213 with the semiconductor layer 110 provided therebetween and setting the potentials of the electrode 243 and the electrode 213 to be equal, a region of the semiconductor layer 110 through which carriers flow is enlarged in the thickness direction; thus, the number of transferred carriers is increased. As a result, the on-state current and field-effect mobility of the transistor 411 are increased.

Therefore, the transistor 411 has a high on-state current for its area. That is, the area occupied by the transistor 411 can be small for required on-state current. According to one embodiment of the present invention, the area occupied by a transistor can be reduced. Therefore, according to one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which a channel is formed (in particular, a function of blocking static electricity).

Since the electrode 243 and the electrode 213 each have a function of blocking an electric field generated outside, electric charge of charged particles and the like generated on the insulating layer 109 side or above the electrode 213 does not influence the channel formation region in the semiconductor layer 110. Therefore, degradation in a stress test (e.g., a negative gate bias temperature (−GBT) stress test in which negative electric charge is applied to a gate) can be reduced, and changes in the rising voltages of on-state current at different drain voltages can be suppressed. Note that this effect can be obtained when the electrodes 243 and 213 have the same potential or different potentials.

The BT stress test is one kind of accelerated test and can evaluate, in a short time, a change by long-term use (i.e., a change over time) in characteristics of transistors. In particular, the amount of change in threshold voltage of the transistor by the BT stress test is an important indicator when the reliability of the transistor is examined. The smaller the amount of change in threshold voltage by the BT stress test is, the higher the reliability of the transistor is.

By providing the electrode 243 and the electrode 213 and setting the potentials of the electrode 243 and the electrode 213 to be equal, the change in threshold voltage is reduced. Accordingly, variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

A transistor 420 illustrated in FIG. 27B1 as an example is a channel-protective transistor that is a type of bottom-gate transistor. The transistor 420 has substantially the same structure as the transistor 410 but is different from the transistor 410 in that the insulating layer 209 covers the semiconductor layer 110. The semiconductor layer 110 is electrically connected to the electrode 244 in an opening formed by selectively removing part of the insulating layer 209 which overlaps with the semiconductor layer 110. Furthermore, the semiconductor layer 110 is electrically connected to the electrode 249 in an opening formed by selectively removing part of the insulating layer 209 which overlaps with the semiconductor layer 110. A region of the insulating layer 209 which overlaps with the channel formation region can function as a channel protective layer.

A transistor 421 illustrated in FIG. 27B2 is different from the transistor 420 in that the electrode 213 that can function as a back gate electrode is provided over the insulating layer 112.

With the insulating layer 209, the semiconductor layer 110 can be prevented from being exposed at the time of forming the electrode 244 and the electrode 249. Thus, the semiconductor layer 110 can be prevented from being reduced in thickness at the time of forming the electrode 244 and the electrode 249.

The length between the electrode 244 and the electrode 243 and the length between the electrode 249 and the electrode 243 in the transistors 420 and 421 are larger than those in the transistors 410 and 411. Thus, the parasitic capacitance generated between the electrode 244 and the electrode 243 can be reduced. The parasitic capacitance generated between the electrode 249 and the electrode 243 can also be reduced. According to one embodiment of the present invention, a transistor with favorable electrical characteristics can be provided.

[Top-Gate Transistor]

A transistor 430 illustrated in FIG. 28A1 as an example is a type of top-gate transistor. The transistor 430 includes the semiconductor layer 110 over the insulating layer 109; the electrode 244 in contact with part of the semiconductor layer 110 and the electrode 249 in contact with part of the semiconductor layer 110, over the semiconductor layer 110 and the insulating layer 109; the insulating layer 111 over the semiconductor layer 110, the electrode 244, and the electrode 249; and the electrode 243 over the insulating layer 111.

Since, in the transistor 430, the electrode 243 overlaps with neither the electrode 244 nor the electrode 249, the parasitic capacitance generated between the electrode 243 and the electrode 244 and the parasitic capacitance generated between the electrode 243 and the electrode 249 can be reduced. After the formation of the electrode 243, an impurity element 255 is introduced into the semiconductor layer 110 with the use of the electrode 243 as a mask, so that an impurity region can be formed in the semiconductor layer 110 in a self-aligned manner (see FIG. 28A3). According to one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In the case where an oxide semiconductor is used for the semiconductor layer 110, it is possible to use at least one kind of element of a rare gas, hydrogen, and nitrogen as the impurity element 255.

A transistor 431 illustrated in FIG. 28A2 is different from the transistor 430 in that the electrode 213 and an insulating layer 217 are provided. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method similar to those of the insulating layer 205.

The transistor 431 as well as the transistor 411 has a high on-state current for its area. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

A transistor 440 illustrated in FIG. 28B1 as an example is a type of top-gate transistor. The transistor 440 is different from the transistor 430 in that the semiconductor layer 110 is formed after the formation of the electrode 244 and the electrode 249. A transistor 441 illustrated in FIG. 28B2 as an example is different from the transistor 440 in that the electrode 213 and the insulating layer 217 are provided. In the transistors 440 and 441, part of the semiconductor layer 110 is formed over the electrode 244 and another part of the semiconductor layer 110 is formed over the electrode 249.

The transistor 441 as well as the transistor 411 has a high on-state current for its area. That is, the area occupied by the transistor 441 can be small for required on-state current. According to one embodiment of the present invention, the area occupied by a transistor can be reduced. Therefore, according to one embodiment of the present invention, a semiconductor device having a high degree of integration can be provided.

Also in the transistors 440 and 441, after the formation of the electrode 243, the impurity element 255 is introduced into the semiconductor layer 110 with the use of the electrode 243 as a mask, so that an impurity region can be formed in the semiconductor layer 110 in a self-aligned manner. According to one embodiment of the present invention, a transistor with favorable electrical characteristics can be provided. Furthermore, according to one embodiment of the present invention, a semiconductor device having a high degree of integration can be provided.

Although various films such as metal films, semiconductor films, and inorganic insulating films disclosed in this specification and the like can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves) for avoiding that the plurality of source gases is mixed, and an inert gas (e.g., argon or nitrogen) or the like is introduced at the same time as or after the introduction of a first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal films, the semiconductor films, and the inorganic insulating films which have been disclosed in the embodiments can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide) hafnium.

For example, in the case where an aluminum oxide film is formed with a deposition apparatus using an ALD method, two kinds of gases, i.e., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, chlorine contained in the adsorbate is removed, and radicals of an oxidation gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially introduced plural times to form an initial tungsten film, and then a $WF_6$ gas and an $H_2$ gas are sequentially introduced plural times to form a tungsten film. Note that a $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are sequentially introduced plural times to form an In—O layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed using these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be implemented in an appropriate combination with any of the structures described in the other embodiments.

(Embodiment 5)

In this embodiment, a configuration example of an image processing engine of an imaging device (image sensor) is described with reference to FIG. 29.

The imaging device includes an imaging unit 4000, an analog memory unit 4010, an image processing engine unit 4020, and an A/D converter 4030. The imaging unit 4000 includes a plurality of pixels arranged in a matrix, a driver circuit 4001, and a read circuit 4002. Each pixel includes a photodiode and a transistor. The analog memory unit 4010 includes a plurality of analog memories 4011. Here, the number of memory cells in each analog memory is more than or equal to the number of pixels in the imaging unit 4000. In other words, each analog memory can store one frame of imaging data 4005 acquired by the imaging unit 4000.

The operation of the imaging device is described below. As a first step, the first imaging data 4005 is acquired in each pixel. The imaging may be performed in a so-called rolling shutter system, in which pixels are sequentially subjected to exposure and the imaging data 4005 are sequentially read, or in a so-called global shutter system, in which all pixels are subjected to exposure at the same time and the imaging data 4005 are sequentially read.

In the rolling shutter system, while the imaging data 4005 is read from pixels in a row, exposure can be performed on pixels in another row; therefore, the frame frequency in imaging can be easily increased. In the global shutter system, even an image of a moving object can be obtained as an image with less distortion.

As a second step, the first imaging data 4005 acquired in each pixel is stored in a first analog memory through the read circuit 4002. Here, unlike in a general imaging device, it is effective to store the imaging data 4005 as analog data without conversion in the first analog memory. That is, an analog-digital conversion process is not necessary; therefore, the frame frequency in imaging can be easily increased.

Then, the first step and the second step are repeated n times. Note that for the n-th time, the n-th imaging data 4005 acquired in each pixel is stored in an n-th analog memory through the read circuit 4002.

As a third step, in the image processing engine unit 4020, desired image processing is performed on the first to n-th imaging data 4005 stored in the plurality of analog memories, so that image-processed imaging data 4025 is acquired.

As a fourth step, the image-processed imaging data 4025 is subjected to analog-digital conversion in the A/D converter 4030, so that image data 4035 is acquired.

As an example of the image processing, the image-processed imaging data 4025 without blur of focus is acquired from plural pieces of imaging data 4005. The image-processed imaging data 4025 can be acquired in the following manner: the sharpness of each piece of the imaging data 4005 is calculated, and the imaging data 4005 with the highest sharpness is acquired as the image-processed imaging data 4025. It is also possible to produce the image-processed imaging data 4025 by extracting regions with high sharpness from the imaging data 4005 and combining the regions together.

As another example of the image processing, image-processed data with optimum brightness is acquired from plural pieces of imaging data 4005. The image-processed imaging data 4025 can be acquired in the following manner: the highest brightness of each piece of the imaging data 4005 is calculated, and the image-processed imaging data 4025 is acquired from the imaging data 4005 excluding the piece(s) of imaging data 4005 which is so bright as to look whitish, i.e., the imaging data 4005 whose highest brightness is saturated.

It is also possible to acquire the image-processed imaging data 4025 from the imaging data 4005 by calculating the lowest brightness of each piece of the imaging data 4005 and eliminating the imaging data 4005 which includes a blacked-out portion, i.e., the imaging data 4005 whose lowest brightness is saturated.

Note that in the case where the first step and the second step are performed in accordance with the lighting of an imaging flashlight, the imaging data 4005 can be acquired at the timing when the optimum amount of light is delivered.

This embodiment can be implemented in an appropriate combination with any of the structures described in the other embodiments.

(Embodiment 6)

In this embodiment, examples of an electronic device including an imaging device of one embodiment of the present invention are described.

Examples of an electronic device including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 45A:
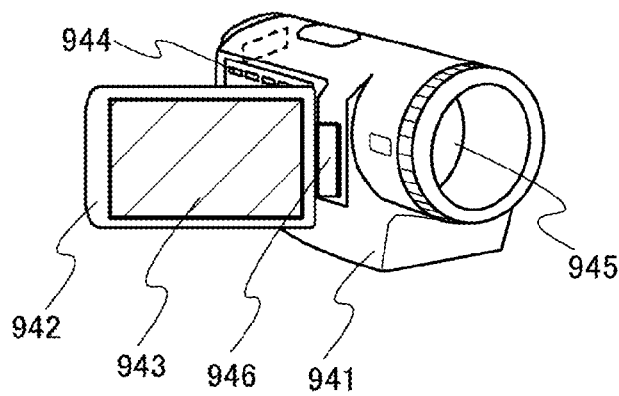
FIGS. 45A to 45F each illustrate an electronic device of one embodiment of the present invention.

FIG. 45A illustrates a video camera which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images on the display portion 943 may be switched in accordance with the angle at the joint 946 between the first housing 941 and the second housing 942. The imaging device of one embodiment of the present invention can be provided in a focus position of the lens 945.

Figure 45B:
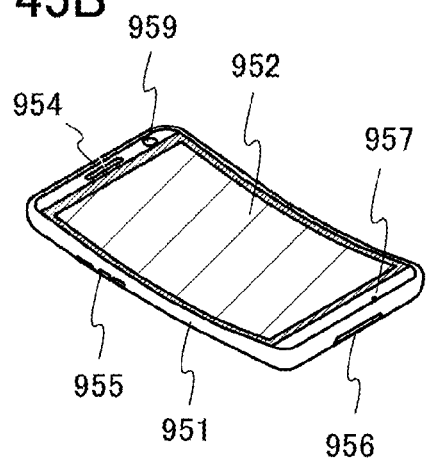

FIG. 45B illustrates a mobile phone which includes a display portion 952, a microphone 957, a speaker 954, a camera 959, an input-output terminal 956, an operation button 955, and the like in a housing 951. The imaging device of one embodiment of the present invention can be used for the camera 959.

Figure 45C:
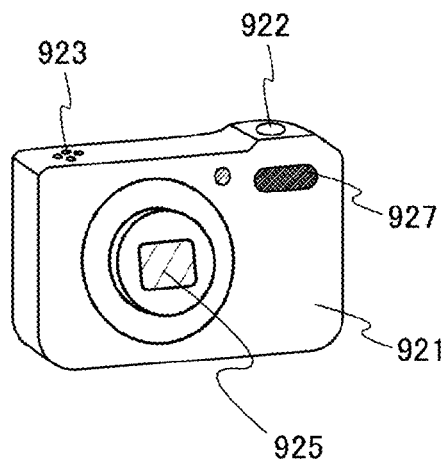

FIG. 45C illustrates a digital camera which includes a housing 921, a shutter button 922, a microphone 923, a light-emitting portion 927, a lens 925, and the like. The imaging device of one embodiment of the present invention can be provided in a focus position of the lens 925.

Figure 45D:
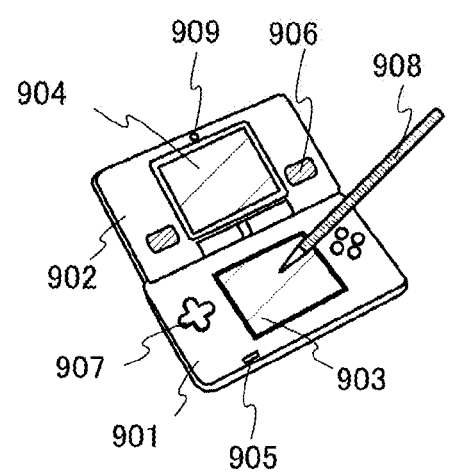

FIG. 45D illustrates a portable game console which includes a housing 901, a housing 902, a display portion 903, a display portion 904, a microphone 905, a speaker 906, an operation key 907, a stylus 908, a camera 909, and the like. Although the portable game console in FIG. 45A has the two display portions 903 and 904, the number of display portions included in the portable game console is not limited to this. The imaging device of one embodiment of the present invention can be used for the camera 909.

Figure 45E:
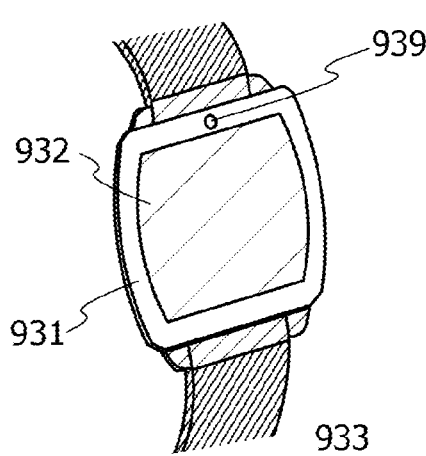

FIG. 45E illustrates a wrist-watch-type information terminal which includes a housing 931, a display portion 932, a wristband 933, a camera 939, and the like. The display portion 932 may be a touch panel. The imaging device of one embodiment of the present invention can be used for the camera 939.

Figure 45F:
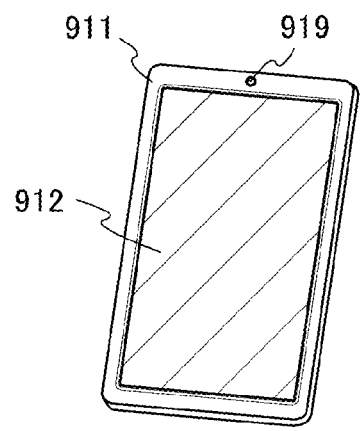

FIG. 45F illustrates a portable data terminal which includes a first housing 911, a display portion 912, a camera 919, and the like. A touch panel function of the display portion 912 enables input and output of information. The imaging device of one embodiment of the present invention can be used for the camera 919.

Needless to say, the examples are not limited to the above-described electronic devices as long as the imaging device of one embodiment of the present invention is included.

This embodiment can be implemented in an appropriate combination with any of the structures described in the other embodiments.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text disclosed in the specification.

Note that by combining a diagram (or may be part of the diagram) described in one embodiment with another part of the diagram, a different diagram (or may be part of the different diagram) described in the embodiment, and/or a diagram (or may be part of the diagram) described in one or a plurality of different embodiments, much more diagrams can be formed.

Note that a content which is not specified in any drawing or text in the specification can be excluded from one embodiment of the invention. When the range of a value that is defined by the maximum and minimum values is described, the range may be appropriately narrowed or part of the range may be excluded, whereby one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description of a value, "a voltage is preferably 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the film is a conductive film is excluded from one embodiment of the invention. For example, it can be specified that the case where the film is a semiconductor film is excluded from one embodiment of the invention.

As another specific example, a description of a stacked-layer structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where there are several possible portions to which a terminal is connected, it is not necessary to specify all the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least a connection portion of a circuit is specified. Alternatively, it might be possible for those skilled in the art to specify the invention when at least a function of a circuit is specified. In other words, when a function of a circuit is specified, one embodiment of the invention can be clear. Further, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute one embodiment of the invention. Thus, in the case where a diagram or a text describing a certain portion is disclosed, a content taken out from part of the diagram or the text is also disclosed as one embodiment of the invention, and one embodiment of the invention can be constituted. The embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, whereby one embodiment of the invention can be constituted. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is given in a diagram or a text described in one embodiment in this specification and the like, it will be readily appreciated by those skilled in the art that a broader concept of the specific example can be derived. Therefore, in the case where at least one specific example is given in the diagram or the text described in one embodiment, a broader concept of the specific example is disclosed as one embodiment of the invention and can constitute one embodiment of the invention. The embodiment of the invention is clear.

Note that in this specification and the like, what is illustrated in at least a diagram (which may be part of the diagram) is disclosed as one embodiment of the invention, and one embodiment of the invention can be constituted. Therefore, when a certain content is illustrated in a diagram, the content is disclosed as one embodiment of the invention even without text description and can constitute one embodiment of the invention. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-050384 filed with Japan Patent Office on Mar. 13, 2014, the entire contents of which are hereby incorporated by reference.

What is claimed is:

1. An imaging device comprising:
   a light-receiving portion;
   a first transistor; and
   a first circuit;
   wherein the light-receiving portion is electrically connected to the first transistor,
   wherein the first transistor is electrically connected to the first circuit,
   wherein the light-receiving portion comprises a first region and a second region,
   wherein the first region and the second region each have a comb-like shape in a plan view, and
   wherein the first region and the second region are arranged so as to engage with each other.

2. The imaging device according to claim 1, wherein the light-receiving portion and the first transistor overlap with each other.

3. The imaging device according to claim 1, wherein the first region is an n-type semiconductor.

4. The imaging device according to claim 1,
   wherein the first circuit comprises a second transistor and a third transistor, and
   wherein a channel formation region of the second transistor has a different bandgap from a channel formation region of the third transistor.

5. The imaging device according to claim 4, wherein one of the channel formation regions of the second transistor and the third transistor has the same bandgap as a channel formation region of the first transistor.

6. The imaging device according to claim 1, wherein the first transistor comprises an oxide semiconductor in a semiconductor layer in which a channel is formed.

7. An imaging device comprising:
   a light-receiving portion;
   a first transistor; and
   a first circuit;
   wherein the light-receiving portion is electrically connected to the first transistor,
   wherein the first transistor is electrically connected to the first circuit,
   wherein the light-receiving portion comprises a first region, a second region and a third region between the first region and the second region,
   wherein the first region and the second region each have a comb-like shape in a plan view, and
   wherein the first region and the second region are arranged so as to engage with each other with the third region therebetween.

8. The imaging device according to claim 7, wherein the light-receiving portion and the first transistor overlap with each other.

9. The imaging device according to claim 7, wherein the first region is an n-type semiconductor.

10. The imaging device according to claim 7,
    wherein the first circuit comprises a second transistor and a third transistor, and
    wherein a channel formation region of the second transistor has a different bandgap from a channel formation region of the third transistor.

11. The imaging device according to claim 10, wherein one of the channel formation regions of the second transistor and the third transistor has the same bandgap as a channel formation region of the first transistor.

12. The imaging device according to claim 7, wherein the first transistor comprises an oxide semiconductor in a semiconductor layer in which a channel is formed.

13. An imaging device comprising:
    a light-receiving portion;
    a first transistor; and
    a first circuit;
    wherein the light-receiving portion is electrically connected to the first transistor,
    wherein the first transistor is electrically connected to the first circuit,
    wherein the light-receiving portion comprises a first doped region and a second doped region,
    wherein the first doped region and the second doped region each have a comb-like shape in a plan view, and
    wherein the first doped region and the second doped region are arranged so as to engage with each other.

14. The imaging device according to claim 13, wherein the light-receiving portion and the first transistor overlap with each other.

15. The imaging device according to claim 13, wherein the first doped region is an n-type semiconductor.

16. The imaging device according to claim 13,
    wherein the first circuit comprises a second transistor and a third transistor, and
    wherein a channel formation region of the second transistor has a different bandgap from a channel formation region of the third transistor.

17. The imaging device according to claim 16, wherein one of the channel formation regions of the second transistor and the third transistor has the same bandgap as a channel formation region of the first transistor.

18. The imaging device according to claim 13, wherein the first transistor comprises an oxide semiconductor in a semiconductor layer in which a channel is formed.

* * * * *